United States Patent

Miyao et al.

[11] Patent Number: 5,901,281
[45] Date of Patent: May 4, 1999

[54] PROCESSING UNIT FOR A COMPUTER AND A COMPUTER SYSTEM INCORPORATING SUCH A PROCESSING UNIT

[75] Inventors: Takeshi Miyao, Hitachioota; Manabu Araoka, Hitachi; Tomoaki Nakamura, Katsuta; Masayuki Tanji, Hitachi; Shigenori Kaneko, Nakaminato; Koji Masui, Hatachi; Saburou Iijima, Mito; Nobuyasu Kanekawa, Hitachi; Shinichiro Kanekawa, Hitachi; Yoshiki Kobayashi, Hitachi; Hiroaki Fukumaru, Hitachi; Katsunori Tagiri, Hitachi, all of Japan

[73] Assignees: Hitachi, Ltd., Tokyo; Hitachi Process Computer Engineering, Inc., Ibaraki, both of Japan

[21] Appl. No.: 08/434,288

[22] Filed: May 3, 1995

Related U.S. Application Data

[63] Continuation of application No. 08/252,189, Jun. 1, 1994, abandoned, which is a continuation of application No. 07/826,909, Jan. 24, 1992, abandoned.

[30] Foreign Application Priority Data

| Jan. 25, 1991 | [JP] | Japan | 3-007519 |
| Jan. 25, 1991 | [JP] | Japan | 3-007520 |
| Jan. 25, 1991 | [JP] | Japan | 3-007521 |
| Jan. 25, 1991 | [JP] | Japan | 3-007523 |

[51] Int. Cl.[6] ............................................. G06F 11/34
[52] U.S. Cl. ............................... 395/182.09; 395/185.01
[58] Field of Search ......................... 395/182.01, 182.11, 395/182.03, 182.04, 182.05, 182.02, 182.08, 182.09, 182.1; 371/8.1, 61, 62; 364/229.4, 268.9, 269.1

[56] References Cited

U.S. PATENT DOCUMENTS

| 4,378,588 | 3/1983 | Katzman et al. | 364/200 |
| 4,486,826 | 12/1984 | Wolff et al. | 364/200 |
| 4,590,554 | 5/1986 | Glazer et al. | 364/200 |
| 4,757,442 | 7/1988 | Sakata | 364/200 |
| 4,914,572 | 4/1990 | Bitzinger et al. | 364/200 |
| 4,979,191 | 12/1990 | Bond et al. | 375/108 |
| 4,984,241 | 1/1991 | Truong | 371/36 |
| 5,157,663 | 10/1992 | Major et al. | 364/200 |
| 5,193,175 | 3/1993 | Cutts, Jr. et al. | 369/900 |
| 5,251,299 | 10/1993 | Masuda et al. | 395/182.08 |
| 5,276,806 | 1/1994 | Sandberg et al. | 395/200 |
| 5,276,823 | 1/1994 | Cutts, Jr. et al. | 371/36 |
| 5,295,258 | 3/1994 | Jewett et al. | 364/200 |
| 5,335,352 | 8/1994 | Yanai et al. | 364/200 |
| 5,339,404 | 8/1994 | Vandling, III | 371/36 |
| 5,345,438 | 9/1994 | Ozaki | 370/16 |
| 5,347,649 | 9/1994 | Alderson | 395/500 |
| 5,355,508 | 10/1994 | Kan | 364/200 |
| 5,440,698 | 8/1995 | Sindhu et al. | 395/200.08 |
| 5,572,663 | 11/1996 | Hosaka | 395/182.1 |

Primary Examiner—Albert DeCady
Attorney, Agent, or Firm—Antonelli, Terry, Stout & Kraus, LLP

[57] ABSTRACT

A computer system has a plurality of processing units connected via one or more system buses. Each processing unit has three or more processors on a common support board (PL) and controlled by a common clock unit. The three processors perform the same operation and a fault in a processor is detected by comparison of the operations of the three processors. If one processor fails, the operation can continue in the other two processors of the processing unit, at least temporarily, before replacement of the entire processing unit. Furthermore, the processing unit may have a plurality of clocks (A,B) within the clock unit, with a switching arrangement so that the processors normally receive clock pulses from a main clock (A), but receive pulses from an auxiliary clock (B) if the main clock (A) fails. Switching between the main and auxiliary clock (A,B) involves comparison of the pulse duration from the clocks (A,B). Additionally, a plurality of cache memories may be connected in common to the processors, so that failure of one cache memory permits the processing unit to continue to operate using the other cache memory. Coherence of the contents of the cache memories may be achieved by direct comparison, and a comparison method can also be used to invalidate data in an internal cache memory of a processor which differs from that in the external cache memory. Coherence of protocols may also ensure that data in caches of the different processor units are always correct.

44 Claims, 51 Drawing Sheets

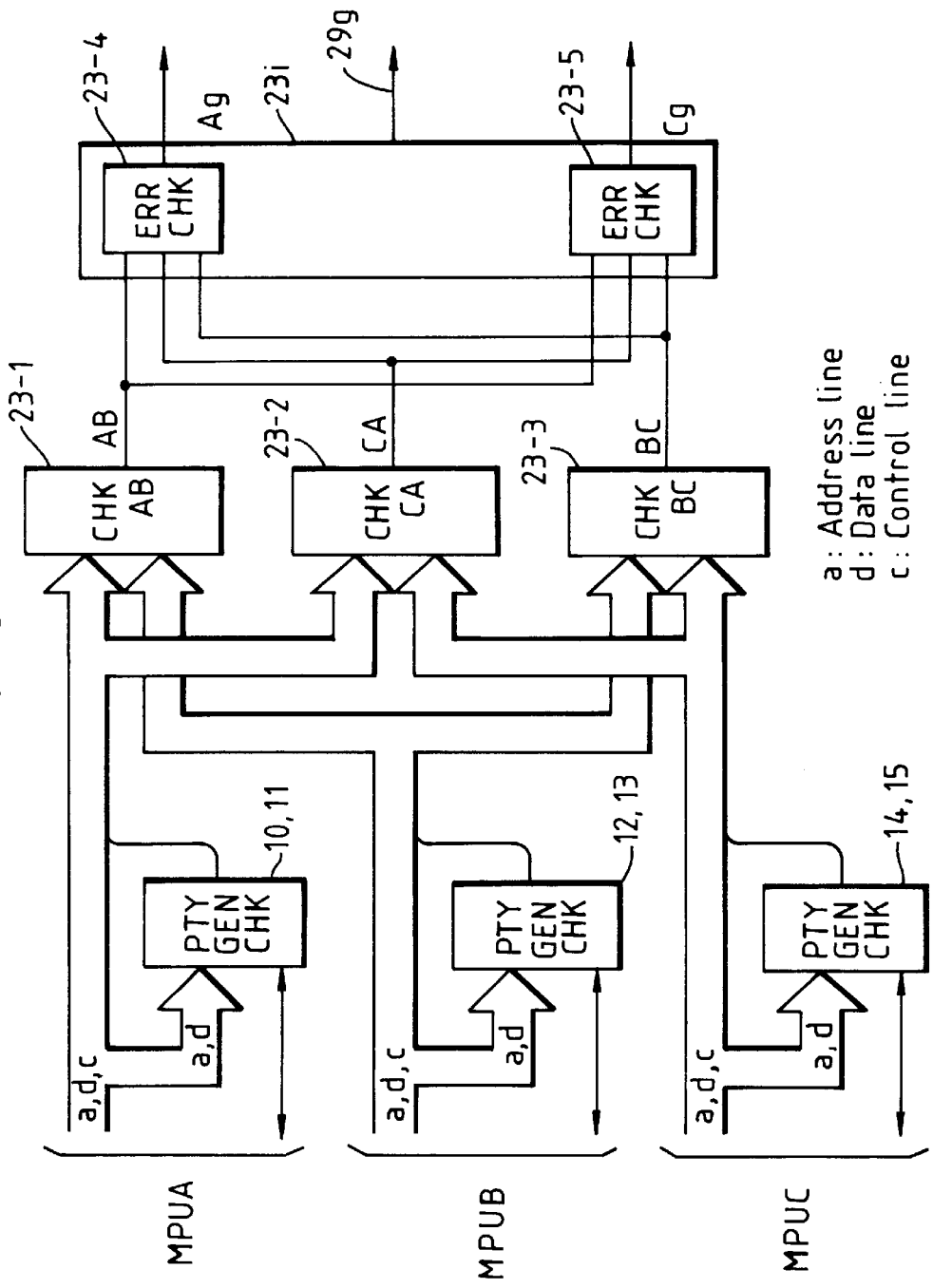

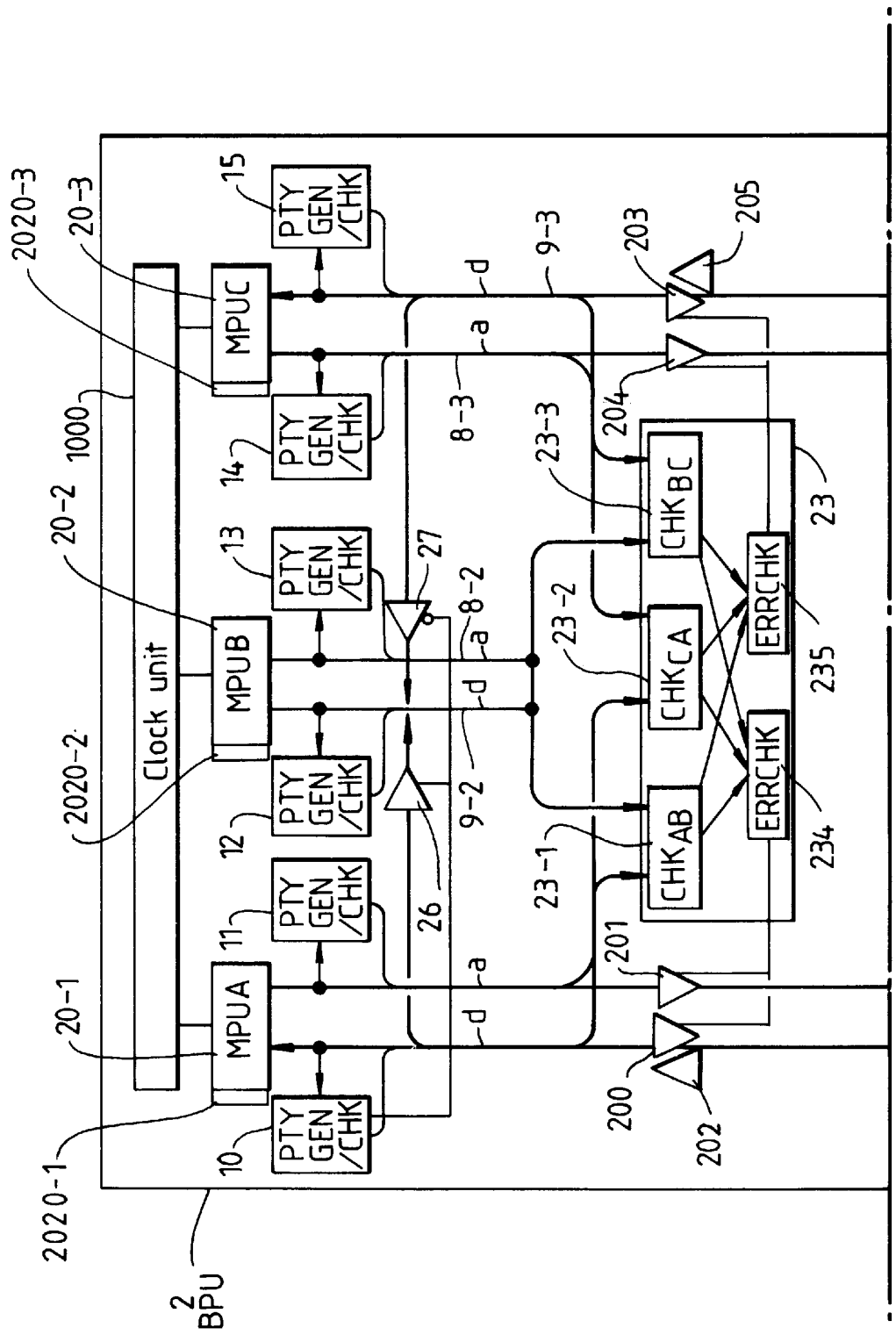

| CST | | Meaning |
|---|---|---|
| 00 | No data | Not hit as a result of snooping |
| 01 | Shared data | Hit to the line before updating as a result of snooping |
| 10 | Modified data | Hit to the line before updating as a result of snooping |
| 11 | Illegal (Error) | (Error) |

Cache memory line status transition

Note:  nop: No access to the system bus
R/W: Read or Write access
Line read: Read in units of 32 bytes
Line write: Write in units of 32 bytes

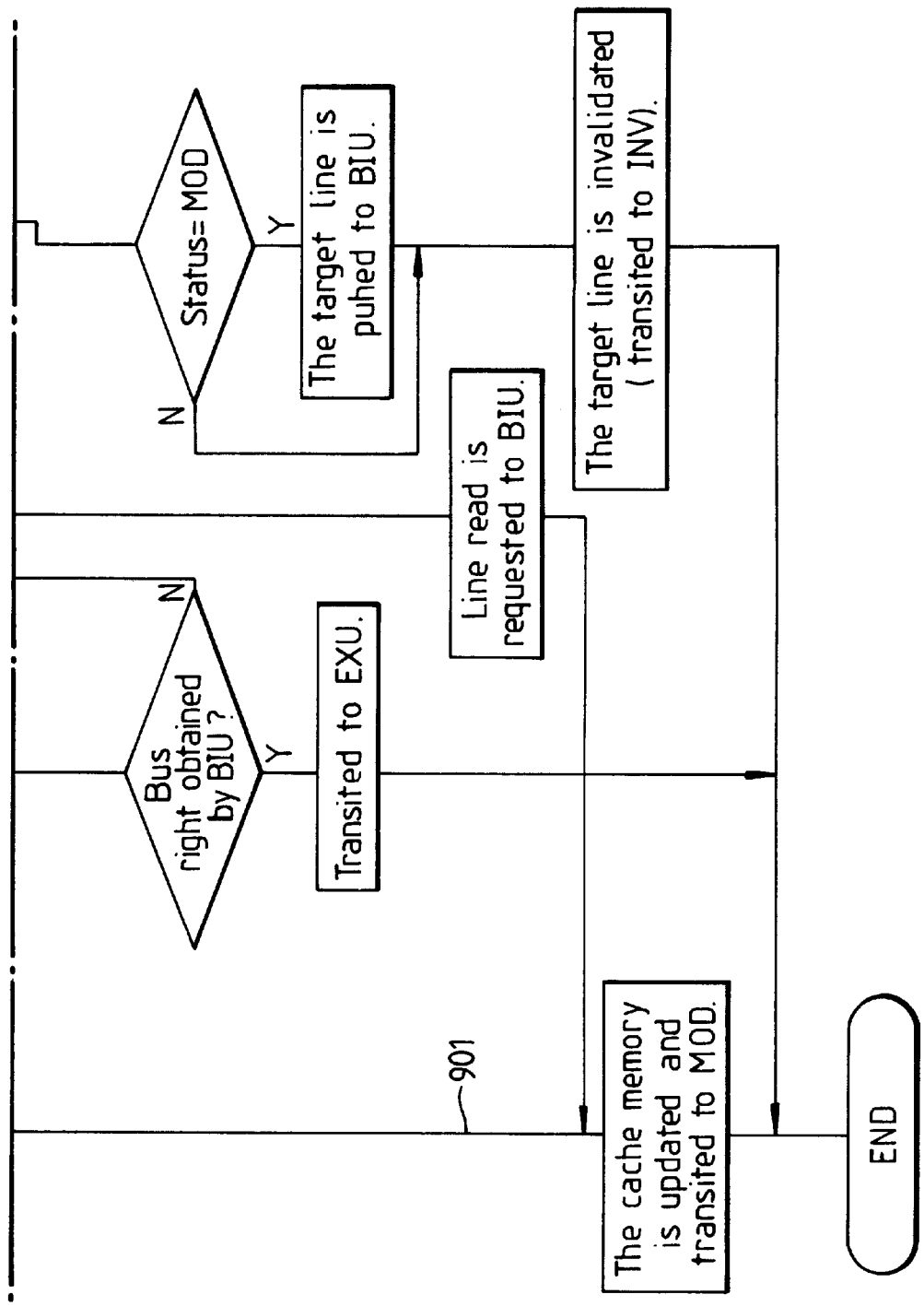

PROCESSING UNIT FOR A COMPUTER AND A COMPUTER SYSTEM INCORPORATING SUCH A PROCESSING UNIT

This application is a continuation of application Ser. No. 08/252,189, filed Jun. 1, 1994, abandoned, which is a continuation of application Ser. No. 07/826,909, filed Jan. 24, 1992, abandoned.

BACKGROUND OF THE INVENTION

1. Field of the Invention

The present invention relates to a processing unit for a computer, to a computer system incorporating one or more such processing units, and also e.g. a system bus and a main memory. The present invention also relates to a method of operating a computer system.

2. Summary of the Prior Art

The increasing use of computers in many aspects of human society has increased the need for those computers to operate reliably, and in a fault-free manner. For example, where banking or trading systems are based on computers, a temporary failure in the computer may result in significant economic loss. Furthermore, computers are increasingly used in situations where human life or health would be put at risk by failure of a system involving a computer. Therefore, it is increasingly important, that computers operate in a fault-free manner, or at least they can continue to operate reliably despite the occurrence of a fault.

The most likely source of a fault in a computer system is in the or a processor thereof. Therefore, consideration has been given to providing processor redundancy. If two processors of the same computer are arranged to carry out the same program (operation), then it is possible to detect a fault if, for any reason, those processors are not, in fact, carrying out the same program. Thus, by monitoring a pair of processors, it is possible to detect a fault in that pair.

If the pair are then mounted on a common board, a failure in the pair could be used to trigger a signal to replace the corresponding board. However, if such an arrangement is used, either the computer must shut-down when one board fails, or there must be some arrangement for continuing operation.

It should be noted that, throughout the present specification the term "board" or "support board" indicates a single indivisible support for one or more processors, and other associated circuitry. Such a board may be a printed circuit board, or may be a ceramic board. Furthermore, it is possible to envisage the computer in which the processor or processors and associated circuitry are integrated in a single semiconductor element (chip). Of course, in a computer, a plurality of such boards may be interconnected by a suitable board mounting system, but the term "board" in the present specification is not intended to denote the composite result of such a mounting system.

In U.S. Pat. No. 4,654,857, pairs of processors were mounted on respective boards, and connected to a common system bus or system buses. The pair of processors of each board were arranged to carry out the same program (operation), and the board had suitable means for detecting if the program, or the result of the program, was different between the two processors of the pair, this corresponding to a detection of a fault. Furthermore, U.S. Pat. No. 4,654,857 proposed that the same operation was carried out simultaneously in the processors of two boards. Therefore, if a fault occurred in the processors of one board, that board could be withdrawn from operation without the operation having to be stopped, since the operation could continue in the other board. Therefore, the faulty board could be replaced, with the operation then being duplicated in the new board and in the remaining board of the old pair. This arrangement was known as a "Pair and Spare" system.

An alternative was disclosed in JP-A-59-160899, in which, again, pairs of processors were mounted on respective boards. The same operation was then carried out by the two processors on any given board. Furthermore, the system was operated so that any board carrying out a particular operation (program) always and repeatedly transferred information about that operation to the main storage memory of the computer via the or each system bus. Then, if it was detected that the processors were not carrying out the same operation, which then corresponded to a fault, the information in the main storage memory was immediately transferred to another board which was not then in use. That new board could then continue the operation and the faulty board could then be replaced. Thus, JP-A-59-160899 proposed a software solution.

A hardware solution was proposed in JP-A-1-258057, in which a single processor was mounted on each respective board, and the outputs of three boards passed via a voting unit to the system bus or system busses. The processor of each board for a group of three boards was arranged to carry out the same operation, so that voting unit would normally receive three identical outputs from the three boards. If the output of any one board differed from the other two, that one board could be then declared faulty and the operation continued on the basis of two boards. The faulty board could then be replaced.

The above description of prior art has considered proposals for preventing failure of the computer due to a fault in a processor of the computer. Another possible source of fault is in the clock of the computer. Where processors are mounted on a common board, that board may have its own clock which generates clock pulses to the processors for synchronizing their operation. In such an arrangement, it is apparent that a failure in the clock would result in total failure of the board. The situation is made worse if the computer has a common clock, since then failure of that clock would result in failure of the whole computer Therefore, the article "Aircraft Highly Reliable Fault Tolerant Multiprocessor" by A. L. Hopkins Jr. et al in IEEE Vol. 66, no. 10, pages 1221 to 1239 (October 1990) proposed a computer in which there was more than one clock, and the phases of the clock pulses were matched using a phase locked loop arrangement Thus, failure of one clock did not result in failure of the whole computer.

A third possible source of fault is in a cache memory of the computer.

The use of the cache memories, particularly in multiprocessor arrangements, has the advantage of speeding up the effective memory access time. Cache memories using a high copy back mode have been used recently. The copy back mode, unlike the conventional write through method which updates the storage memory in the write mode, writes data only into the cache memories in the write mode so as to minimize the load on the system bus or buses. However, cache memories using the copy back mode only store the most recent data, causing the problem of maintaining data reliability when a cache memory is faulty. A possible method for solving this problem is to add an error correction code to each cache memory. The use of an error correction code requires much time, both for checking and generation, causing the cache memory access time to increase.

A further problem is that, if a plurality of cache memories hold the same data, and a processor requires the data, it is necessary to inform the other processors of the update information. The procedure for this is called a cache memory coherence protocol. Some procedures are proposed as described in the article entitled "Cache Coherence Protocols: Evaluation Using a Multiprocessor Simulation Model" by JAMES ARCHIBALD and JEAN-LOUP BEAR in ACM Transactions Computer Systems, Vol 4, No. 4, November 1986, pp 273 to 298. When these protocols update data, they output (broadcast) the information to the bus, and the other cache memories fetch ("snoop") this output and update or erase (invalidate) their own data. The Illinois University Method (USA) is a protocol which is proposed in "A Low Overhead Coherence Solution for Multiprocessors with Private Cache Memories" by RUDOLPH, L and PATEL, J, in the Proceedings of the 11th International Symposium on Computer Architecture, 1984, pp 340–347. This protocol has a great effect in minimizing the load on the system bus or buses. These protocols use the relationship between a plurality of processors and memories, though access by the other bus users (for example, input/output units) is not taken into account.

Furthermore, recent microprocessors generally contain internal cache memories because of improved integration (for example, MC68040 microprocessors manufactured by Motorola in USA). Although the capacity of those internal cache memories of the processor has increased yearly, it is currently only 4 to 16K bytes. To ensure a high access (hit) ratio, therefore, a method known as the set associative method has been proposed The set associative method uses a plurality of cahce memory sets and is adapted to the memory access pattern by the processor, so that the cache memories can be easily hit. External cache memories of a processor, however, generally use a direct map method which uses one cache memory set depending on the mounting problem or the set associated method which uses at most two sets.

SUMMARY OF THE PRESENT INVENTION

The present invention considers the issue of improvement of computer fault tolerance, and has several aspects.

The first aspect of the present invention considers the question of redundancy within a single processing unit mounted on a common support board. As was mentioned earlier, the term support board or board is not limited to a printed circuit board, but may include, for example a ceramic board or even a semiconductor integrated element. The support board, however, represents an indivisible component which is replaceable as a module, and the computer may then comprise a plurality of such components interconnected by one or more system buses, with the boards being suitably mounted.

Furthermore, in the subsequent discussion, the term "processing unit" will be used to denote computer components supported on a single support board. In the discussion of the aspects of the present invention that follows, only those components which relate to the particular aspect under discussion will be mentioned. However, the processing unit may contain other components, in a known manner, e.g. to permit access from the processing unit to the system bus or buses of a computer.

U.S. Pat. No. 4,654,857 and JP-A-59-160899 referred to above proposed that two processors were provided on a single board, i.e. that there was processor redundancy. In the first aspect of the present invention, it is proposed that there also be cache memory and/or clock redundancy on such a board. Thus, such a board may then have a plurality of cache memories connected to the processor so that the board can continue to operate despite a failure in either or both of a processor and a cache memory. It is then possible for the cache memories to be connected in common to all the processors, or for one cache memory to be connnected to one or more of the processors and another cache memory to be connected to one or more others of the processors. Alternatively, or in addition, the board may have a plurality of clocks connected in common to the processors, so that failure of a single clock does not prevent operation of the whole board. Thus, the first aspect of the present invention is concerned with overall redundancy within a single processing unit, i.e. a processing unit mounted on a common board.

The second aspect of the present invention considers processor redundancy. In U.S. Pat. No. 4,654,857, it is necessary to maintain in synchronism the pair of processing units (boards) for which the two processors thereof are each carrying out the same operation. Since the boards are physically separated, it is necessary that this synchronism be maintained at a "system" level. In JP-A-59-160899, on the other hand, no synchronisation is needed, but there is inevitably a delay when one board is faulty, since the operation being carried out by the faulty board cannot continue until the relevant data has been transferred to another board, as the system bus or buses. Such a delay is undesirable.

Furthermore, the proposals of both U.S. Pat. No. 4,654,857 and JP-A-59-160899 have the further disadvantage that it is impossible to determine which processor on a faulty board is at fault. Both proposals operate by comparing two processors, and the fault is identified when the two processors are not in exact agreement. Clearly, the failure to agree may result in either processor departing from the correct operation.

This latter problem is partially addressed in JP-A-1-258057, but there the use of three separate processing units (boards) makes the system large, since it is the boards themselves which occupy space, and the components on the boards are less significant in this respect.

Therefore, the second aspect of the present invention proposes that three or more processors are provided in a single processing unit, and mounted on a common board with at least one common clock. In such an arrangement, if the three or more processors carry out the same operation, a fault in one of the processors will enable that one processor to be identified, since there will still be two processors operating correctly. Therefore, such a processing unit can be operated on the basis that the majority of the processors are correct.

It is important that the processors on the board have a common clock. In arrangements needing clock synchronisation between boards, such as U.S. Pat. No. 4,654,857 clock rates are limited to about 10 MHz. Using the present invention, on the other hand, clock rates of more than 60 MHz may be achievable.

It is unlikely that two processors will fail simultaneously, and therefore it is normally necessary to use only three processors. However, if a very high level of safety is required, it may be desirable to provide five processors, since such a system would then be able to detect simultaneous failure in any two processors by comparison between the processors.

It can be seen that such an arrangement offers significant advantage over the known methods, in that the use of three processors on one board avoids the problem of the need for a large amount of space which is necessary in JP-1-258057, but also avoids the need for synchronisation of boards when a processor fails, as in U.S. Pat. No. 4,654,857.

When a processor fails, a development of the second aspect of the present invention proposes that the faulty processing unit (board) is replaced, and the execution of the operation currently being operated by the faulty board be transferred to another board. However, unlike both U.S. Pat. No. 4,654,857 and JP-A-59-160899, the transfer of processing does not need to occur immediately on failure of a single processor. Since there are three or more processors, the faulty processor can be identified on a majority basis, the execution of the operation by the faulty processor can be halted, with the operation continuing to be executed by the non-faulty processors of the processing unit. Thus, processing does not have to be halted, and there is no load on the main system as in JP-A-59-160899.

Of course, such an arrangement is then vulnerable to failure of a further processor. However, since it is unlikely that two processors will fail within a short time of each other, it permits the transfer of the operation to another processing unit to be deferred from the instant that one processor faults, as in existing arrangements to a more suitable time. It has important considerations for board redundancy, since it is then possible for a processor unit with one faulty processor to generate a signal (such as a display to the operator) which then permits the faulty board to be replaced. Hence, it is not necessary to provide many boards for redundancy. As a result, the overall size of the computer may be reduced.

A further advantage of this aspect of the present invention is that it is common to improve or upgrade processors from time to time, and this aspect of the present invention permits an upgraded processor to be used immediately, without significant consideration of the existing processors within the computer. In arrangements such as U.S. Pat. No. 4,654, 857, it is necessary to ensure that processor units are paired with identical processors therein, since any given program (operation) will be carried out in the processors of more than one processing unit (board).

A plurality of processing units according to the first and/or second aspect of the present invention may be provided within a single computer system, which system may also include one or more main storage memories, and one or more system buses interconnecting the processing units and the main storage memory, and also possibly other components such as input/output units.

The third aspect of the present invention relates to redundancy in the clocks of the computer. As has already been described, existing computers are vulnerable to clock failure. In the article by A. L. Hopkins Jr. et al referred to earlier, the phase locked loop of each oscillator requires, in addition to the oscillator itself, a phase discriminator, a frequency divider and a voltage control oscillator. The resulting circuit is complicated. Not only does this have the effect of increasing the number of parts, the physical size and the power consumption, but also increases the risk of failure of one or more components, thereby preventing the improvement in fault tolerance that was sought.

Therefore, the third aspect of the present invention proposes that a computer system have first and second clocks, and means for comparing the duration of the clock pulses of those clocks. Assuming that both clocks are operating correctly, the clock pulses from one clock are passed to the rest of the computer system for timing control thereof, but the duration is compared with the clock pulses of the other clock. Whilst the two have a relationship corresponding to correct operation (e.g. are of equal duration) the system operates normally. If, however, that relationship changes, this will correspond to stoppage of the clock and then the timing may be switched to the other clock.

Thus, the system operates with a main and an auxiliary clock. When the main clock stops, its output will correspond to the state of that clock in its final output pulse, and thus the duration of that final pulse is lengthened. This can be compared with a duration of a normal pulse from the auxiliary clock. Of course, when the main clock fails, it is vulnerable for a warning to be generated to indicated that the clock arrangement needs replacing. It may be thought that such an arrangement is desirable to failure of the auxiliary clock. However, if the auxiliary clock is also compared with the main clock, then a similar warning can be generated if the auxiliary clock fails, using exactly the same sort of system that has already been described, but with the comparison of the clock pulses reversed. It is unlikely that both clocks will fail simultaneously.

Such a clock arrangement may be applied to a main clock for the entire computer system, or may be incorporated as a clock within a single processing unit (board). In the latter case, if one or other of the clocks fail, the processing unit (board) can be replaced in a similar way to that described above for failure of the processors. It should also be noted that, since clock failure is less likely that processor failure, triple redundancy is possible but is less likely to be needed.

The fourth, fifth and sixth aspects of the present invention relate to the control of one or more cache memories. Firstly, it is possible to provide cache memory redundancy in a similar way to clock redundancy. Thus, a processing unit may have a plurality of cache memories, each which contain identical information when operating correctly. Therefore, it is readily possible to check that the cache memories are free of fault by direct comparison of their contents. If there is a fault in one of the cache memories, a processor or processors connected to the cache memories may be prevented from accessing the faulty cache memory.

It is possible to provide triple redundancy of cache memories, in a similar way to the triple redundancy of the processors within a processing unit described with reference to the second aspect. However, in a normal computer, the information stored in the cache memories will also be stored in the main storage memory of the computer system. Therefore, it is normally possible to tell which cache memory is faulty, by comparison of its contents with the relevant contents of the main storage memory.

The processor or processors connected to in common to the cache memories can continue operating after a fault in one cache memory by using only the information in the other cache memory. Of course, such a processing unit (board) is then vulnerable to failure of the second cache memory (unless more than two are provided), in which case it is desirable for a warning to be generated to indicate that the processing unit (board) should be replaced. The use of cache memories in common for more than one processor is a fourth aspect of the present invention.

Alternatively, if there are e.g. four or more processors, it is then possible to have an arrangement in which one cache memory is connected to a first pair of those four processors, and another cache memory is connected to a second pair of those four processors. Then, if there is a fault in either processor of a pair, or in the cache memory connected to that pair, the execution of the operation in that pair may then be terminated. This is a fifth aspect of the present invention.

The sixth aspect of the present invention relates to the checking of the validity of two cache memories, and is particularly concerned with maintaining the validity of data in an internal memory of a processor in relation to information in an external memory. However, it can be noted that this fifth aspect is not limited to internal and external memory control only but is applicable to any pair of cache memories operating on integer-set association with the integer of the set of one cache memory being less than that of the other.

As was mentioned earlier coherence between the internal and external cache memories must be maintained. If there are four internal cache memory sets and one external cache memory set, for example, there is a possibility that there is data in the internal cache memory but not in the external cache memory. This causes a problem for inter-processor cache memory coherence control. When no data is found in the external cache memory after snooping, it is assumed that no data exists in the corresponding processor (even if the internal cache memory saves it) and coherence cannot be maintained.

Thus, this aspect of the present invention, when applied to cache memory control between the internal memory of a processor and an external memory, proposes that the data in the internal memory be rendered invalid if it differs from the data in the external memory. As a result, only data in the external memory will be valid within the internal memory, and it is therefore possible to ensure that the internal memory contains only that data also in the external memory, by deletion of invalid data.

The cache memory control arrangements of the fourth and sixth aspects of the present invention are particularly, but not exclusively, concerned with cache memory control within a single processing unit (board). In a computer system it is also necessary to consider the data in caches on different boards, i.e. belonging to different processing units. As has already been mentioned, proposals have already been made for cache memory coherence protocols.

The seventh aspect of the present invention is concerned with the situation where a processor accesses data in a main storage memory of the computer system. It is proposed that any such access generates an invalidity signal to the cache memories of all of the other processors i.e. those processors which are not currently accessing the main storage memory, and the data accessed is rendered invalid in the cache memories of all the other processing units. Thus, the other processing units monitor (snoop) on access to the main storage memory by any other processing unit, and on detection of such access, render invalid the corresponding data in their own cache memories. Thus, an improvement in cache memory coherents can be achieved.

Although the above discussion of the aspects of the present invention has considered each aspect separately, the aspects may be used alone or in any combination thereof. Thus, in order to achieve a computer system with a high reliability, there may be processor redundancy using three or more processors in each processing unit, clock redundancy using a plurality of clocks with the switching of pulses therebetween for each processing unit, and a plurality of cache memories for each processing unit. Furthermore, although some of the aspects of the present invention described above have been concerned with individual processing units, they are applicable to processing systems having a plurality of such processing units.

Also, the aspects of the present invention above involve operations within the processing unit, or within the computer system, and therefore the present invention relates not only to the structural features of such aspects, but also to the methods of operation thereof.

BRIEF DESCRIPTION OF THE DRAWINGS

FIG. 3 shows an example of a MPU output check circuit;

DETAILED DESCRIPTION

As has already been mentioned, the present invention relates to a computer system, and to a processing unit for such a system which are designed such that the fault-tolerance of the processing unit and of the system as a whole are improved.

Because of the complexity of any computer system, it is easiest to consider separately various aspects of the present invention, although these aspects may be used independently, or in any specific in common systems.

A Processor and Processing Unit Redundancy

The first part of the description of embodiments of the present invention will concentrate on aspects of the present invention which relate to the use of multiple processors on a common support board, and also to the use of multiple support boards. As has already been mentioned, the term support board includes not only a printed circuit board but also may include, for example, a ceramic board, or even may include arrangements in which the various components are integral in a common semiconductor element (chip). The underlying idea is that the support board represents an indivisible physical interconnection replaceable as a module between these components, so that such a support board is distinguished from separable interconnection of components such as in a multi-board arrangement.

Figure 1:
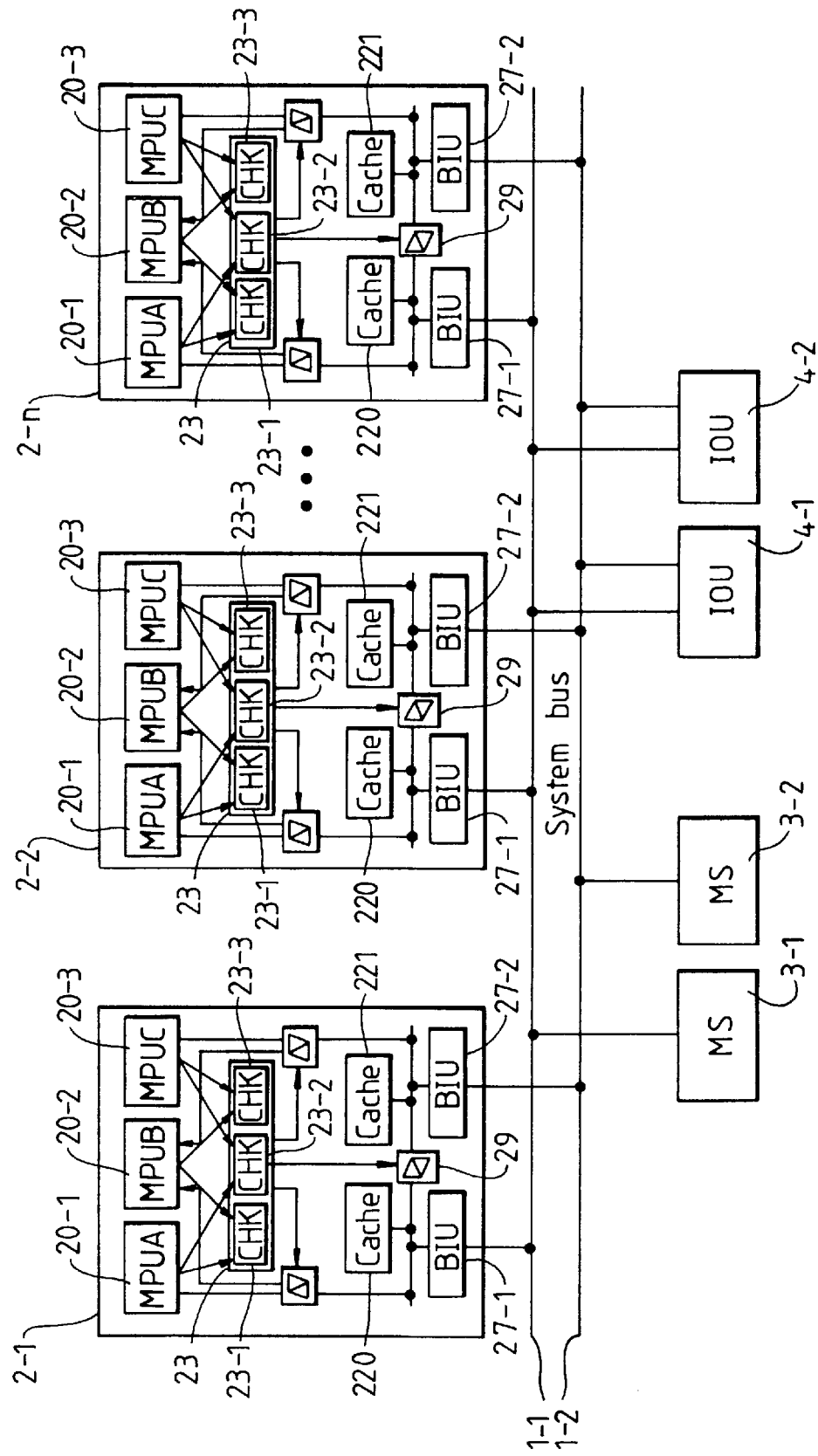
FIG. 1 is a schematic view of the entire system of an embodiment of the present invention.

However, even within this topic, it is necessary to consider a number of sub-topics. These sub-topics are:

I. General construction of the entire system
II. Construction of a processor (hereinafter referred to as Basic Processing Units or BPU)
III. Error detection method
IV. Construction change control when an error occurs
V. Signal processing when the internal bus is connected
VI. Recovery measure after an error occurs
VII. Alternative plan and modification example for each circuit I. General construction of the entire system FIG. 1 shows the general construction of a fault tolerant computer system of an embodiment of the present invention. The system has two groups of system buses 1-1 and 1-2. One or a plurality of basic processing units (BPU) 2-1, 2-2, - - - , and 2-n are connected to the system buses 1-1 and 1-2. A first main storage memory MS 3-1 is connected to the system bus 1-1 and a second main storage memory MS 3-2 is connected to the system bus 1-2. I/O units (IOU) 4-1 and 4-2 are connected to both system buses. The main storage memories MS and input/output I/O units are used in sets of two respectively, and FIG. 1 shows each set of main storage memories MS and I/O units. The number of sets may be increased depending on the desired system extension. The n basic processing units shown in FIG. 1 execute different processing independently, though they have the same construction. Only basic processing BPU2-1 will be referred to in the description of the construction and operation unless otherwise required.

The main components of basic processing unit BPU2 are a plurality of microprocessing units 20 (MPU) (3 units are shown in FIG. 1), a plurality of MPU output check circuits 23 (3 circuits are shown in FIG. 1), 3-state buffer circuits 29, a plurality of cache memories 220 and 221, and a plurality of bus interface circuits 27 (BIU).

The general operation of the circuit shown in FIG. 1 is as follows: The three microprocessing units 20 execute operations, and the outputs thereof are checked by the check circuits 23. The outputs of two microprocessing units which are judged as normal are output to two sets of system buses 1 or two sets of cache memories 220 and 221 respectively via the bus interface circuits 27. When an error is found in one of the microprocessing units, that microprocessing unit is excluded and the two remaining normal microprocessing units send their outputs to two sets of system buses 1 or two sets of cache memories 220 and 221 respectively via the bus interface circuits 27. When an error is found in one of the three microprocessing units 20, the three microprocessing units 20 are all replaced at a suitable time by three new microprocessing units MPU 20 for continued operation.

II. Construction of Basic Processing Unit BPU2

Figure 2A:
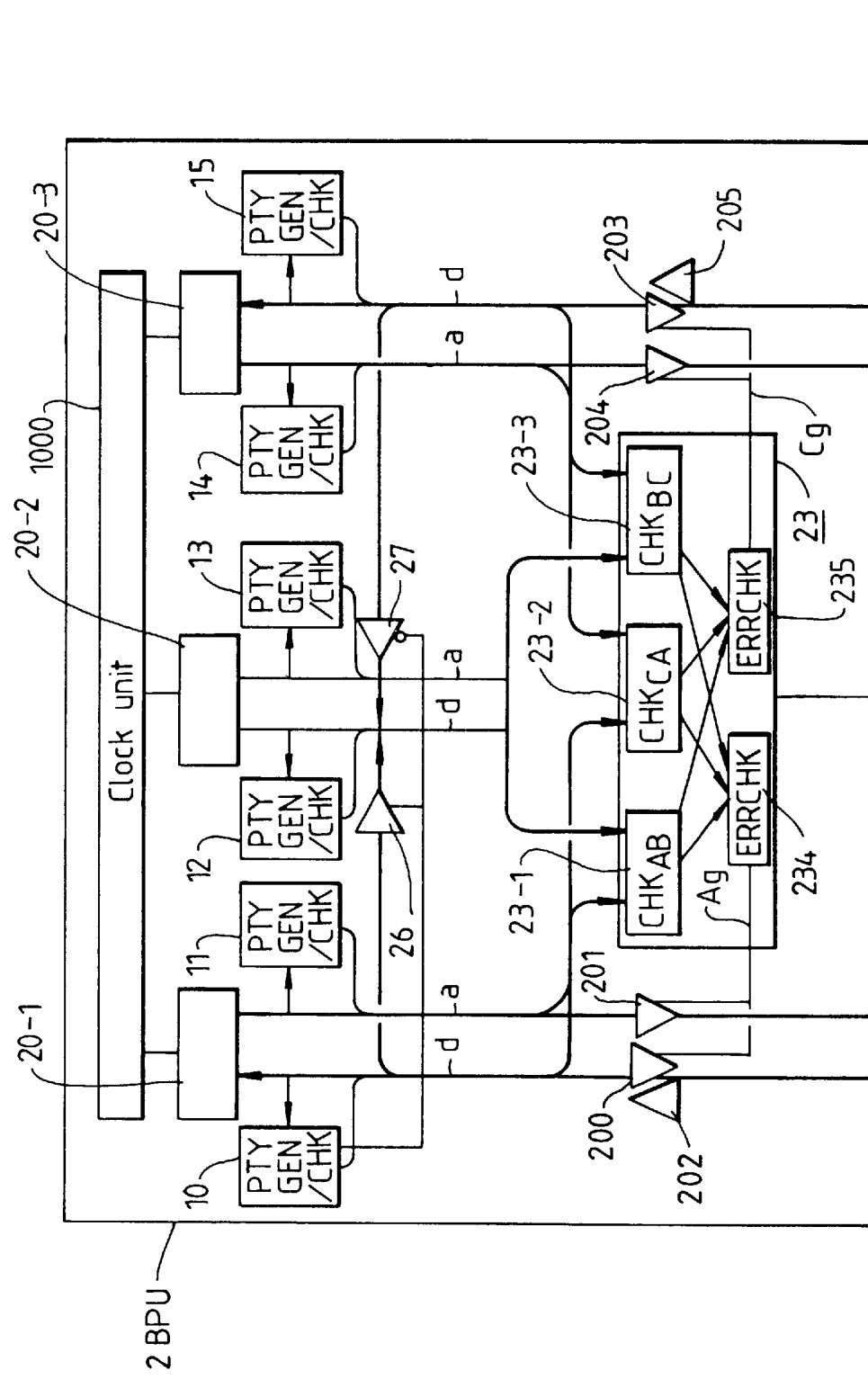
FIGS. 2A, B represent a schematic view of a BPU of the embodiment of FIG. 1.
Figure 2B:
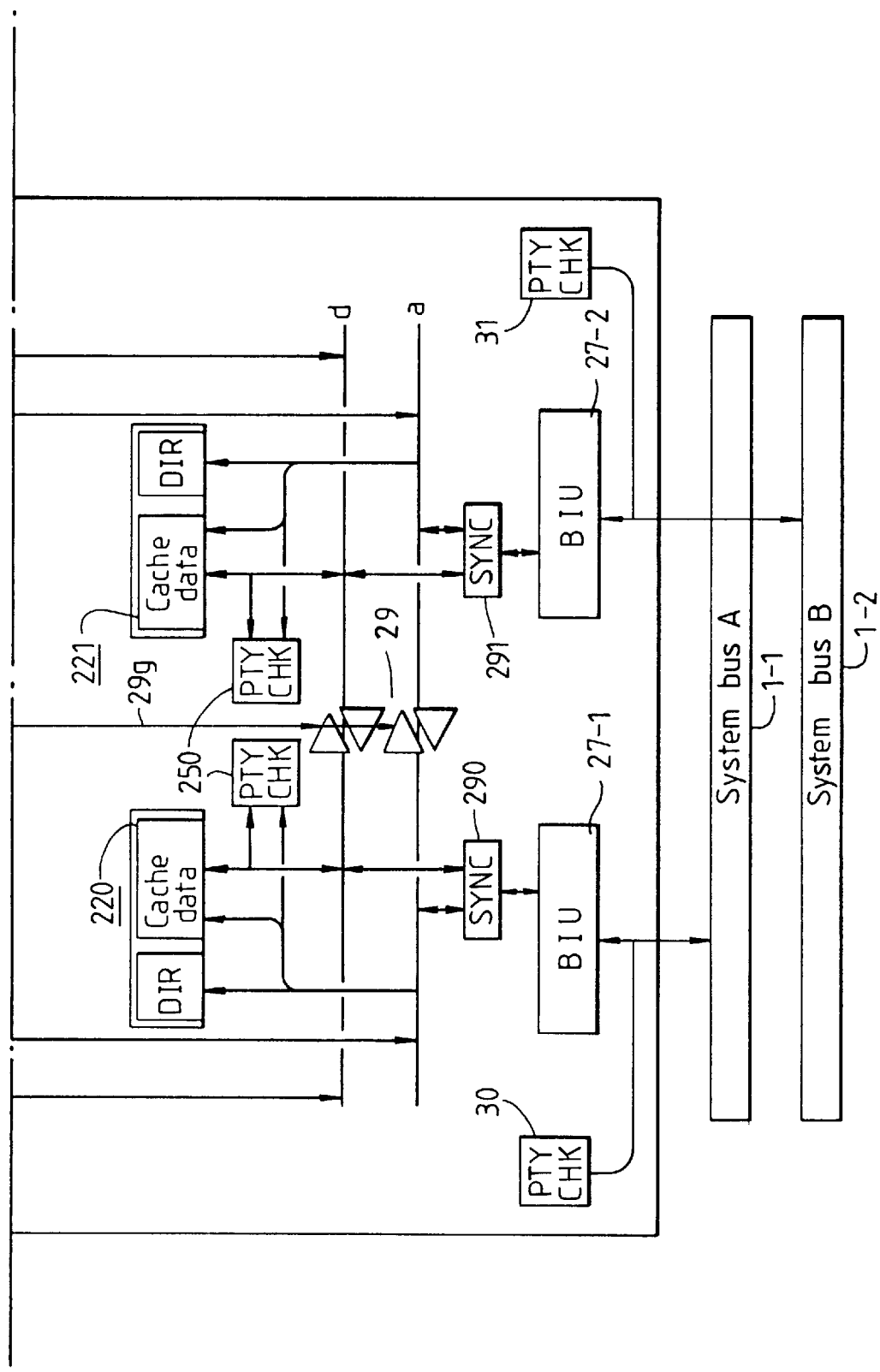
Figure 4A:
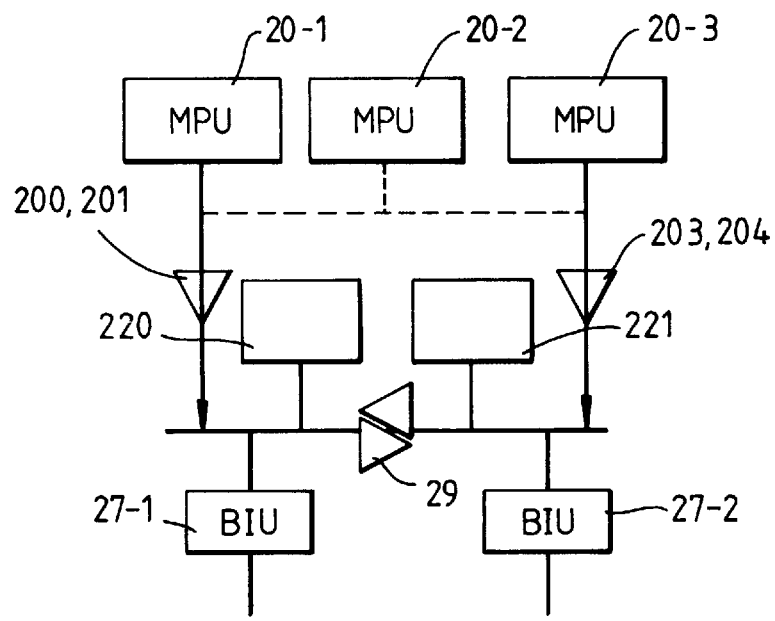
FIG. 4($a$) to 4($e$) are is a schematic views of a BPU when an error occurs during write access.
Figure 4B:
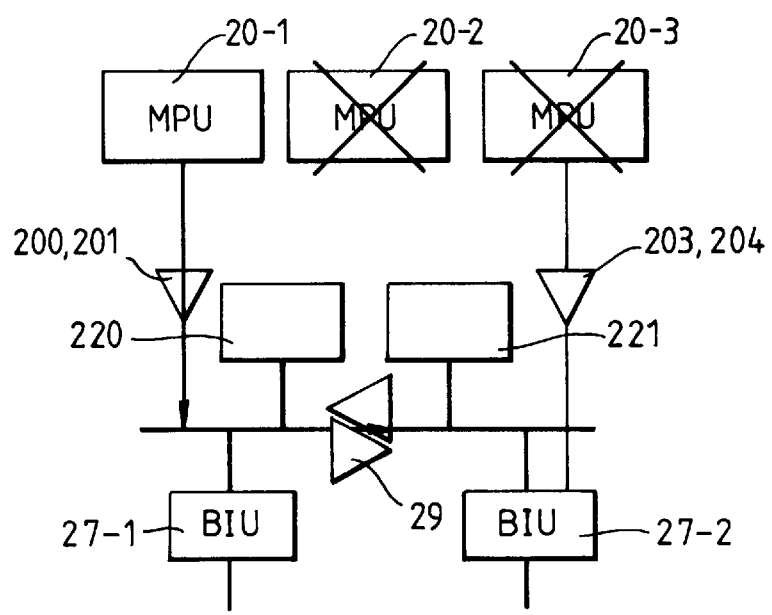
Figure 4C:
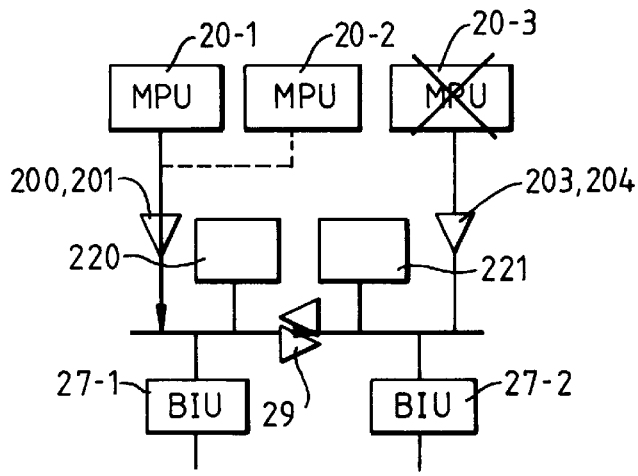
Figure 4D:
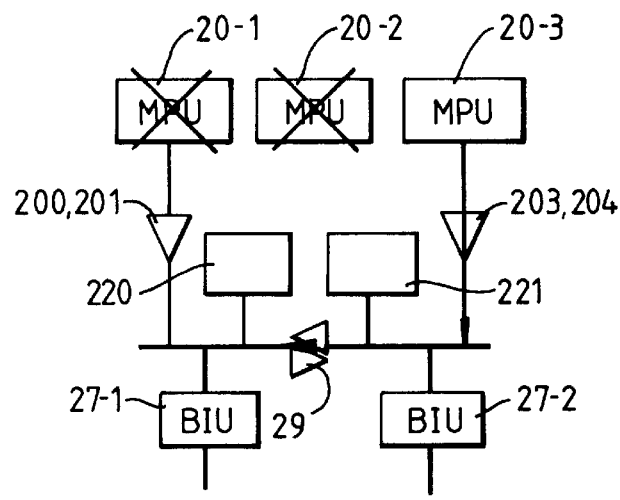
Figure 4E:
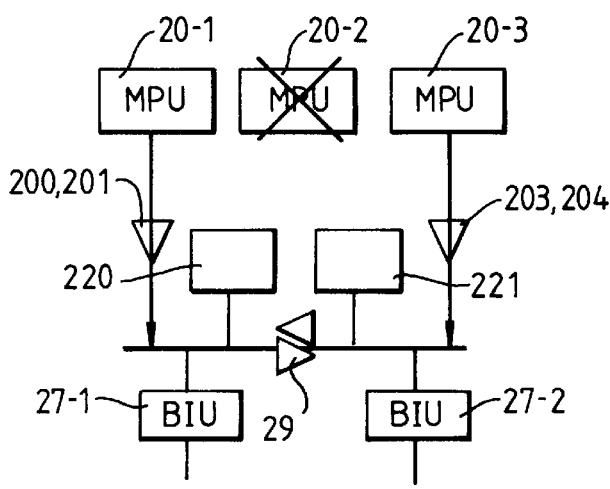

FIG. 2 shows the construction of the basic processing unit BPU2. It is recommended for each basic processing unit, that the components shown in FIG. 2 are mounted on one PC board, as will be described later.

In FIG. 2, the three MPUs 20-1, 20-2, and 20-3 operate synchronously under control of a clock unit 1000 (to be discussed later) and the results are output to an address line a and a data line d. The addresses of the MPUs 20-1, 20-2, and 20-3 on the address line a and the data on the data line d have appropriate parity signals from parity generation and check verification circuits 10 to 15 and are output to the MPU output check circuits 23. The MPU output check circuits 23 comprise a first check circuit CHKAB (23-1) for comparing the output (the a address and d data provided with parity signals) from the MPUA (20-1) with the output from the MPUB (20-2), a second check circuit CHKCA (23-2) for comparing the output from the MPUA (20-1) with the output from the MPUC (20-3), a third check circuit CHKBC (23-3) for comparing the output from the MPUB (20-2) with the output from the MPUC (20-3), and error check circuits 234 and 235 for specifying whether one of the MPUs is faulty, in dependence on the results of the comparison carried out by the three check circuits CHK. The MPU output check circuits 23 are so-called majority circuits, and the ON or OFF statuses of the 3-state buffer circuits 200, 201, 203, 204, and 29 are controlled according to the decision results thereof. The relationship between the decision result and the status of the 3-state buffer circuits will be described later. A microprocessing unit which is judged as faulty is not used subsequently and outputs of microprocessing units which are judged as normal are sent to the two cache memories 220 and 221 so as to provide a dual system. In the following description, the enable state of the 3-state buffer circuits is referred to as an open (ON) state and the disable state as a closed (OFF) state.

Addresses and data obtained via the 3-state buffer circuits 200, 201, 203, and 204 are sent to the two cache memories 220 an 221, and the parity provided by the parity generation and check verification circuits 10 to 15 is checked by a parity check circuit 250. Two MPU outputs are synchronized by synchronous circuits 290 and 291 and sent to the system buses via the bus interface units BIU. In this case, the parity provided by the parity generation and check verification circuits 10 to 15 is checked by parity check circuits 30 and 310. In this construction, write access from the microprocessing units is chiefly described. Such write access from the microprocessing units is checked by the MPU check circuits 23 and the parity check circuits 30 and 31.

For cache read access, signals are transmitted in the cache memories 220 and 221, the 3-state buffer circuits 202 and 205, and the MPU routes, and addresses and data from the cache memories are checked by the parity generation and check verification circuits 10 to 15. Also shown are 3-state buffer circuits, and the ON or OFF state thereof is controlled according to address and data check results by the parity generation and check verification circuits 10 to 15 during cache read access.

The construction shown in FIG. 2 shows that the BPU system of this embodiment of the present invention comprises at least 3 microprocessing units, a faulty MPU detection circuit comprising a majority circuit, a dual cache memory, and a dual output circuit.

III. Error detection method

The basic processing unit shown in FIG. 2 uses the MPU output check circuits 23 and many parity check circuits as error detectors. In this section, the error detection method will be described.

(i) Error detection by the MPU output circuit

The MPU output check section is shown in FIG. 3. Assuming that in FIG. 3, the output of the first check circuit CHKAB is AB, the output of the second check circuit CHKCA is CA, the output of the third check circuit CHKBC is BC, and the outputs of the error check circuit 231 are Ag, Cg, and 29g, the relationship between the outputs of the three check circuits and the ON or 0FF status of the 3-state buffer circuits will now be described. Also shown in FIG. 2 is the clock unit 1000 which provides clock pulses for controlling the MPUs 20-1, 20-2, 20-3, and will be described in more detail later, and a control line c.

The first to third check circuits CHK obtain 2 sets of inputs (address (a), data (d), and control (c) signals) respectively. The first check circuit CHKAB outputs the comparison result AB between the output of the MPUA and the output of the MPUB, the second check circuit CHKCA outputs the comparison result CA between the output of the MPUA and the output of the MPUC, and the third check circuit CHKBC outputs the comparison result BC between the output of the MPUB and the output of the MPUC. The comparison results are status signals indicating matching or unmatching.

The error check circuit 231 obtains outputs Ag, Bg, and Cg indicating that the MPUA, MPUB, and MPUC are normal from the outputs AB, BC, and CA of the three check circuits CHK according to equations (1), (2), and (3). In FIGS. 2 and 3, the error check circuit is duplexed.

$$Ag=AB.[CA+AB.BC.CA+AB.BC.[CA \tag{1}$$

$$Bg=AB.[BC+[AB.BC.CA+AB.[BCCA \tag{2}$$

$$Cg=BC.[CA+AB.[BCCA+AB.BC.[CA \tag{3}$$

where, AB:An event for which the output of the MPUA does not match the output of the MPUB (checked by 23-1)

BC: An event that the output of the MPUB does not match the output of the MPUC (checked by 23-3)

CA: An event that the output of the MPUA does not match he output of the MPUC (checked by 23-2)

.: Logical product (AND)

+: Logical sum (OR)

[: Negation (NOT)

The ON or OFF statuses of the 3-state buffer circuits 200, 201, 204, 205, and 29 are controlled according to the results of Equations (1), (2), and (3). Table 1 gives outputs (matching or unmatching) of the three check circuits CHKAB, CHKBC, and CHKCA, decision results Ag, Bg, and Cg for faulty microprocessing units, and the resultant ON or OFF status of the 3-state buffer circuits. In the column of decision results in Table 1, numeral 1 indicates that the corresponding microprocessing unit is normal and 0 indicates that the corresponding microprocessing unit is faulty or unknown.

Table 2 shows a part of examples which are supposed as causes of matching or unmatching outputs of the check circuits shown in Table 1. Detailed description will be omitted because the object of the present invention is to provide a way of changing the circuit construction of the basic processing units when an error occurs so as to continue the operation but not to specify the cause of errors.

TABLE 1

| Check results | | | Decision results (MPU) | | | 3-state buffer | | |
|---|---|---|---|---|---|---|---|---|
| CHKAB | CHKBC | CHKCA | Ag | Bg | Cg | 200, 201 | 29 | 203, 204 |
| 1Matching | Matching | Matching | 1 | 1 | 1 | ON | OFF | ON |
| 2Matching | Matching | Unmatching | 0 | 1 | 0 | — | — | — |
| 3Matching | Unmatching | Matching | 1 | 0 | 0 | ON | → | OFF |
| 4Matching | Unmatching | Unmatching | 1 | 1 | 0 | ON | → | OFF |

TABLE 1-continued

| Check results | | | Decision results (MPU) | | | 3-state buffer | | |
|---|---|---|---|---|---|---|---|---|
| CHKAB | CHKBC | CHKCA | Ag | Bg | Cg | 200, 201 | 29 | 203, 204 |
| 5Unmatching | Matching | Matching | 0 | 0 | 1 | OFF | ← | OFF |
| 6Unmatching | Matching | Unmatching | 0 | 1 | 1 | OFF | ← | ON |
| 7Unmatching | Unnatching | Matching | 1 | 0 | 1 | ON | OFF | ON |
| 8Unmatching | Unmatching | Unmatching | 0 | 0 | 0 | — | — | — |

OFF: High impedance state
ON: Enable state
→, ←: Transmission direction
—: Non-correspondence

TABLE 2

| Error location | | | | | | Check results | | |
|---|---|---|---|---|---|---|---|---|
| MPU | | | Check circuit | | | | | |
| A | B | C | 23-1 | 23-2 | 23-3 | CHKAB | CHKBC | CHKCA |
| Normal | Normal | Normal | Normal | Normal | Normal | Matching | Matching | Matching |
| Normal | Normal | Normal | Incorrect information | Normal | Normal | Unmatching | Matching | Matching |
| Normal | Normal | Normal | Normal | Incorrect | Normal | Matching | Unmatching | Matching |
| Normal | Normal | Normal | Normal | Normal | Incorrect information | Matching | Matching | Unmatching |
| Faulty | Normal | Normal | Normal | Normal | Normal | Unmatching | Matchinq | Unmatching |
| Faulty | Normal | Normal | Incorrect information | Normal | Normal | Unmatching | Matching | Unmatching |
| Faulty | Normal | Normal | Normal | Incorrect information | Normal | Unmatching | Unmatching | Unmatching |
| Faulty | Normal | Normal | Normal | Normal | Incorrect information | Unmatching | Matching | Unmatching |
| Faulty | Normal | Normal | No Information | Normal | Normal | Matching | Matching | Unmatching |
| Faulty | Normal | Normal | Normal | No information | Normal | Unmatching | Matching | Unmatching |
| Faulty | Normal | Normal | Normal | Normal | No information | Unmatching | Matching | Matching |

As described with reference to FIGS. 3 and 2 and Tables 1 and 2, the present invention judges whether the microprocessing units are normal or faulty from the above logic using the MPU output check circuits 23.

Next, the error detection method by a parity check circuit installed in the basic processing unit BPU as another error detection method will be described. Since the parity check circuit is well known and may be of any suitable type, detailed description will be omitted. A method for specifying an error location when a parity error is detected will now be described.

During write access, as shown in FIG. 2, information is sent to the address line a and the data line d with appropriate parity signals outputted from the parity generation and check verification circuits 10 to 15, and the error is detected by the parity check circuits 250, 30, and 31. During read access, an information error is detected by the parity generation and check verification circuits 10 to 15 and the parity check circuits 250, 30, and 31. These parity checks are performed on addresses or data independently. In the case of addresses, the error location when a parity error is detected in address information is the bus master which sends the address signal, and the device (MPU, cache memory, or BIU), which is a bus master, can be specified by monitoring a bus grant signal from a bus arbiter (not shown) which provides an internal bus use right, as shown in FIG. 2. For data, the error location when a parity error is detected in data information during write access is the bus master which sends this data signal. The bus master is specified by monitoring a bus grant signal from the bus arbiter. Finally, the error location when a parity error is detected in data information during read access is the output source of this data signal, and this can be specified by decoding the address of the device which is specified by the address of the data.

(ii) Error detection by parity check

The concept of this error location specification can be expressed by logical expressions as follows:

$$PTYGEN/NG=APE.MPU/MST+DPE(WT\ MPU/MST+RD.MPU/SND) \quad (4)$$

$$Cach/NG=APE.Cach/MST+DPE(WT.Cach/MST+RD.MPU/SND) \quad (5)$$

$$BIU/NG=APE.BIU/MST+DPE(WT.BIU/MST+RD.MPU/SND) \quad (6)$$

$$SYSBUS/NG=BIU/NG \quad (7)$$

In Expressions (4) to (7):
PTYGEN: Parity generation and check verification circuits 10 to 15
/NG: Parity error
APE: Address parity error
/MST: Bus master
+: Logical sum
DPE: Data parity error
WT: Bus master data output
Cach: Cache memory RD: Bus master data input /SND: Data output source IV. Construction change control when an error occurs BPU errors are detected by the MPU output check circuit during write access by the MPU or by the parity check circuit during write access or cache read access (i) Construction change when an error is detected by the MPU output check circuit The ON or OFF statuses of the 3-state buffer circuits 200 and 201 are controlled according to the output Ag of the error check circuit 231 of the above MPU output check circuit 23, the ON or OFF statuses of the 3-state buffer circuits 203 and 204 according to the output Ag, and the ON or OFF status of the 3-state buffer circuit 29 according to the output 29g as shown in Table 1. In Table 1, "MPU decision result Ag=1" corresponds to the status that 200 and 201 are ON, "Ag=0" to the status that 200 and 201 are OFF, "Cg=1" to the status that 203 and 204 are ON, "Cg=0" to the status that 203 and 204 are OFF. However, there is no correspondence between Bg and 29g. When Ag=1 and Cg=1, the 3-state buffer circuit 29 is OFF. When Ag or Cg is 1, only the 3-state buffer circuit 29 which is directed to the 3-state buffer circuit which is set to 0 is ON. Next, each case shown in Table 1 will be described in more detail with reference to the systematic construction shown in FIGS. 4 (*a*) to (*e*).

Case 1: All the MPU outputs match each other and all the MPUs are normal. The 3-state buffer circuits 200, 201, 203, and 204 are ON and the circuit 29 is OFF. As shown in FIG. 4(*a*), the system comprising MPUA and cache memory 220 and the system comprising MPUC and cache memory 221 are operated independently as a dual system.

Case 2: Only the check circuit CHKCA provides an unmatching output and only MPUB is determined to be normal. As shown in FIG. 2, since the MPUB is used by the other MPUs as a reference microprocessing unit and is not configured so as to provide output to the cache memory, the operation cannot be continued by changing the construction, causing system down.

Case 3: Only the check circuit CHKBC provides unmatching output and only MPUA is determined to be normal. In this case, the 3-state buffer circuits 200 and 201 are ON, 203 and 204 are OFF, and the 3-state buffer circuit 29 directed to the cache memory 221 is ON. The operations of MPUB and MPUC are stopped and as shown in FIG. 4(*b*), the operation is performed by an independent system of the MPUA. The reason for ensuring that only the 3-state buffer circuit 29 directed to the cache memory 221 is ON is to hold the consistency of the cache memory contents.

Case 4: Only the check circuit CHKAB provides a matching output and the MPUA and MPUB are determined to be normal. In this case, the 3-state buffer circuits 200 and 201 are ON, 203 and 204 are OFF, and the 3-state buffer circuit 29 directed to the cache memory 221 is ON. The operation of MPUC is stopped, and as shown in FIG. 4(*c*), MPUA and MPUB form a dual system, and MPUB monitors the MPUA output, providing dual operation The reason for ensuring that only the 3-state buffer circuit 29 directed to the cache memory 221 is ON is to hold the consistency of the cache memory contents.

Case 5: Only the check circuit CHKAB provides an unmatching output and the MPUA and MPUB are determined to be abnormal and only MPUC is judged as normal. In this case, the 3-state buffer circuits 200 and 201 are OFF, 203 and 204 are ON, and the 3-state buffer circuit 29 directed to the cache memory 220 is ON. The operations of MPUA and MPUB are stopped and as shown in FIG. 4(*d*), the operation is performed by an independent system of the MPUC. The reason for ensuring that only the 3-state buffer circuit 29 directed to the cache memory 220 is ON is to hold the consistency of the cache memory contents.

Case 6: Only the check circuit CHKBC provides a matching output and MPUC and MPUB are determined to be normal. In this case, the 3-state buffer circuits 200 and 201 are OFF, 203 and 204 are ON, and the 3-state buffer circuit 29 directed to the cache memory 220 is ON. In this case, the operation is the same as that in Case 4.

Case 7: Only the check circuit CHKCA provides a matching output and MPUC and MPUA are determined to be normal. Since this is an error in the reference MPU, the MPUB is separated as shown in FIG. 4(*e*) and the dual operation by the MPUC and MPUA is continued unless the 3-state buffer circuits are changed.

Case 8: All the check circuits CHK provide unmatching outputs and all the MPUs are faulty. Therefore, the operation cannot be continued.

As described above, the normalcy of the three MPUs and peripheral circuits thereof (for example, the parity generation and check verification circuit) is checked and the construction is suitably changed and controlled. However, Table 1 merely shows possible combinations of check results, and faulty events corresponding to Cases 2 to 7 will not have the same probability of occurring. In the above cases, Cases 4, 6, and 7, are due to a single error, Cases 2, 3, and 5 are due to a double error, and Case 8 is due to a triple error.

As is well known, the probability of simultaneous occurrence of multiple errors, including Cases 2 and 8, where the operation cannot be continued, is extremely low compared with the probability of occurrence of a single error. In most cases, however, a single error develops into multiple errors. Therefore, by taking an appropriate recovery measure for a single error, a system which can continue operation smoothly can be configured. In this embodiment of the present invention, even if double errors occur, the operation can be continued smoothly, providing a very reliable system.

When an error such as mentioned above occurs, a signal for stopping the faulty MPU, (not shown in FIG. 2), is output from the MPU output check circuit 23 so as to stop the MPU, or such a signal is externally output so as to inform the operator that an error has occured and countermeasures are necessary.

(ii) Construction change when an error is detected by parity check. As described in section III above, error locations of the cache memories 220 and 221 and BIU27-1 and BIU27-2 can be specified during write access or cache read access. Next, the BPU construction change control when an error occurs in each unit will be described. Table 3 is a list of how to control the cache memories 220 and 221, BIU27-1 and BIU27-2, and 3-state buffer circuits 29, 26, and 27 when an error occurs in each unit during cache read access.

TABLE 3

| Error location | Cache | | BIU | | 3-state buffer | | |
|---|---|---|---|---|---|---|---|
| | 220-1 | 22-1 | 270-1 | 271-1 | 29 | 26 | 27 |
| 1Cache 220-1 | OFF | ON | * | * | ← | OFF | ON |
| 2Cache 221-1 | ON | OFF | * | * | → | ON | OFF |
| 3BIU270-1 | * | * | OFF | ON | ← | OFF | ON |
| 4BIU271-1 | * | * | ON | OFF | → | ON | OFF |

OFF: High impedance state
ON: Enable state
→←: Transmission direction
*: Non-selection (High impedance state)

FIGS. 5(*a*) to 5(*e*) show the circuit construction in each case. The construction change control will be described with reference to Table 3 and FIGS. 5(*a*) to 5(*e*). FIGS. 5(*a*) shows the signal flow in the normal state. In this case, the 3-state buffer circuits 29 and 26 are OFF and 27 ON. Accordingly, information from the BIU27-1 or the cache memory 220 is supplied to the MPUA20-1 and MPUB20-1, and information from the BIU27-2 or the cache memory 221 is supplied to the MPUC20-3. Thus, the system operates so that the BIU27-1, cache memory 220, MPUA20-1, and MPUB20-1 constitute one set and the BIU27-2, cache memory 221, and MPUC20-3 constitute another set.

Figure 5A:
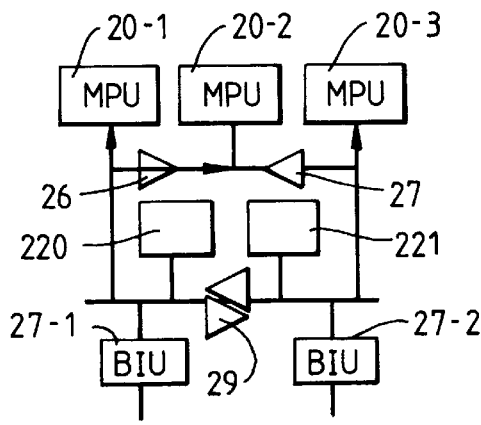
FIG. 5($a$) to 5($e$) are schematic views of a BPU when an error occurs during read access.
Figure 5B:
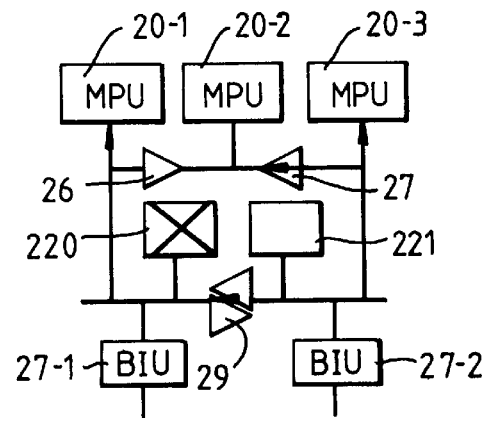

Case 1: The cache memory 220 is faulty As shown in FIG. 5(b), the output of the cache memory 220 is stopped, the 3-state buffer circuit 29 is controlled so that only a signal to the MPUA20-1 passes, the 3-state buffer circuit 26 is ON, and 27 is OFF. By doing this, all the MPUs are arranged to receive common information from the cache memory 221 and operated continuously after an error is detected. The reason for the 3-state buffers 26 and 27 being changed from the normal status to a status in which buffer 26 is ON and buffer 27 is OFF is that, although the cache memory 220 is logically specified to be faulty, it is also possible that the internal bus to which the cache memory 220 is connected is faulty and the cache memory 221 is selected to determine this. When the internal bus to which the cache memory 220 is connected is faulty, the 3-state buffer circuit 29 is in the one-way communication state and the MPUC is not affected by it.

Figure 5C:
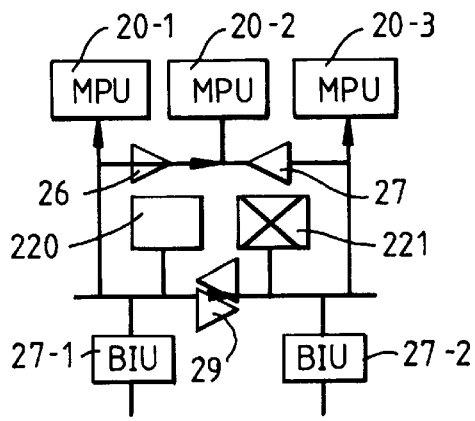

Case 2: The cache memory 221 is faulty. As shown in FIG. 5(c), the output of the cache memory 221 is stopped and the 3-state buffer circuit 29 is controlled so that only a signal to the MPUC20-3 passes. By doing this, all the MPUs are configured so as to receive common information from the cache memory 220 and operated continuously after an error is detected.

Figure 5D:
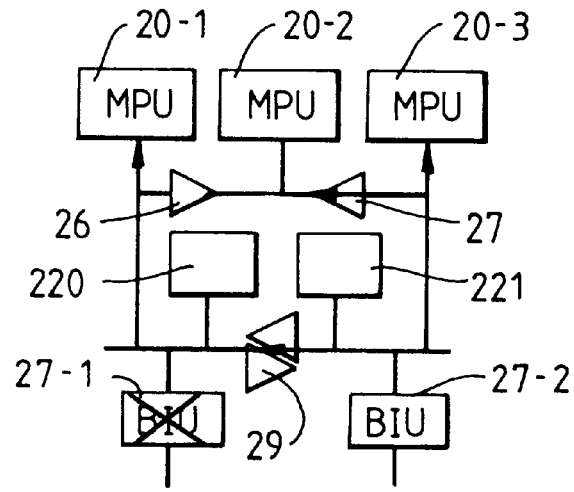
Figure 5E:
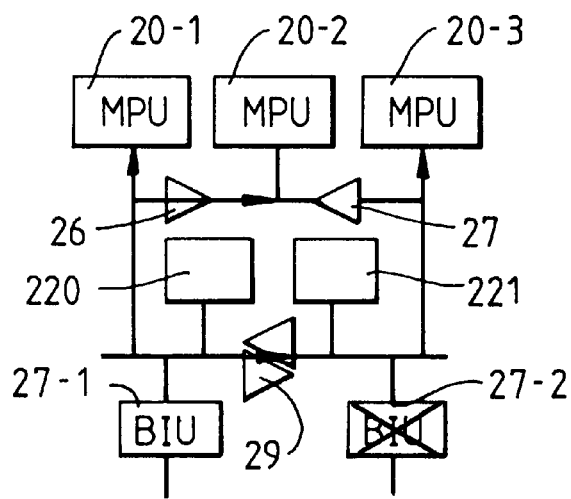

Cases 3 and 5: The BIU270 or the system bus 1-1 to which it is connected is faulty. As shown in FIGS. 5(d) and 5(e), the BIU270 or the system bus 1-1 to which it is connected is stopped and the operation in Case 1 is performed.

As described above, when a parity error is detected, the construction is changed and the error is reported to the outside.

As described above in detail, according to this embodiment of the present invention, even if an error occurs in the BPU, the operation can be continued in the same way as in the normal state by separating a part of the circuit construction or changing the information flow. When an error occurs during data processing, it is recommended:

(1) To continue the operation using the BPU until a suitable time to break off operation or a standard repair and maintenance time arrives.

(2) To allow another normal BPU to perform the processing to be executed by the BPU when a suitable time to break off operation, or a standard repair and maintenance time arrives.

As a result, the backup operation for check point restart when an error occurs is not required and the processing performance is improved.

V. Signal processing when the internal bus is connected

Figure 6:
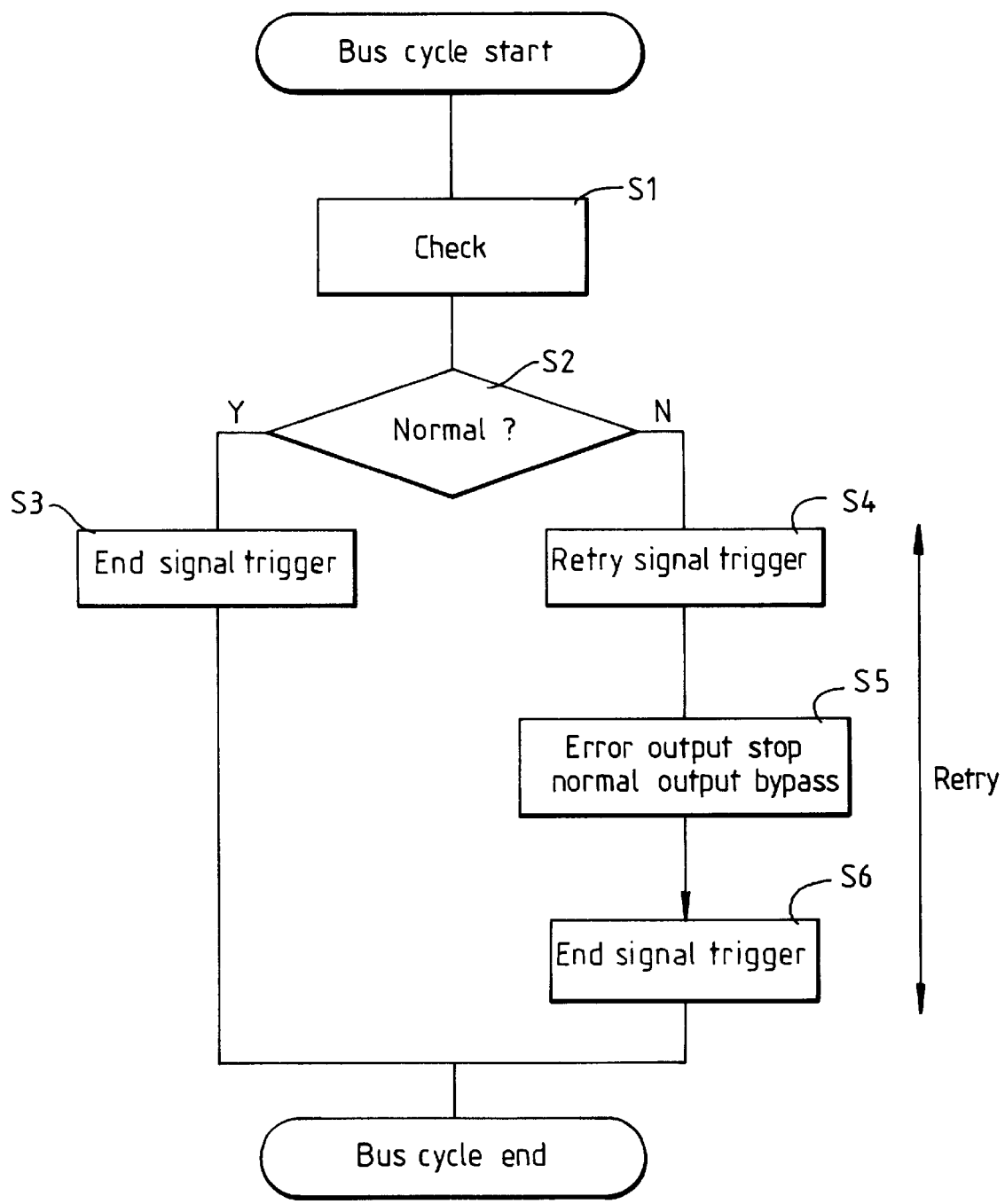
FIG. 6 is a flow chart of bus cycle control.

As described above, the 3-state buffer 29 is used to change the internal bus when an error occurs in a unit. However, such a change requires much time compared with write access in the normal path due to bypass between buses. A countermeasure is to extend the bus cycle by a retry when an error occurs as shown in FIG. 6 so as to eliminate delays in the bus cycle.

When an error is detected (Step S1 or S2), a signal for allowing a retry signal is triggered at Step S4, the faulty output is stopped (the faulty MPU is separated) and bypass processing for the normal output is executed at Step S5, and a signal for ending this bus cycle is triggered at Step S6 so as to end a series of processing. When no error is found, a signal for ending this bus cycle can be triggered at Step S3. The type of signal conductor for allowing one of the MPUs to end the bus cycle or to execute a retry varies with the type of MPU. Most MPUs automatically execute a retry by inputting a retry signal. Table 4 shows typical MPU signal.

TABLE 4

| MPU name | Signal for ending bus cycle | Signal for allowing a retry (2 signals) |
|---|---|---|
| 68000 | $\overline{DTACK}$ | $\overline{HALT}$, $\overline{BERR}$ |
| H32/200 | $\overline{DC}$ | $\overline{DC}$, $\overline{BERR}$ |
| 68040 | $\overline{TA}$ | $\overline{TA}$, $\overline{TEA}$ |

Figure 7:
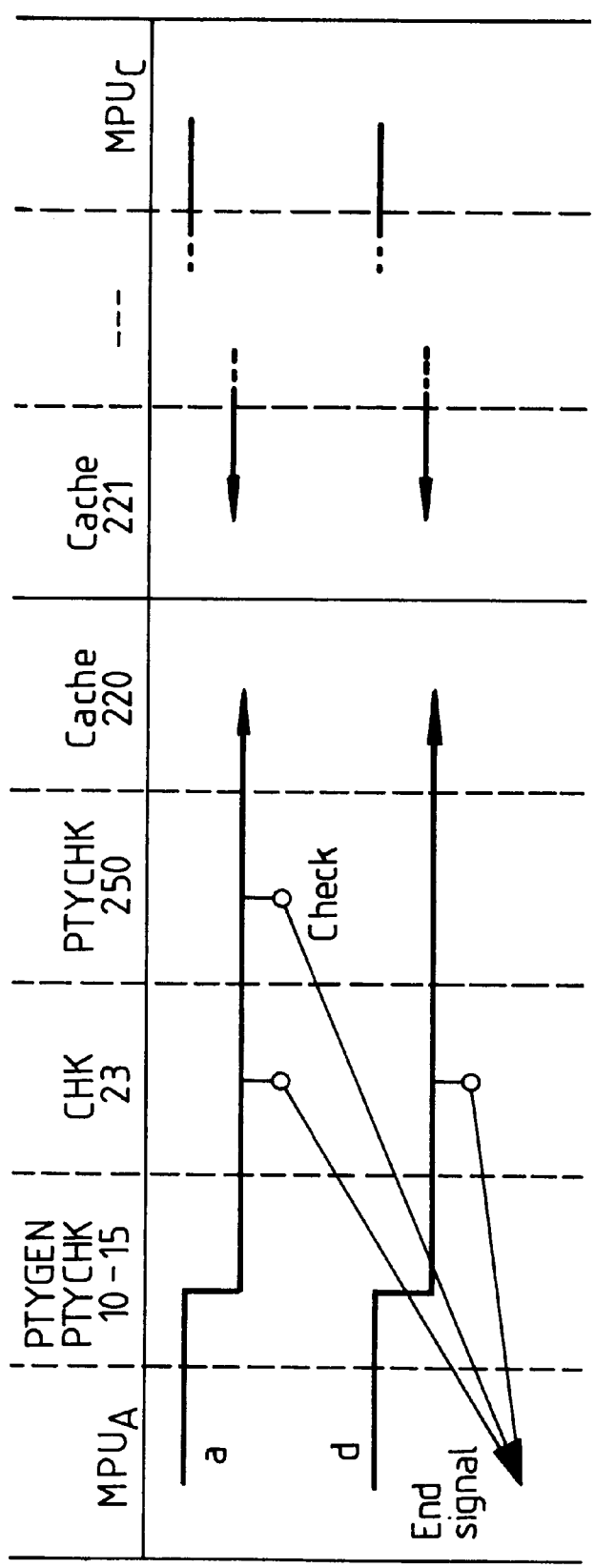
FIG. 7 is a signal flow chart of a BPU when MPUs are normal.
Figure 8:
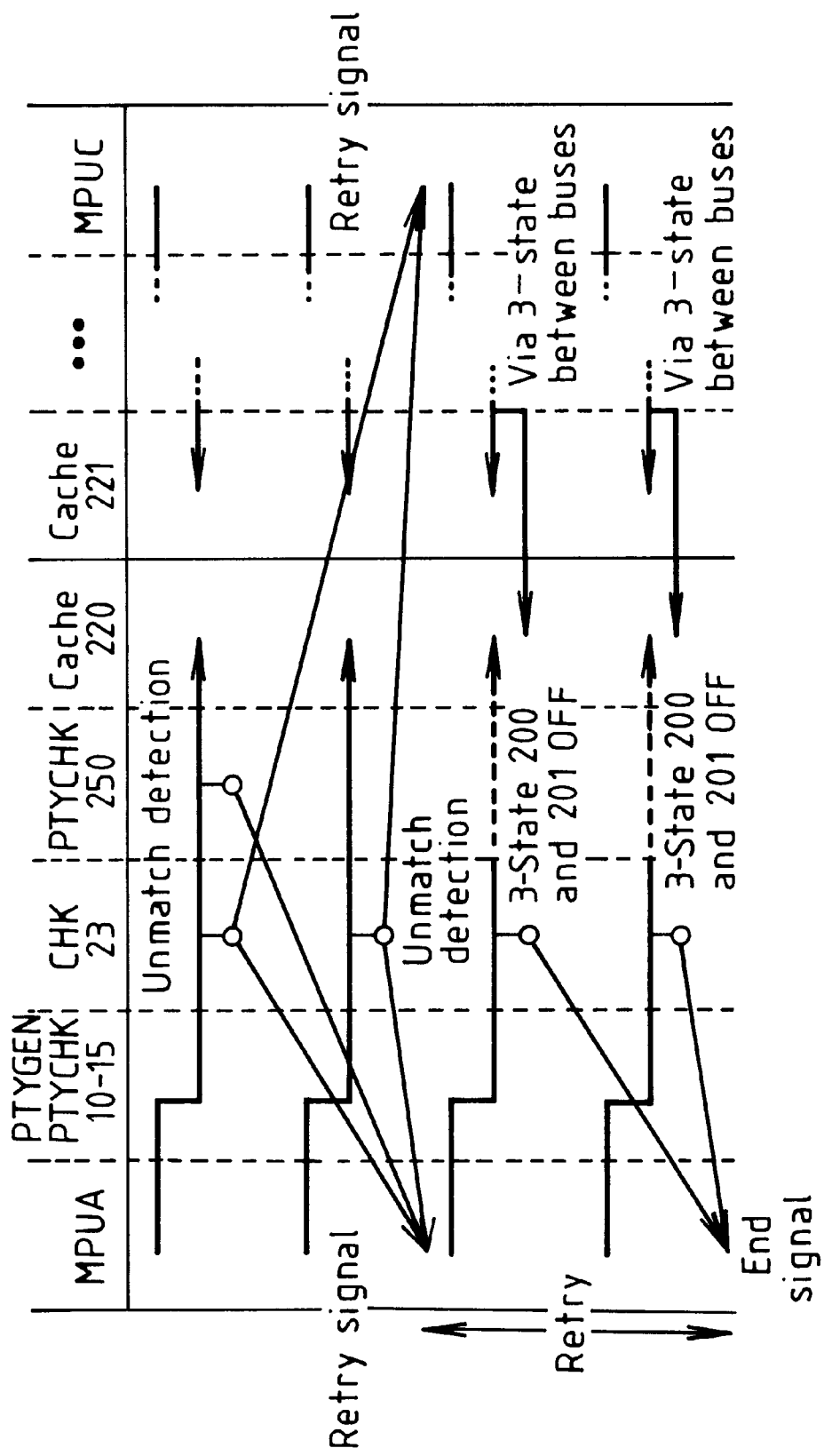
FIG. 8 is a signal flow chart of a BPU when MPUs are faulty.

FIGS. 7 and 8 show the signal flow when the retry method shown in FIG. 6 is used for write access. FIG. 7 shows the signal flow in the normal state, and FIG. 8 shows the signal flow in the abnormal state. In the figures, the vertical axis represents the elapsed time and the horizontal axis presents circuits through which the MPU output reaches the cache memory. The MPU generally outputs the address signal prior to the data signal (d). In FIG. 7, since the address signal (a) and the data signal (d) are normal, they are judged as normal by the MPU output check circuit 23 and the parity check circuit 250, an end signal is feed back to the MPU, data is stored in the cache memory 220, and then the bus cycle ends.

In FIG. 8, the MPUA is faulty, the address signal (a) and the data signal (d) are judged as faulty by the MPU output check circuit 23, an end signal as well as a retry signal are feed back to each MPU so as to perform a retry operation. During the retry operation, the 3-state buffers 200 and 201 are made OFF so as to prevent signal transmission from the MPUA to the internal bus and the 3-state buffer 29 is made ON in one direction so as to supply an output signal from the MPUC to the cache memory 250. Thereafter, an end signal is returned to each MPU and the operation ends.

Figure 9:
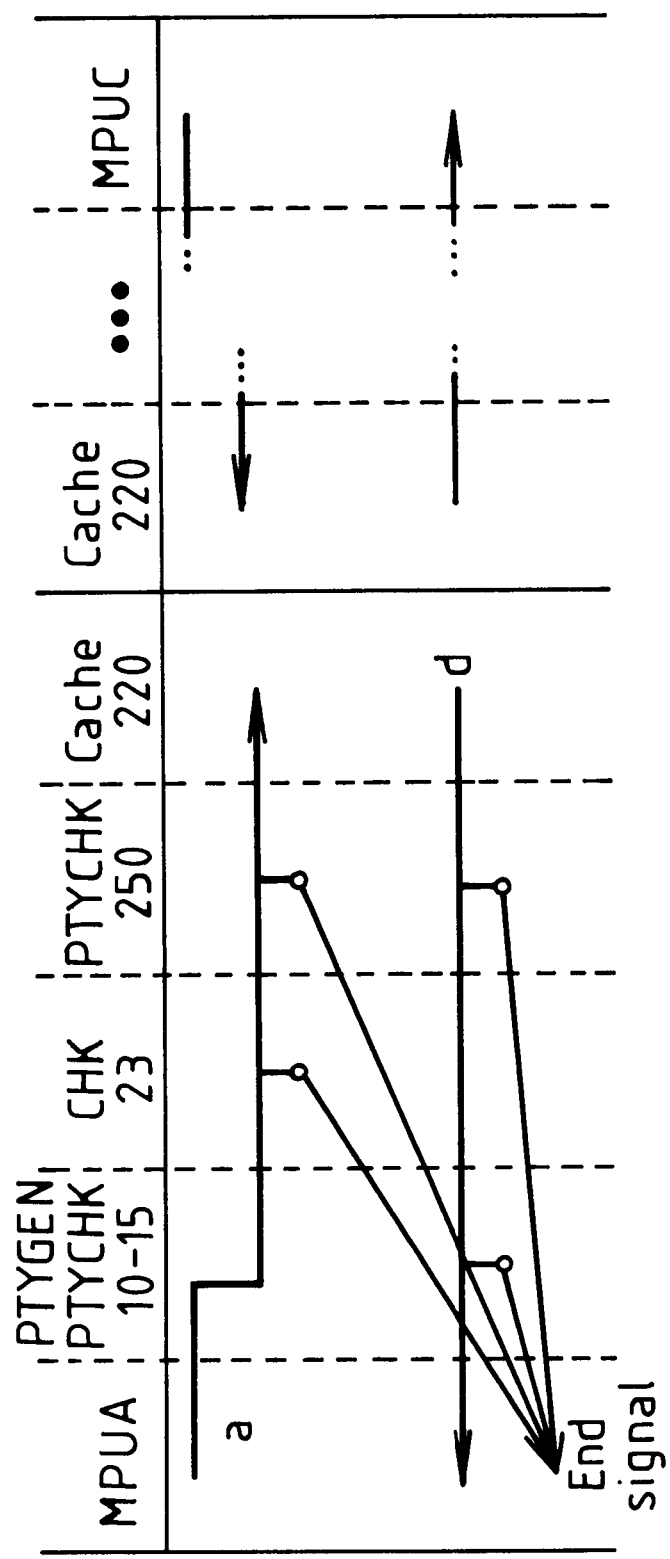
FIG. 9 is a further signal flow chart of a BPU when MPUs are normal.
Figure 10:
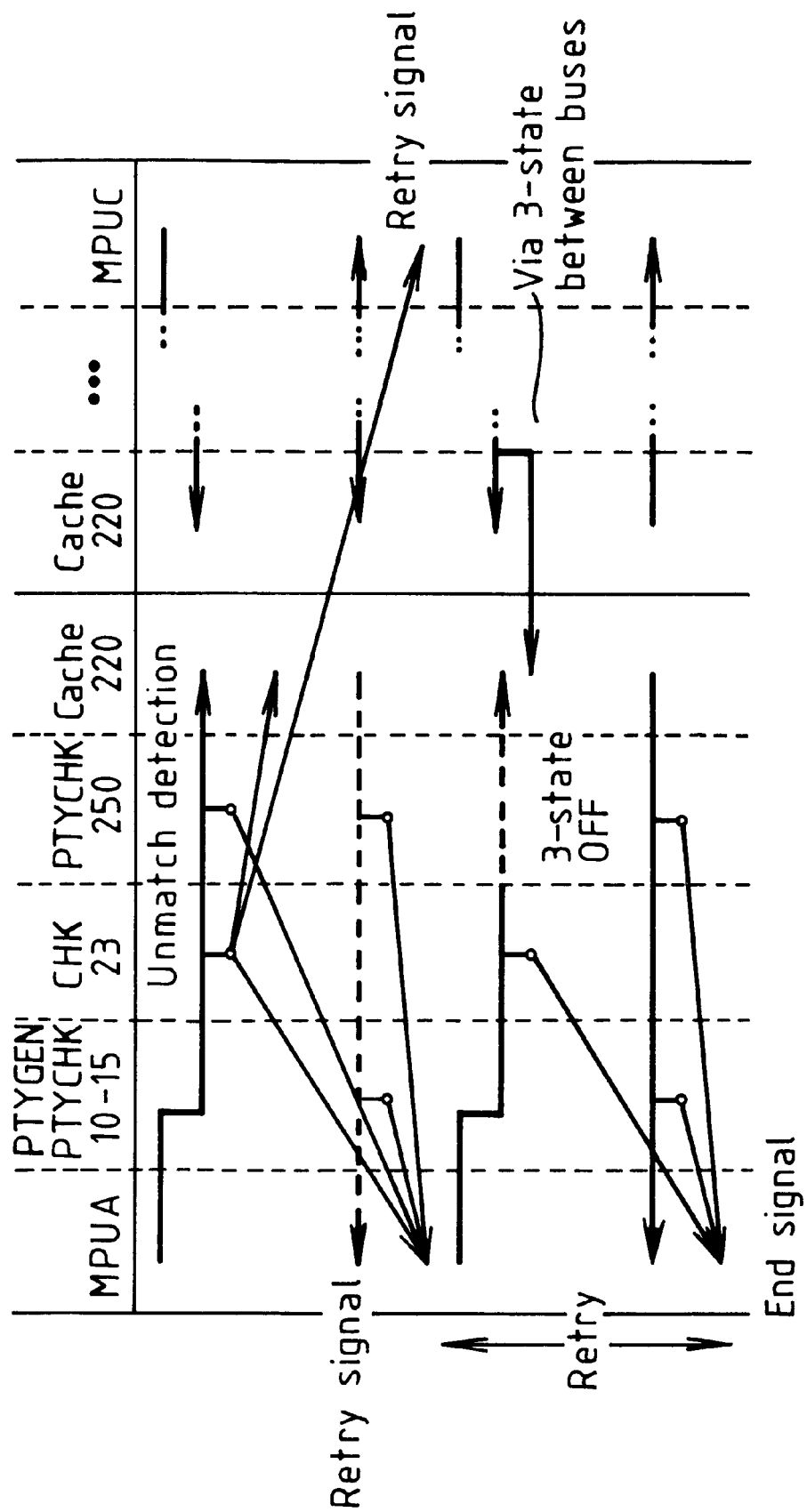
FIG. 10 is a further signal flow chart of a BPU when an address signal is faulty.
Figure 11:
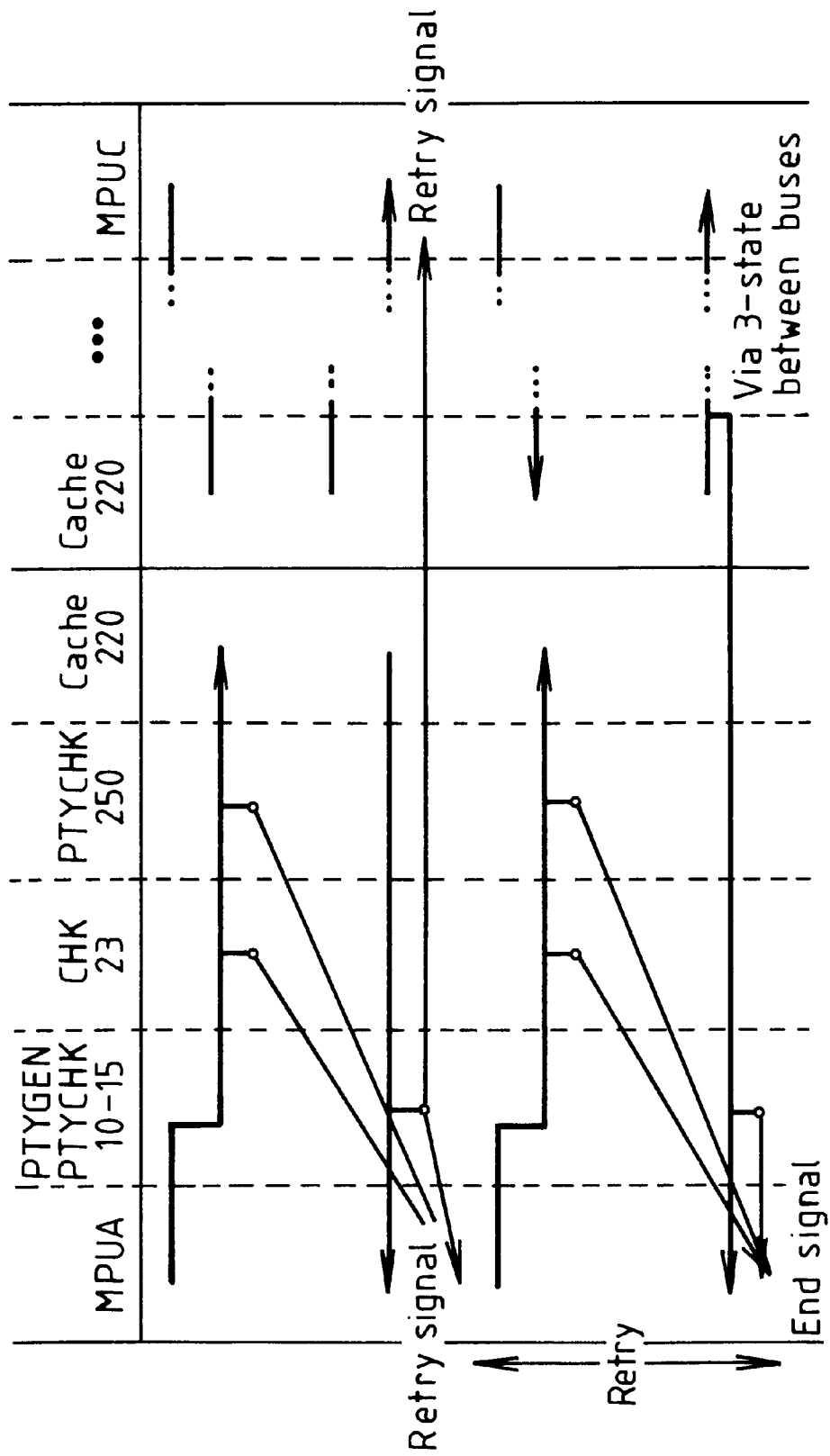
FIG. 11 is a signal flow chart of a BPU when a data signal is faulty.

FIGS. 9, 10, and 11 show signal flow when the retry method shown in FIG. 6 is used for cache read access. FIG. 9 shows the signal flow in the normal state, FIG. 10 shows the signal flow in the address signal error state, and FIG. 11 shows the signal flow in the data signal error state.

In FIG. 9, since the address signal (a) and the data signal (d) are normal, an end signal is fed back to the MPU, the MPU stores data from the cache memory 250, and the bus cycle ends.

In FIG. 10, where the address signal from the MPUA is determined to be faulty because it does not match the others, an end signal as well as a retry signal are fed back to each MPU, and the retry operation is performed. During the retry operation, the 3-state buffer 201 is made OFF so as to prevent signal transmission from the MPUA to the internal bus, the 3-state buffer 29 is set to the ON state in one direction so as to supply an address output signal from the MPUC to the cache memory 220, and the cache memory 220 supplies data stored at the provided address to the MPUA and MPUB. Thereafter, an end signal is fed back to each MPU and the operation ends.

In FIG. 11, where data from the cache memory 220 is faulty, it is judged as determined to be the parity check of the parity generation and check verification circuits 10 and 12 and of the parity check circuit 250, an end signal as well as a retry signal are fed back to each MPU, and a retry operation is performed. During the retry operation, output from the cache memory 220 is prevented, and the 3-state buffer 29 is set to the ON state in one direction so as to supply the output of the cache memory 221 to the MPUA and MPUB. In this case, the 3-state buffers 26 and 27 are changed from a normal status to one in which buffer 26 is OFF and buffer 27 is ON, and the output of the cache memory 221 is supplied to the MPUB via the 3-state buffer circuit 27. By doing this, the supply of incorrect data to the MPUB can be prevented because the data signal path from the cache memory 220 to the MPUB is faulty.

VI. Recovery measure after an error occurs

The apparatus of the embodiment of present invention can continue operation after an error occurs. However, it is desirable to return the apparatus to the initial state as early as possible, as there is a possibility of a secondary fault when the apparatus is operated permanently with the faulty construction unchanged. Next, recovery measures for the faulty BPU function will be described This recovery method assumes that the BPU shown in FIG. 1 is formed on a PC board and a faulty BPU PC board is replaced with a normal BPU PC board.

Figure 12:
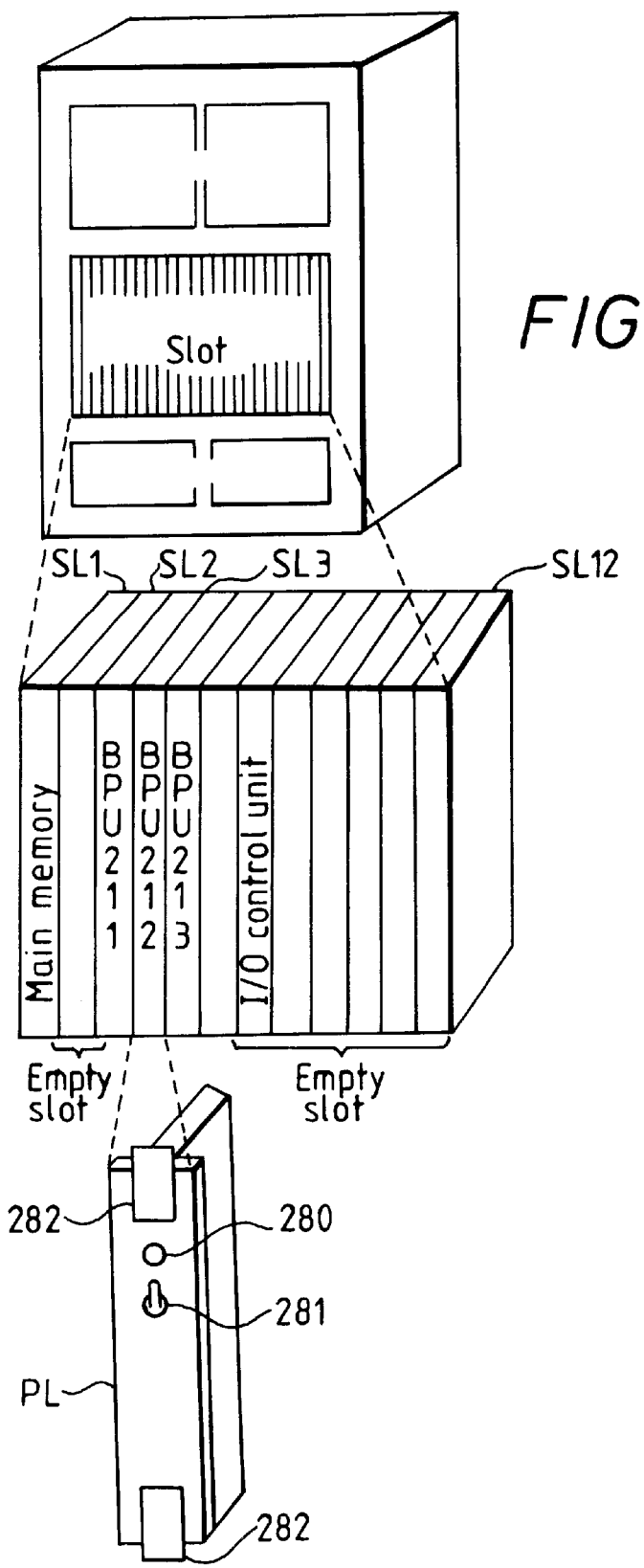
FIG. 12 is a schematic view of a computer panel.

FIG. 12 shows the construction of a computer panel Inside the door, there is a slot section for holding PC boards and, a PC board comprising the main memory 3, BPU2, and I/O control unit BIU4 shown in FIG. 1 is inserted into each slot, and the inserted PC boards are connected to a system bus (not shown in FIG. 11). In the example shown in FIG. 12, there are 12 slots SL provided, and PC boards are inserted in SL1 and SL3 to SL6. Slots SL2 and SL7 to SL12 are empty slots. PC boards PL to be inserted into the slots SL are optional. Each PC board is provided with a lever 282 for fixing it to the corresponding slot SL, an indicator lamp 280 for indicating whether the PC board is stopped or not, and a PC board removal request button 281 when necessary Next, the BPU PC board replacement procedure will be described.

(i) Replacement when only one BPU PC board is provided.

Figure 13:
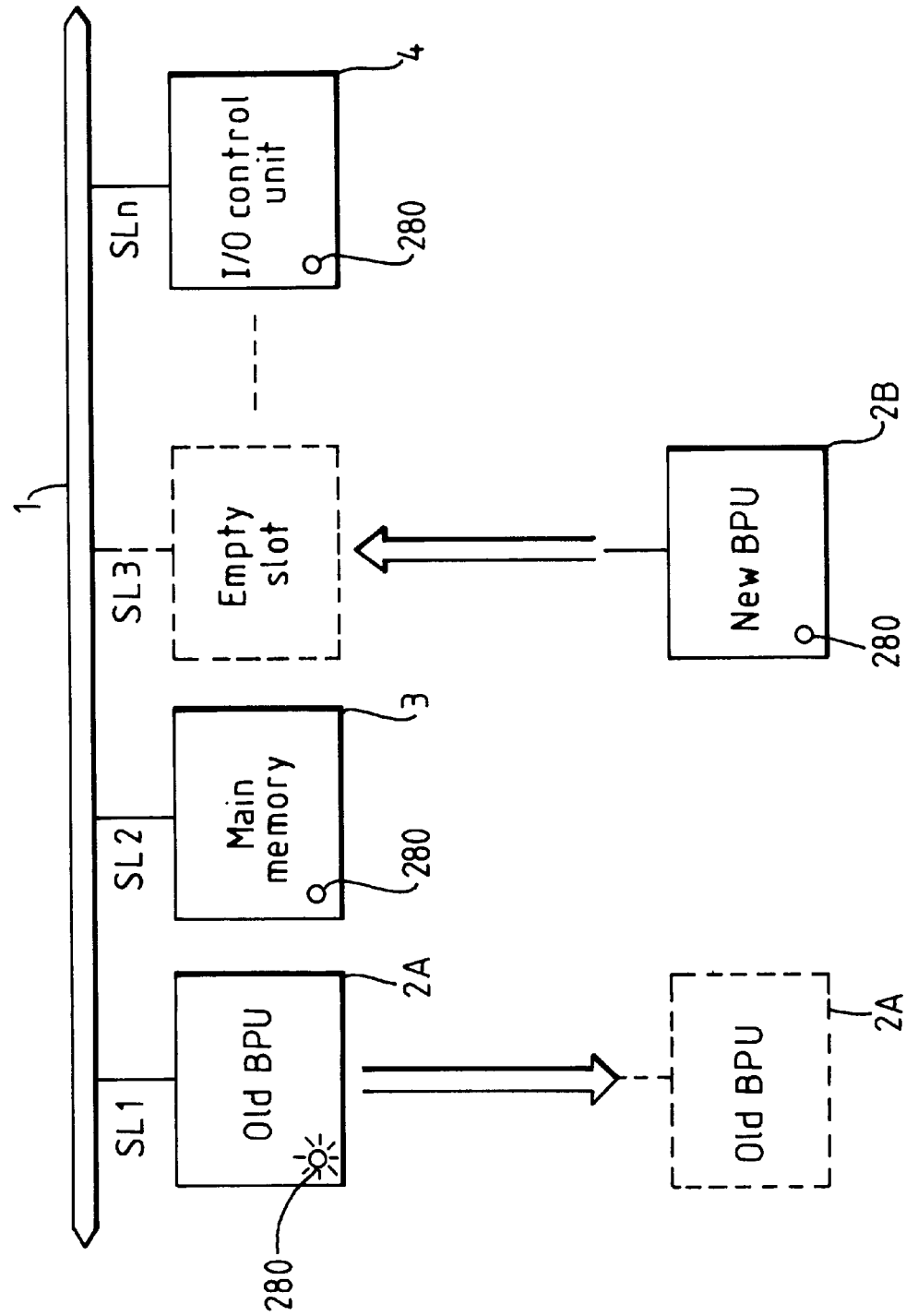
FIG. 13 illustrates the principle of BPU replacement; principle.

FIG. 13 shows an example in which, of the n slots SL of a system bus 1 (a single system is shown for ease of description) to which PC boards PL can be connected, a BPU PC board, wherein a fault occurs, is inserted in SL1, a main memory 3 PC board in SL2, an IOU4 PC board in SLn, and SL3 is an empty slot. In this example, a new BPU which is to function in place of the faulty BPU is not inserted in the slot. The indicator lamp 280 on the PC board is off because the PC board is in operation.

To take over the function of the old BPU2A to the new normal BPU2B in this state, an empty slot is prepared first. Since the slot SL3 is an empty slot in FIG. 13, the new BPU2B is inserted into the slot SL3.

The BPU2A detects insertion of the BPU2B, transfers the task which is executed by the old BPUA to the new BPU2B by processing of the operating system (OS), and turns on the indicator lamp 280 on the PC board of the old BPU2A. Thereafter, online operation is executed by the new BPU2B. The transfer operation from the old BPU2A to the new BPU2B is performed instantaneously. Thereafter, the indicator lamp 280 on the old BPU PC board lights so as to indicate that the BPU is stopped, and the old BPU2A is removed. Since the online application is transferred to the new BPU2B by the above procedure before the old BPU2A may then be removed, the BPU can be replaced without the system being stopped and the system performance being lowered.

Figure 14:
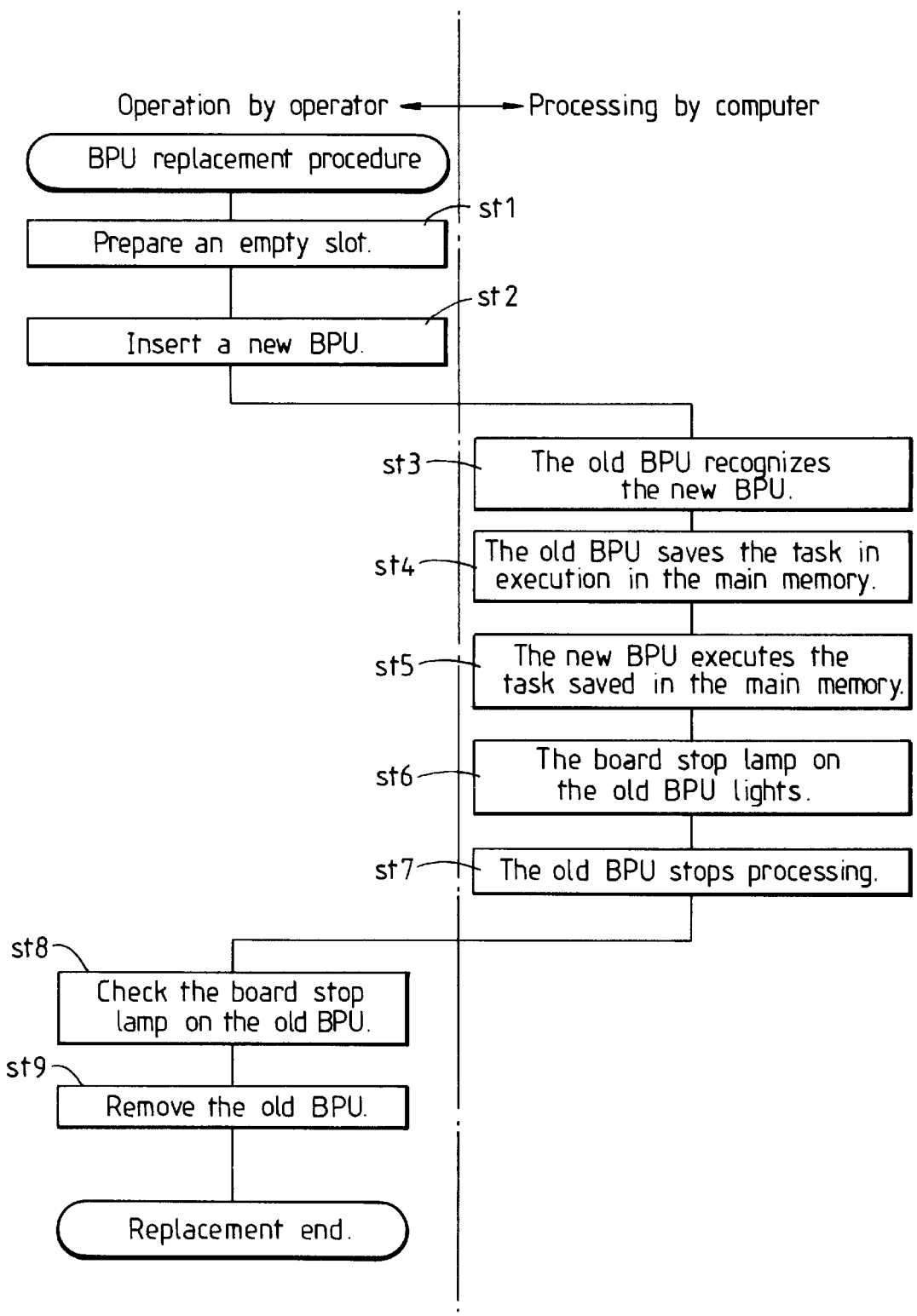
FIG. 14 shows in more detail the procedure for BPU replacement.

FIG. 14 is a flow chart of the BPU replacement procedures in the example shown in FIG. 13, indicating processing contents by an operator and a computer. When replacing the BPU, an empty slot is prepared first (Step 1). The empty slot is normally a slot which is not in use. When there is no empty slot, a hardware board which can be removed temporarily, is removed from its slot so as to obtain a temporarily empty slot, and the board is returned after the target BPU is replaced. Next, the new BPU is inserted into the empty slot (Step 5). The old BPU2A recognizes insertion of the BPU by an interruption means (Step 4). Then, the old BPU2A saves the task in execution in the main memory (Step 3) so as to allow the new BPU2B to continue the processing of the task. The new BPU2B accepts it and executes the task (Step 5) so as to coninue the online operation. The old BPU2A turns on the board stop lamp on the BPU (Step 6) and stops processing (Step 7). Thereafter, the operator confirms that the board stop lamp on the old BPU is on (Step 8) and removes the old BPU (Step 9), completing the BPU replacement.

Figure 15:
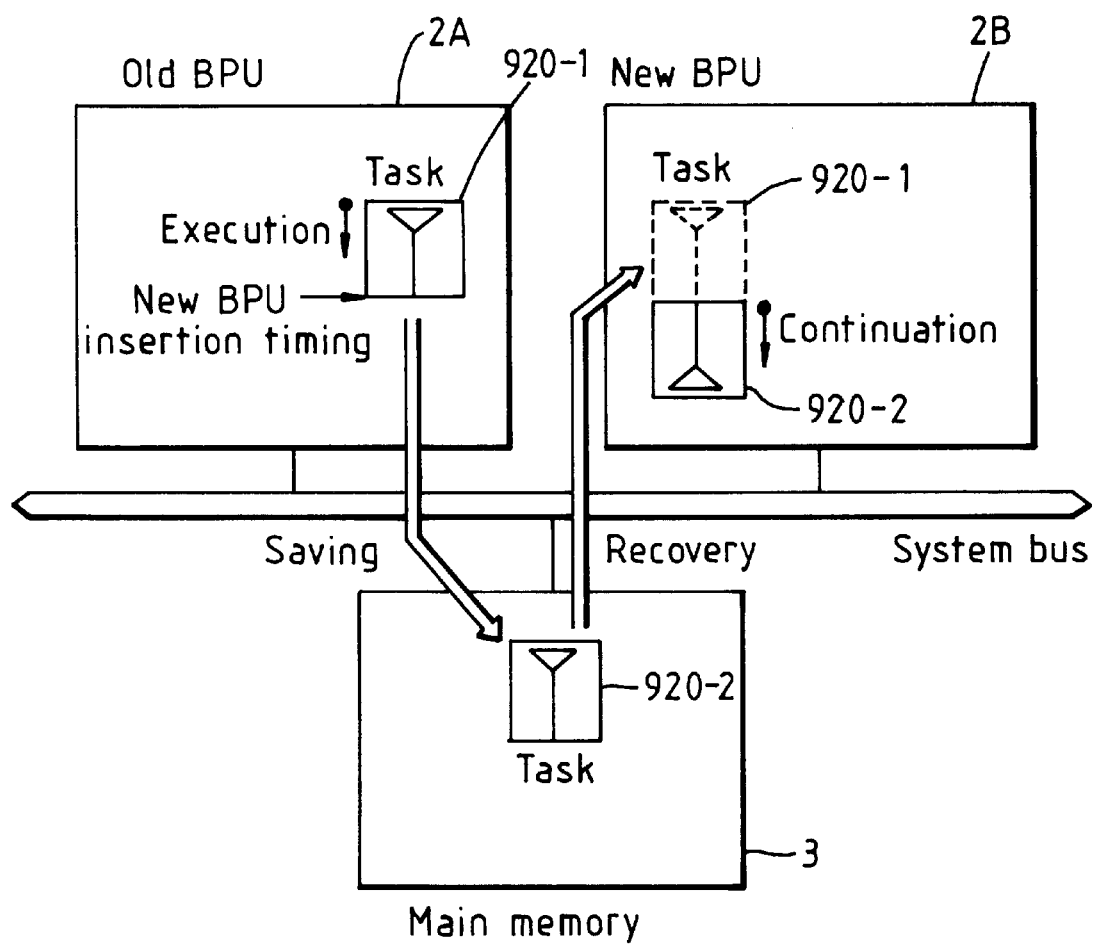
FIG. 15 shows the transfer of processing ("inheritance") between new and old BPUs.

FIG. 15 a detailed illustration for the means for taking over the task which is executed by the old BPU2A, by the new BPU2B shown in the above embodiment. The PC boards of the old BPU2A, new BPU2B, and main memory 3 are connected to the system bus. A task 920-1 is executed on the old BPU2A. Assuming that information that the new BPU2B is inserted is sent to the old BPU2A at that time, the old BPU2A halts the processing and the task 920-1 being executed is saved in the main memory 3. The new BPU2B recovers the task 920-1 following the task 920-1 saved in the main memory 3 and continues the processing of the task from the point of interruption. Transfer of operation ("inheritance") between the replaced BPUs can be performed by the above method.

The above description refers to an example of BPU replacement when only one BPU is provided. In the above embodiment, one BPU can be replaced without the system being stopped.

(ii) Replacement when a plurality of BPU PC boards are provided.

Next, the steps necessary when a plurality of BPUs are provided or an inserted BPU does not operate correctly will be described. A plurality of BPUs are provided in the embodiment shown in FIG. 16. Each BPU has a means for specifying a new BPU, a board removal request button 281, and a PC board number 282.

The PC boards BPU2A, BPU2B, and BPU2C are inserted in the slots SL1 to SL3 so as to be connected to the system bus 1. The main memory is connected to the slot SL4 and the slot SL5 is empty. Each BPU has an indicator lamp 280 which lights when it stops, a PC board removal request button 281 for specifying the BPU to be removed, and a PC board number 282. It is assumed that "1" is assigned to BPU2A as a PC board number, "2" to BPU2B, and "3" to BPU2C. When replacing the BPU2B inserted in the slot SL2 with a new BPU2D, the new BPU2D is inserted into the empty slot SL5 first The PC board removal request button 281 on the BPU2B in the slot SL2 to be replaced among the BPUs inserted in the slots SL1 to SL3 is pressed. The old BPU2B saves the task in execution and its own PC board number in the main memory 3, and the new BPU2D fetches the PC board number saved in the main memory 3 and executes the saved task. Thereafter, it is checked that the board stop lamp 280 of the old BPU2B is on and the BPU2B is removed.

Figure 16:
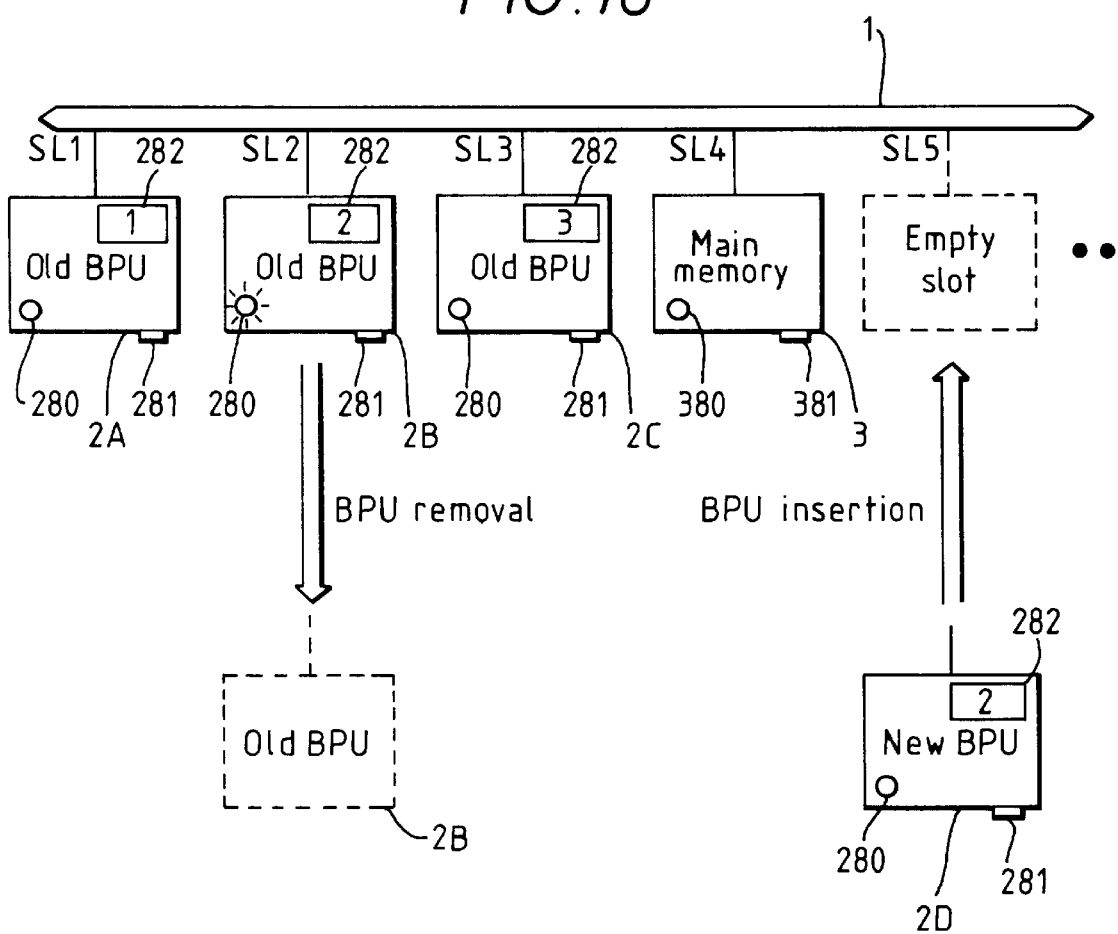
FIG. 16 illustrates the principle of BPU replacement in a multiprocessor.
Figure 17:
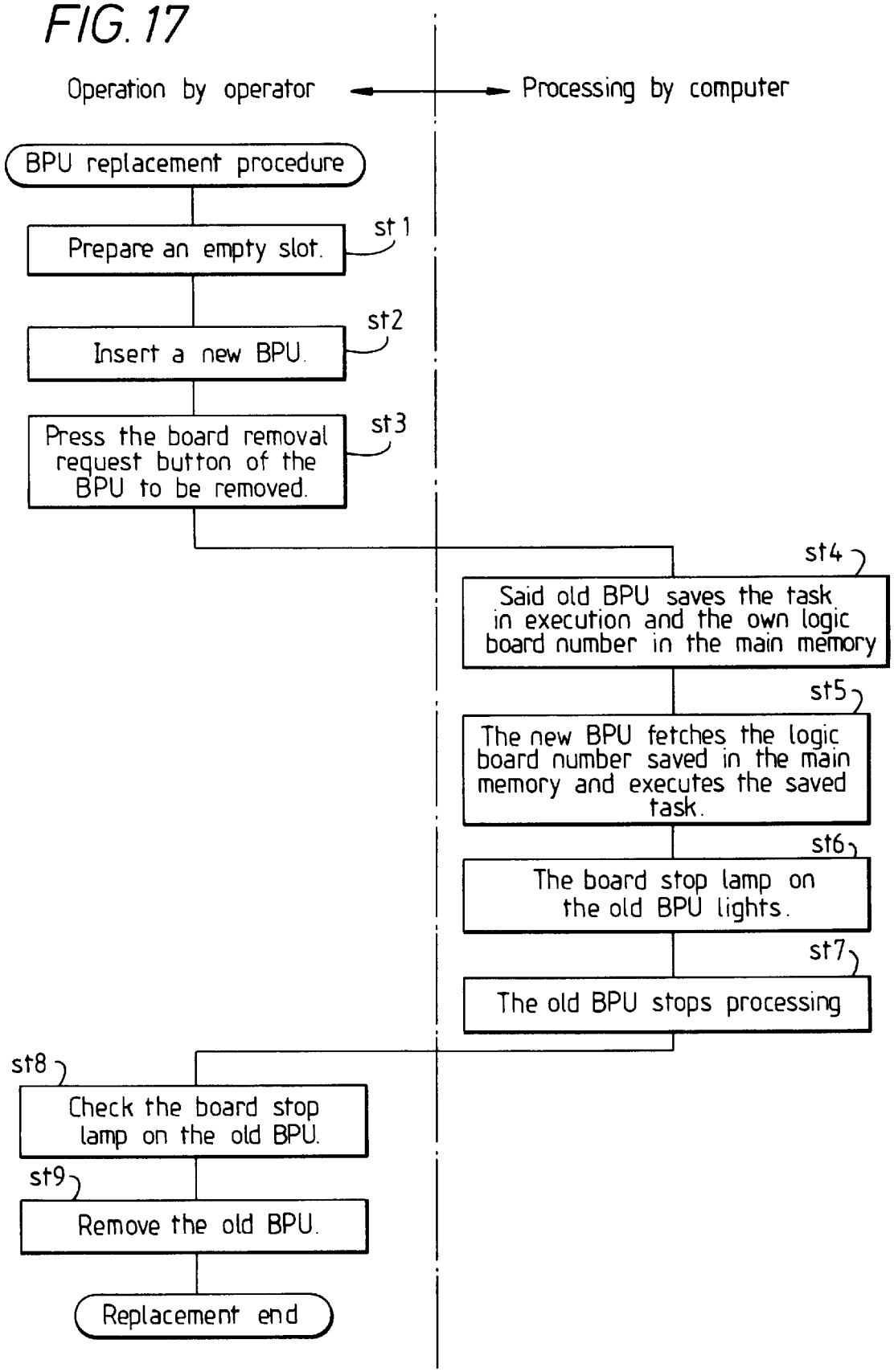
FIG. 17 shows in more detail the procedure of BPU replacement in a multiprocessor.

FIG. 17 is a flow chart of the BPU replacement procedures in the example shown in FIG. 16, indicating processing contents by an operator and a computer.

When replacing the BPU, an empty slot is prepared first (Step 1). The empty slot is normally, a slot which is not in use. When there is no empty slot, a hardware board which can be removed temporarily, is removed from the slot so as to obtain a temporarily empty slot, and the board is returned after the target BPU is replaced.

Next, the new BPU2D is inserted into the empty slot (Step 2). Thereafter, the PC board removal request button of the old BPU2B to be removed is pressed (Step 3). Then, the old BPU2B saves the task in execution and the own PC board number in the main memory 3 (Step 4) so as to allow the new BPU2D to continue the processing of the task. The new BPU2D accepts it and executes the task (Step 5) so as to start online operation. The old BPU2B turns on the indicator lamp on the BPU (Step 6) and stops the processing (Step 7). Thereafter, the operator confirms that the indicator lamp on the old BPU2B is on (Step 8) and removes the old BPU2B (Step 9), completing BPU replacement.

Figure 18:
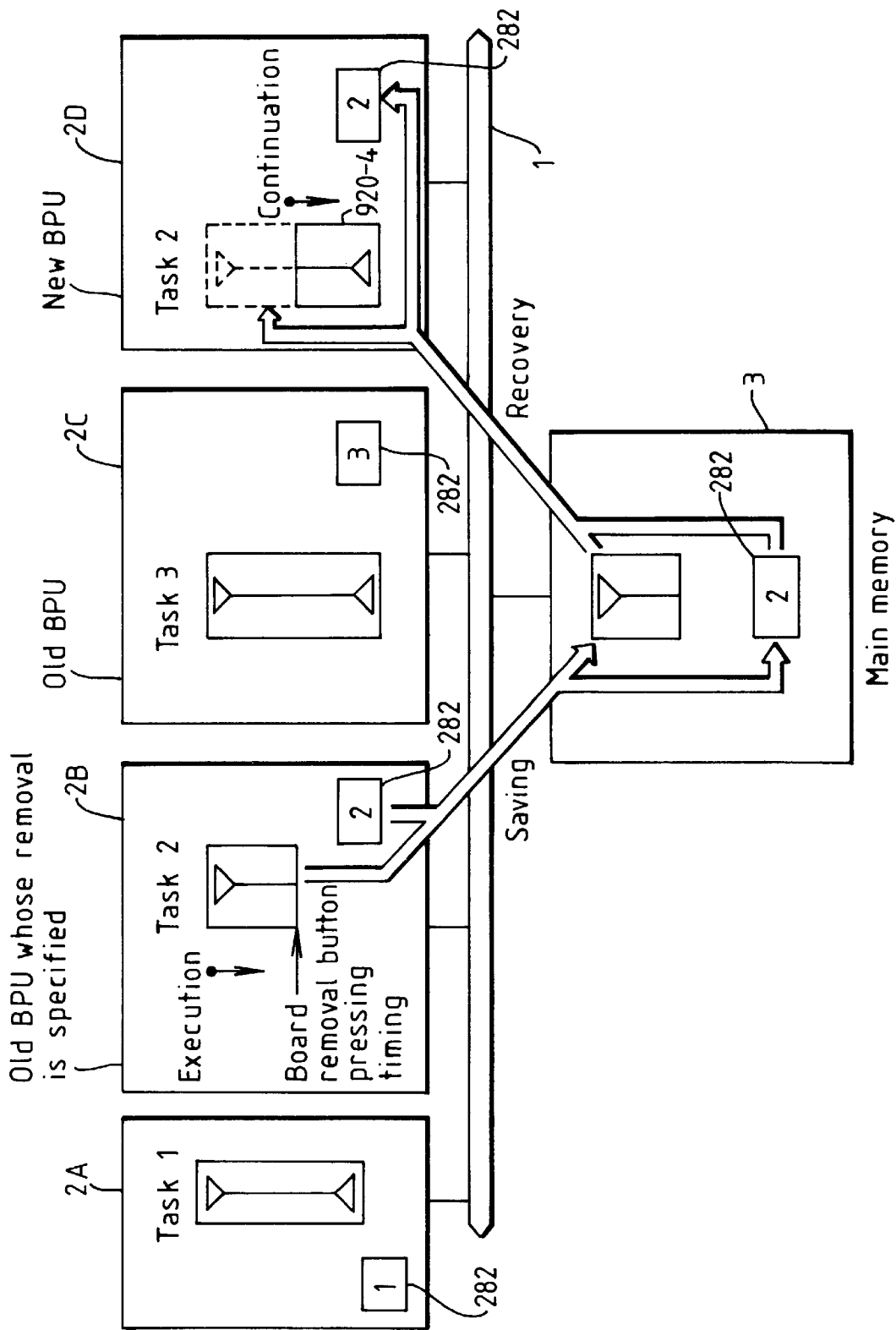
FIG. 18 shows the transfer of processing ("inheritance") between new and old BPUs in a multiprocessor.

FIG. 18 a detailed illustration for the means for taking over the task, which is executed by the old BPU, and the PC board number to the new BPU shown in the above embodiment. The three old BPUs (2A, 2B, and 2C), new BPU2D, and main memory are connected to the system bus. Tasks 1, 2, and 3 are executed on the old BPU2A, 2B, and 2C, and task 2 on the old BPU2C. The PC board numbers 282 of the old BPU2A, 2B, and 2C are 1, 2, and 3. When the PC board removal request button of the old BPU2B is pressed so as to specify the BPU to be removed, the old BPU2B halts the processing and saves the task 2 in execution and its own PC board number 2 in the main memory 3. The new BPU2D recovers the PC board number 2 and the task 1 which are saved in the main memory 3 and continues the processing of the task from the point of interruption. Transfer of operation ("inheritance") between the replaced BPUs can be performed by the above method.

According to this embodiment, by installing a PC board removal request button which is a means for specifying the BPU to be replaced, even if a plurality of BPUs are provided, a BPU can be replaced without the system being stopped and the system performance being lowered.

Since the PC board number assigned to the BPU to be replaced is inherited by another BPU, even if the operating PC board number is specified by the user program, the BPU can be replaced without the user program being changed.

(iii) Incorrect operation of an inserted BPU.

Figure 19:
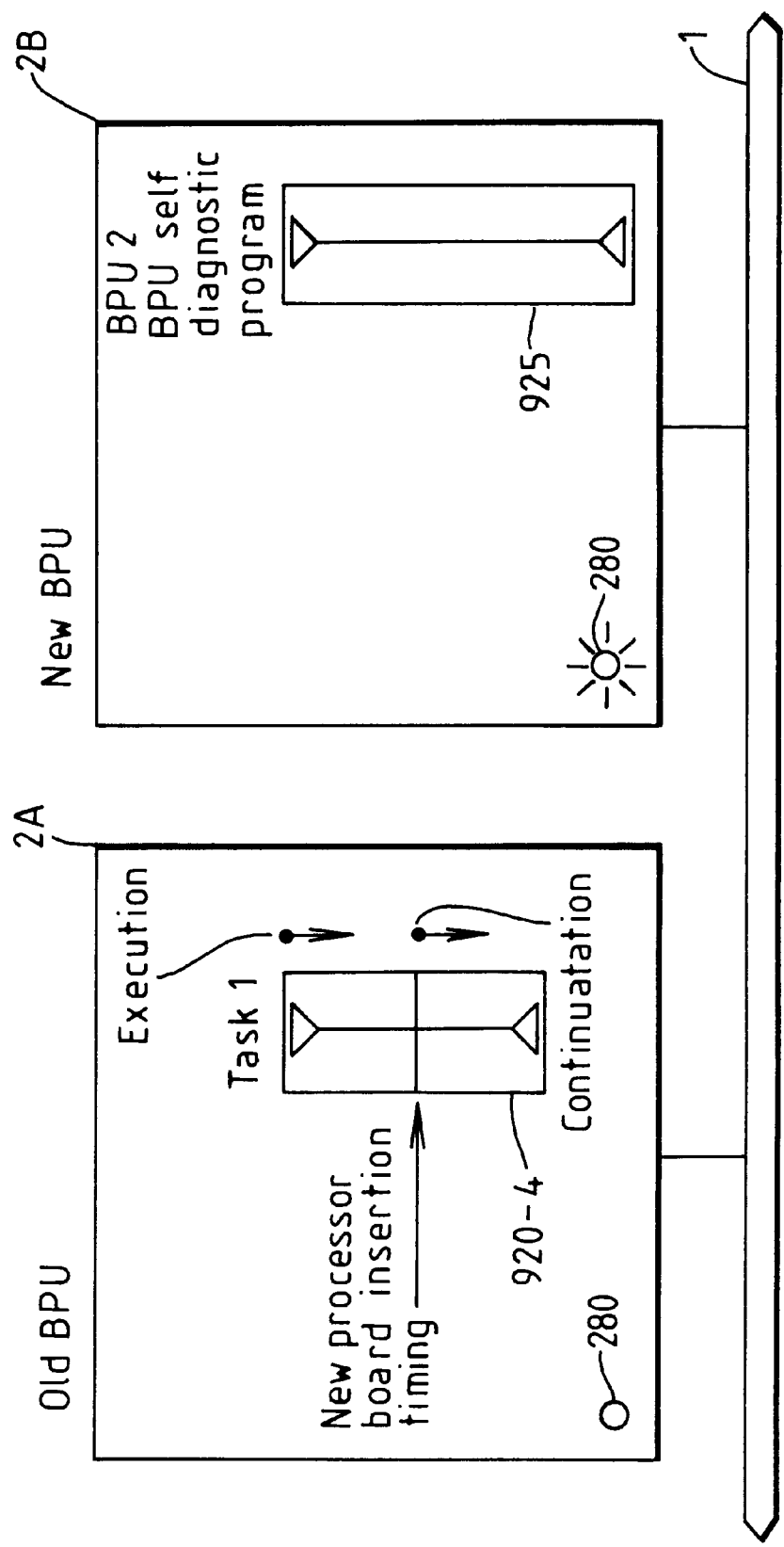
FIG. 19 shows the process for BPU replacement when an inserted BPU is faulty.
Figure 20A:
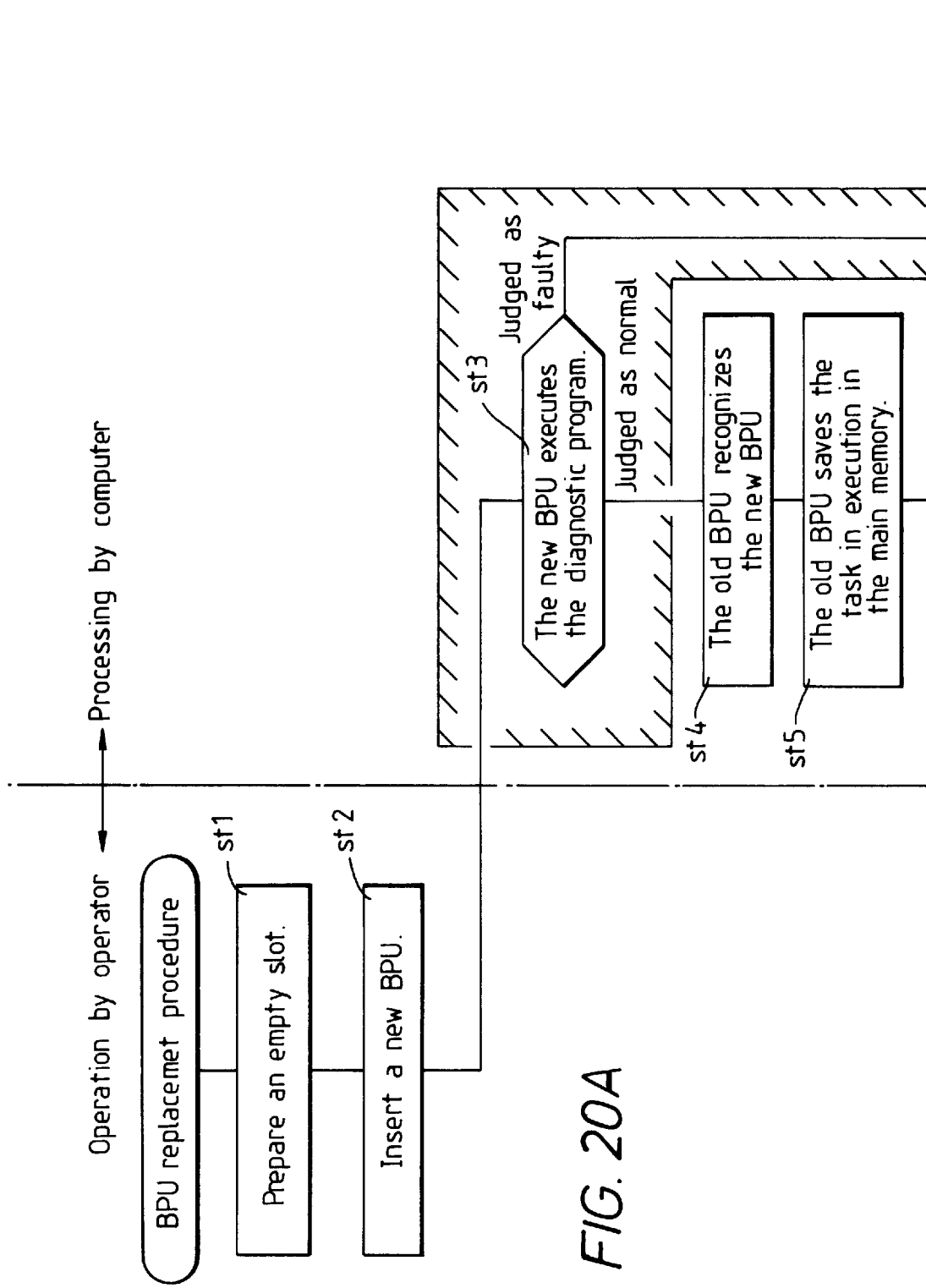
FIGS. 20A, B represent a flow chart of the process for BPU replacement when the inserted BPU is faulty.
Figure 20B:
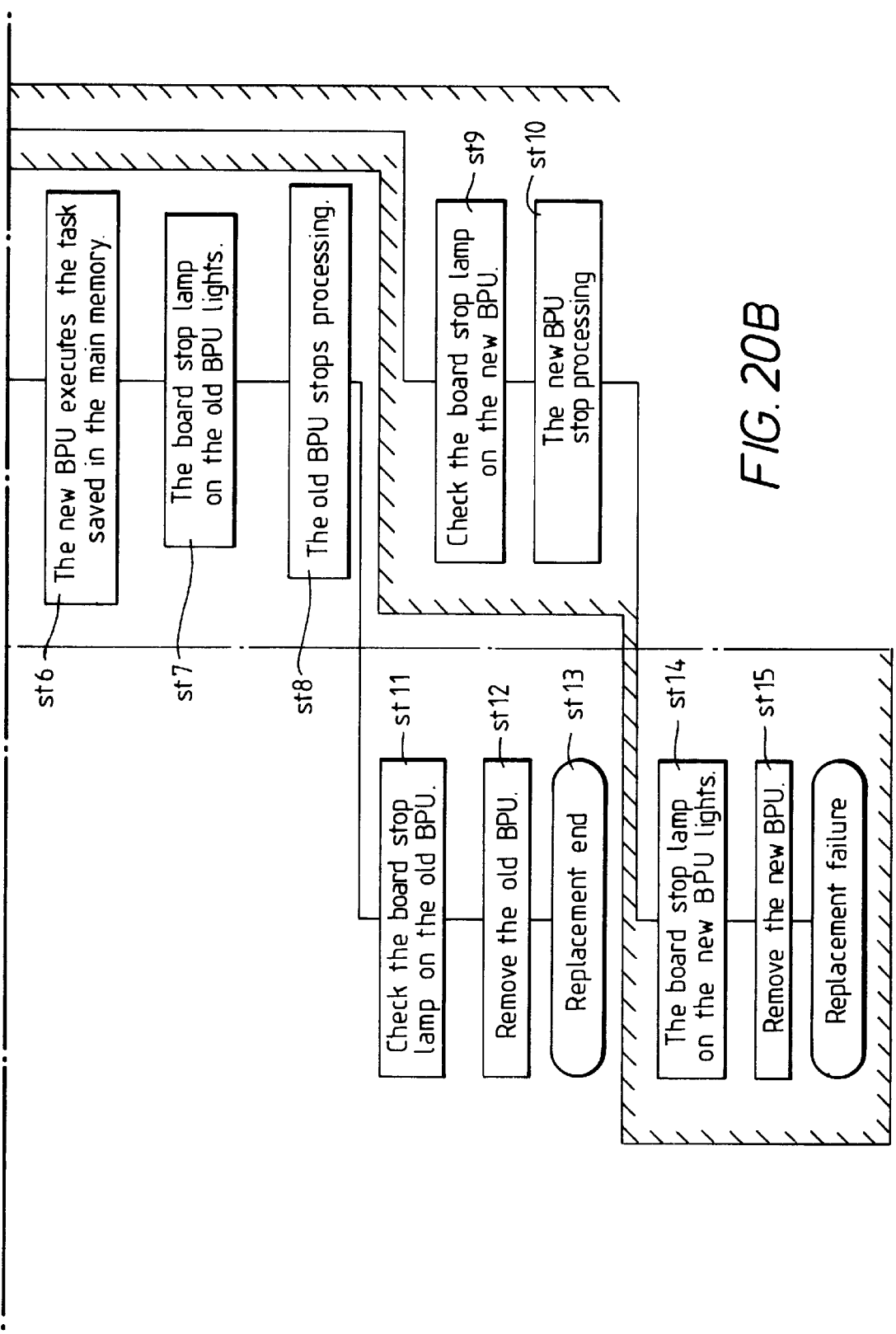

When a new BPU does not operate normally, the system is significantly affected. As shown in FIGS. 19 and 20, a means for checking the operation of an inserted BPU is provided. Therefor, even if a newly inserted BPU does not operate normally, the system will not be affected.

In FIG. 19, the new BPU2B is inserted and the old BPU2A executes a task. When the new BPU2B is inserted, a BPU self diagnostic program 925 is executed so as to check the operation of the new BPU. Information relating to board insertion is not sent to the old BPUA before the diagnostic program terminates normally. When an error is detected in the new BPU by the diagnostic program 925, the BPU2B does not send information to the old BPU, lights its own indicator lamp 280, and stops processing. The old BPU continues the processing of the task 1 without halting the task when the new BPU is inserted.

FIG. 20 is a flow chart of the BPU replacement procedures in this embodiment, indicating the processing operations of an operator and a computer. The processing at Step 1, Step 2, Steps 4 to 8, and Steps 11 to 13 is the same as that shown in FIG. 21 and the description thereof is omitted. The specific processing of this embodiment will now be described hereunder.

When the new BPU is inserted, the diagnostic program is executed to check the operation of the BPU (Step 3). When the BPU is judged as normal by the diagnostic program, the processing goes to Step 4 in the same way as with the previous embodiment. When the BPU is judged as faulty, the indicator lamp on the new BPU inserted lights (Step 9) and the processing of the new BPU is stopped (Step 10). Thereafter, the operator confirms that the indicator lamp on the new BPU is on (Step 14) and removes the new BPU once again (Step 15). As a result, although the BPU replacement fails, the old BPU continues the processing and the online system is not affected adversely. Whether the replacement succeeds or not can be determined whether it is by the indicator lamp of the new or old BPU which lights.

By the method of this embodiment, even when the inserted BPU does not operate normally, the online system does not suffer from disadvantageous effects (iv) Construction and processing before or after an error occurs/.

Figure 21:
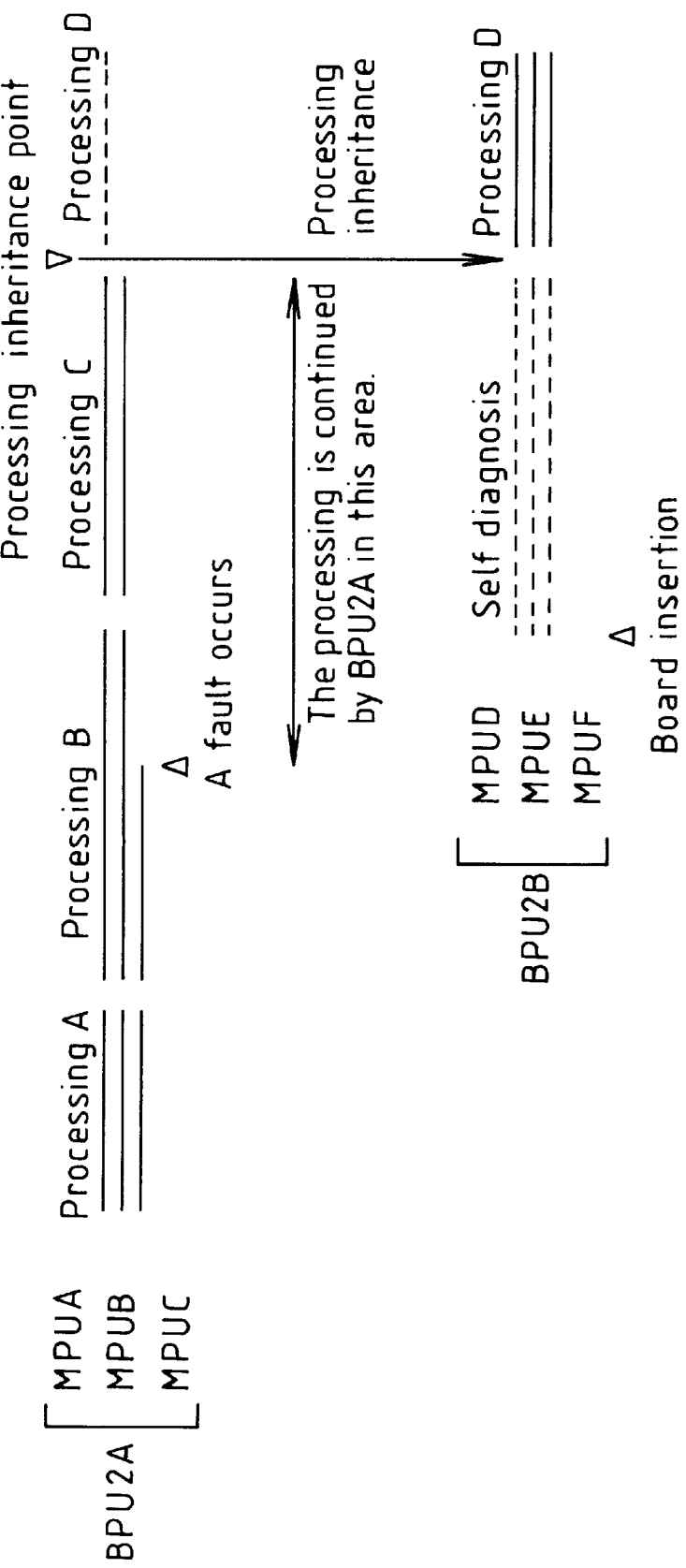
FIG. 21 shows the transfer of processing ("inheritance") when a BPU is faulty.

FIG. 21 shows the time series processing and construction of the MPUs for the old BPU2A and new BPU2B described above. During normal operation, the three MPUs of the BPU2A are in operation and the majority result is output. When a fault occurs in the MPUC during execution of the processing B, the MPUC is separated and the operation is continued normally with a multiple-circuit construction of the MPUA and MPUB. When the PC board of the new BPU2B is inserted into the empty slot on the basis of information corresponding to a MPUA error, each MPU of the new BPU2B executes a self diagnosis, transfers the processing from the old BPU2A to the new BPU2B at a proper time, and executes processing D according to the majority result of the three MPUs (MPUD, MPUE, and MPUF) of the BPU2B. By this processing inheritance, the operation of the BPU can be continued until a suitable place to break off, or a standard repair and maintenance time occurs, and the processing executed by the BPU can then be inherited by another normal BPU. Actually, the processing can be inherited to another BPU at whichever is the most desirable time for the performance according to the software. It is well known that a time corresponding to task changeover is most suitable. This is because the BPU can be changed by the same procedure as with a processor of a multi-processor system and unnecessary overhead for the performance due to processing inheritance can be reduced to zero. According to the present invention, therefore, the backup operation for check point restart when a fault occurs is not necessary and the processing performance can be improved.

When a fault occurs, the hardware records that a fault has occurred in the register and the operating system refers to the register when the context is switched or an interruption for repair and maintenance is executed, and when the processing is required to be inherited, informs the BPU where the processing is to be inherited by it at an interruption, and ends the processing by the BPU. When a fault occurs in one of the components of the BPU2 (MPU, cache memory, etc. ), even if the other components are normal, the operation of the entire BPU2, including the other (normal) components is stopped after the processing is inherited.

Figure 22:
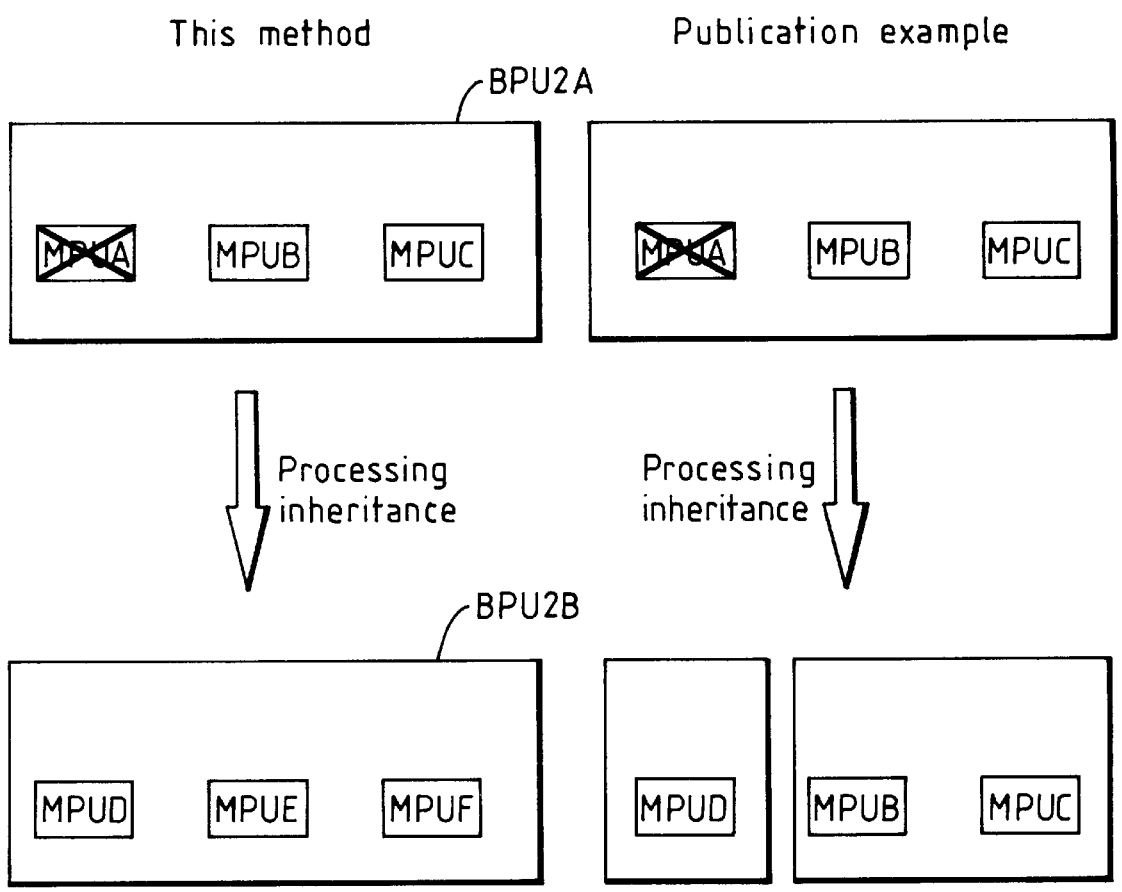
FIG. 22 shows an alternative transfer of processing ("inheritance") when a BPU is faulty.

FIG. 22 is a schematic view of differences in the construction between the method of the present invention and a conventional example for processing inheritance when the MPUA, MPUB, or MPUC, which is made redundant for fault tolerance, is damaged due to a fault. In the conventional method, only the MPUA which is damaged is replaced with the normal MPUD. In the method of the present invention, not only the damaged MPUA but also the normal MPUB and MPUC are replaced with the MPUD, MPUE, and MPUF. By doing this, the combination of the MPUS, that is, MPUA, MPUB, and MPUC, which are used to give redundancy for fault tolerance, can be fixed. Therefore, by using the combination of MPUs as a replacement unit, the MPUs constituting each combination can be combined at a high clock rate, and a high speed fault tolerant computer can be schieving. Furthermore, various types of hardware and software, which are required for conventional recombination of MPUs, are not necessary.

When there is an error in a BPU, the operation can be continued. Therefore, there is no need to inherit the processing immediately after the error occurs but the processing can be inherited when suitable time to break off operation occurs, or at a standard repair and maintenance time.

With the processing continued as shown in this embodiment, it is possible to remove the PC board of the faulty BPU20-1 and replace it with a normal PC board.

VII. Alternative plan and modification example for each circuit

Each circuit of the present invention may be changed. Next, alternative plans and modifications will be described.

(i) Majority logic section

Figure 23:
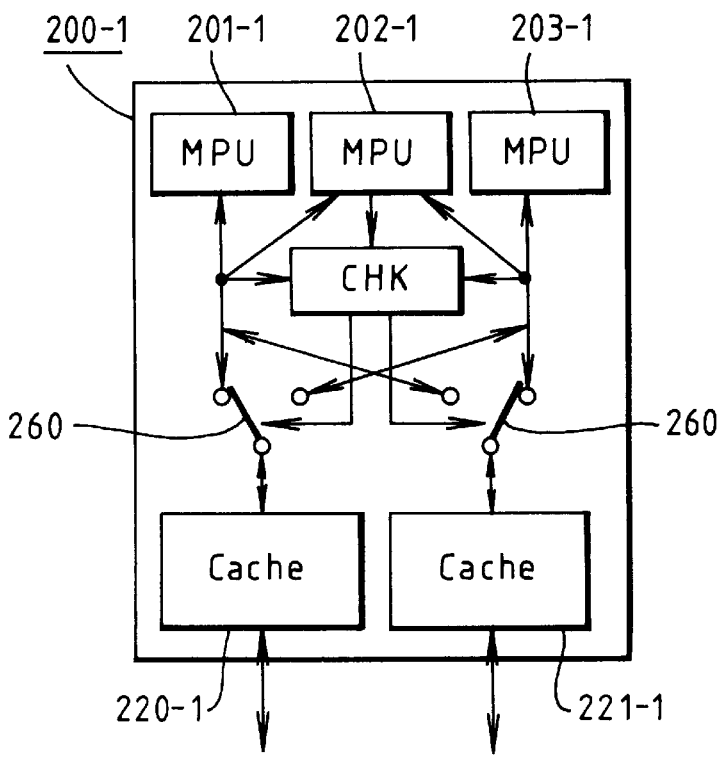
FIGS. 23 shows an embodiment of 3-MPU comparison and check.

FIG. 23 shows the combination and changeover condition of the majority logic circuit shown in FIG. 2 which is simplified for easy understanding by omitting other components. In the example, the MPUA and MPUC are fixed only for output, the MPUB is used as a reference unit for checking the correctness of the MPUA and MPUC, and when an error occurs in the MPUA or MPUC, the output of the correct one is used in common so as to be supplied to two cache memories. In this method, the MPU output is supplied directly to the cache memories without passing through the majority circuit and the cache memory access time can be shortened by the delay time of the majority circuit.

Figure 25:
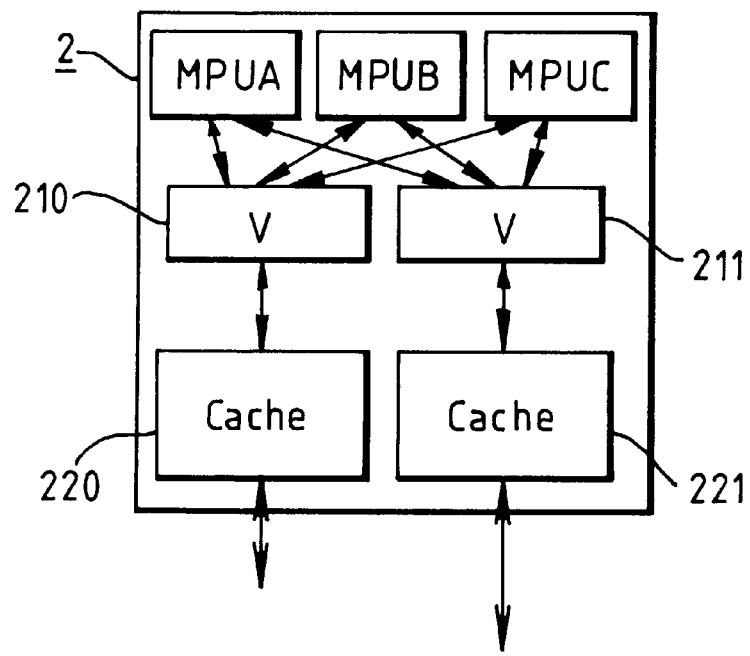
FIG. 25 shows another embodiment corresponding to the majority method.

In the present invention, a triple system is changed to a dual system using the majority logic so as to continue operation as described above. Various modified systems may be used. In FIG. 25, for example, outputs of three MPUs are supplied to majority selection circuits 210 and 211 and the output of one MPU which is confirmed to be correct is selected. In this case, the data of the cache memory connected to a faulty majority selection circuit is destroyed. However, the data of the cache memory connected to the normal majority selection circuit can be used to continue the operation.

Figure 24:
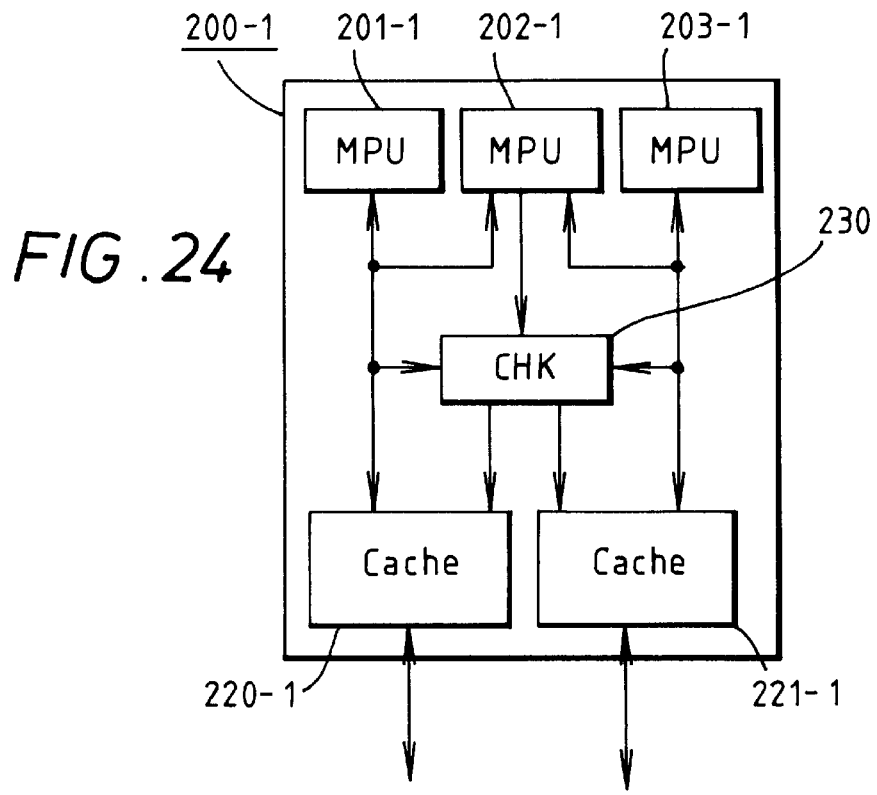
FIG. 24 shows another embodiment of 3-MPU comparison and check.

As shown in FIG. 24, when the output of each MPU is supplied directly to the cache memory without passing through the gate circuit and the changeover circuit, the operation of the cache memory receiving a signal from the faulty MPU is stopped, and the data is not used any longer, the cache memory access time can be shortened furthermore by the delay time of the gate circuit and the changeover circuit. Moreover, the changeover means for the address and data buses comprising many signal conductors is not required and the amount of hardware can be reduced.

Figure 26:
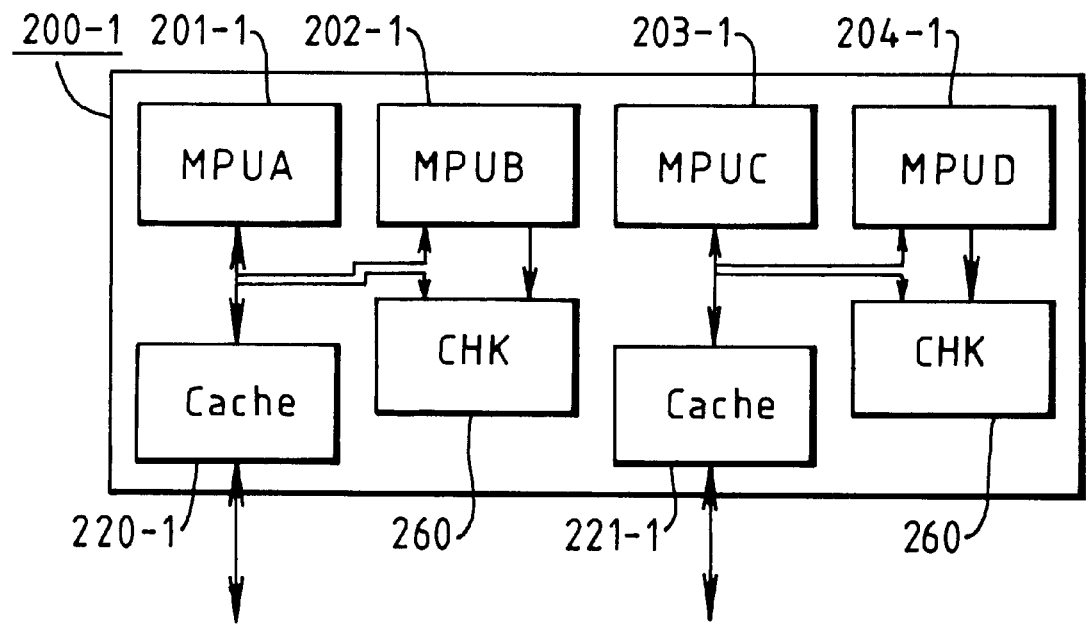
FIG. 26 shows an embodiment of 4-MPU comparison and check.

In FIG. 26, four MPUs are installed, the MPUA and MPUC are fixed only for output, the MPUB and MPUD are used as reference units, and when two outputs match with each other, the outputs of the output MPUs are provided. When an error occurs in one of the MPUS, a correct unit may be used instead or the cache memory receiving a signal from the faulty MPU may be stopped and the data may not be used any longer.

(ii) Cache data read access section

Figure 27:
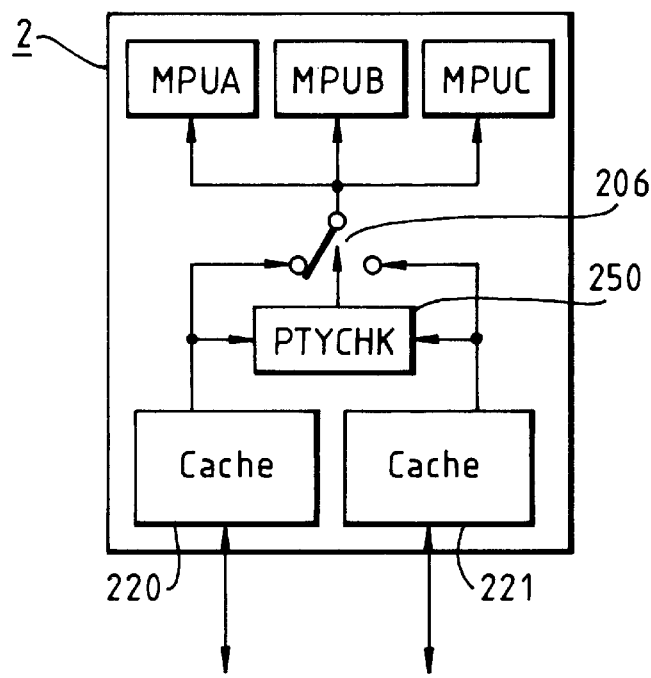
FIG. 27 illustrates cache data read access.

Outputs (data) of the cache memories 220 and 221 can be judged as normal or abnormal by parity check. As shown in FIG. 27, the output of the cache memory which is determined to be normal by the parity check circuit 250 is supplied to the MPUA, MPUB, and MPUC via the changeover means 260. When both cache memories are normal, by predetermining which one is a main memory or a slave memory, the output of the main memory can be selected. This cache memory operation will be discussed later.

Figure 28:
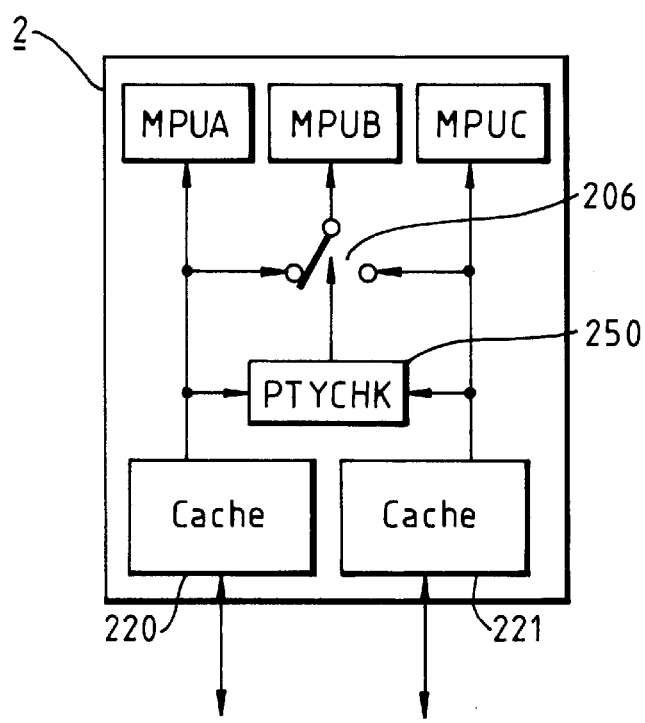
FIG. 28 illustrates another alternative for cache data read access.

As shown in FIG. 28, the cache memories to which the MPUA and MPUB are connected may be fixed such as 220 and 221 and the output of the selected cache memory may be supplied only to the MPUB. In this case, when one of the cache memories is faulty, two of the three MPUs can be operated normally and the amount of hardware can be reduced.

Thus, all the above embodiments of the present invention are concerned with overcoming faults in one or more of the processing units (MUA) of the computer system, and to the exchange of processing boards to exchange a plurality of individual processors.

It should be noted that although the above description has referred to basic processing units (boards) (BPU's) carrying three processors (MPU's), the present invention is also applicable to arrangements with more than three processors. Where there are three or four processors, it is possible to detect only when any one of those processors is faulty. However, if 5 or more processors are provided, it is possible to detect when any two processors are faulty. However, since it is unlikely that two processors will fail simultaneously, it is not normally necessary to provide redundancy at such a high level.

B) Clock Redundancy

Having described redundancy among the processors and processing units, it is next necessary to consider embodiments in which errors in the clock unit which controls the processors may be overcome by redundancy, to prevent errors.

Figure 29:
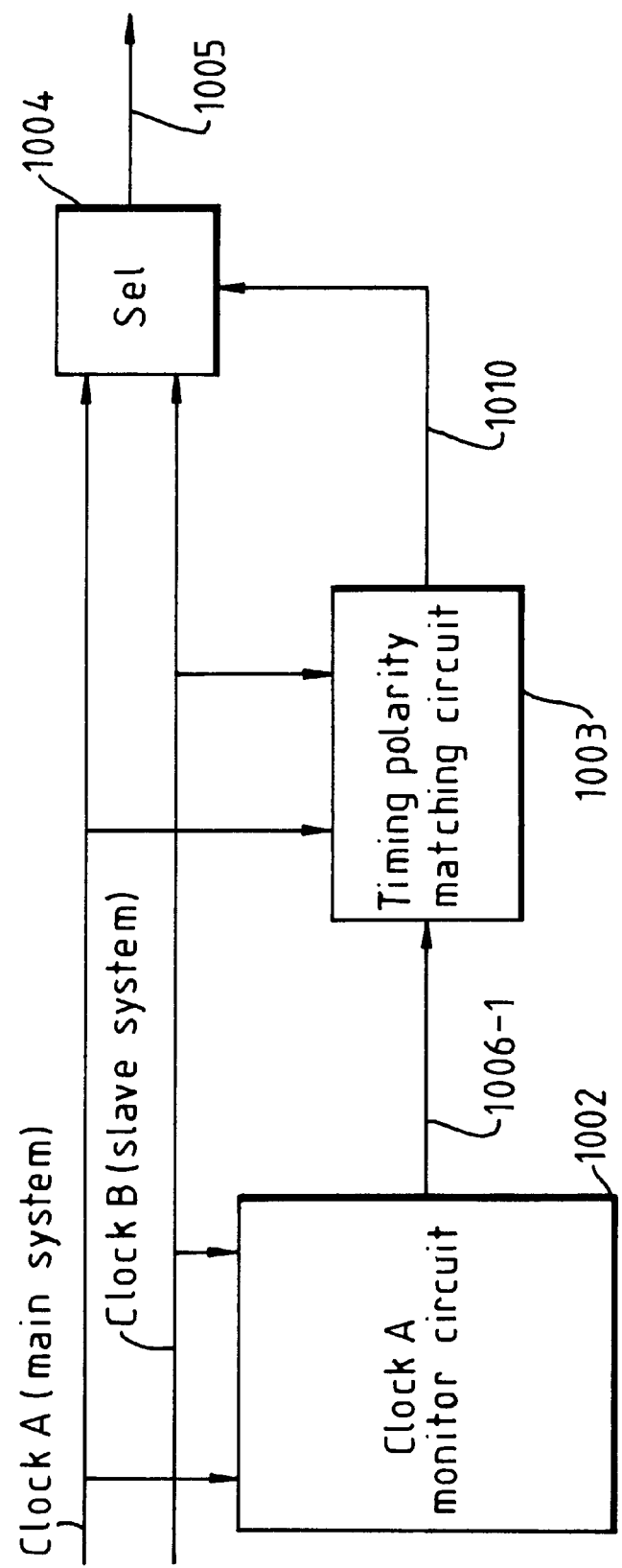
FIG. 29 shows the construction of a clock switching circuit of another embodiment of the present invention.

FIG. 29 is a schematic view of a clock switching circuit 1004 of an embodiment of the aspect of the present invention. Two independent clocks A and B are connected to the switching circuit.

When clock A stops, a clock A monitor circuit 1002 outputs a clock A stop detection signal 1006-1.

The clock A monitor circuit 1002 monitors the clock interval of the clock A by counting using the clock pulses of clock B. When the time that the clock pulse of clock A is high or low is longer than the duration of clock pulse of clock B, the clock A monitor circuit 1002 assumes that the clock A of the main system has stopped and outputs the clock A stop detection signal 1006-1.

The clock A stop detection signal 1006-1 is fed to a timing polarity matching circuit 1003. The timing polarity matching circuit 1003 waits until the polarity of the pulses of clock B match the polarity of the pulse of the stopped clock A, and outputs a switching signal 1010 to a selector (Sel) 1004 at the time when the polarity of clock B first matches the polarity of the stopped clock A after the clock A stop detection signal 1006-1 is output. The selector 1004 switches its output from the pulses of clock A to those of clock B.

Figure 31:
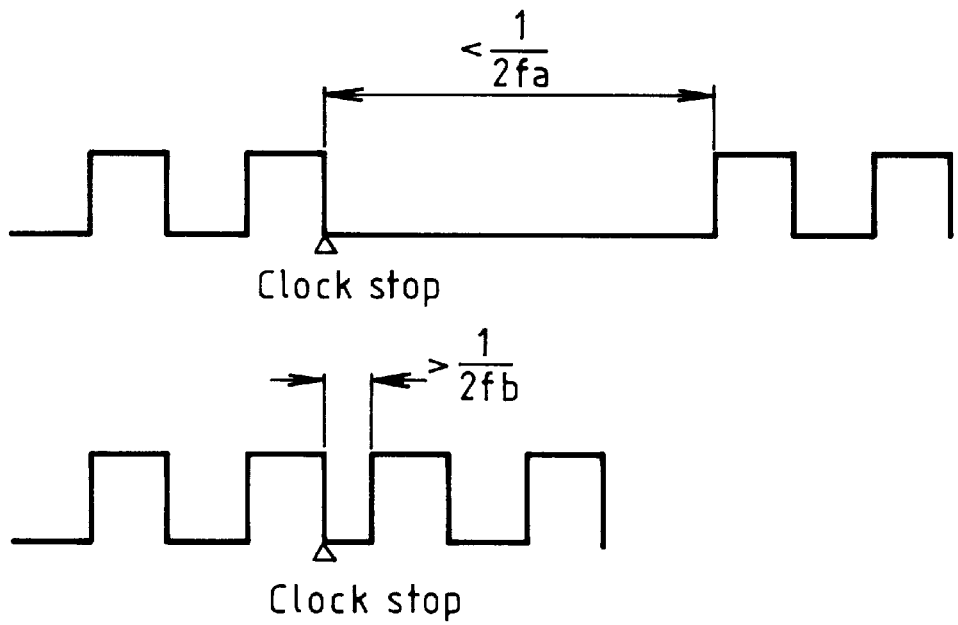
FIG. 31 shows the timing of pulses in a clock switching circuit of an embodiment of the present invention.

In this embodiment, after clock A stops, the timing polarity matching circuit 1003 waits until the polarity of the pulses of clock B match the polarity of the pulse of the stopped clock A, and switches the output 1005 from clock A to clock B at the first instant which the polarity of the pulses of clock B matches the polarity of the pulse of stopped clock A after the clock A stop detection signal 1006-1 is output. Therefore, the clock can be switched without a bridge under the conditions shown in FIG. 31. FIG. 31 shows clock switching conditions. Accordingly, even if clock A has stopped, the MPU which is operating by using the clock can continue normal operation.

Figure 30:
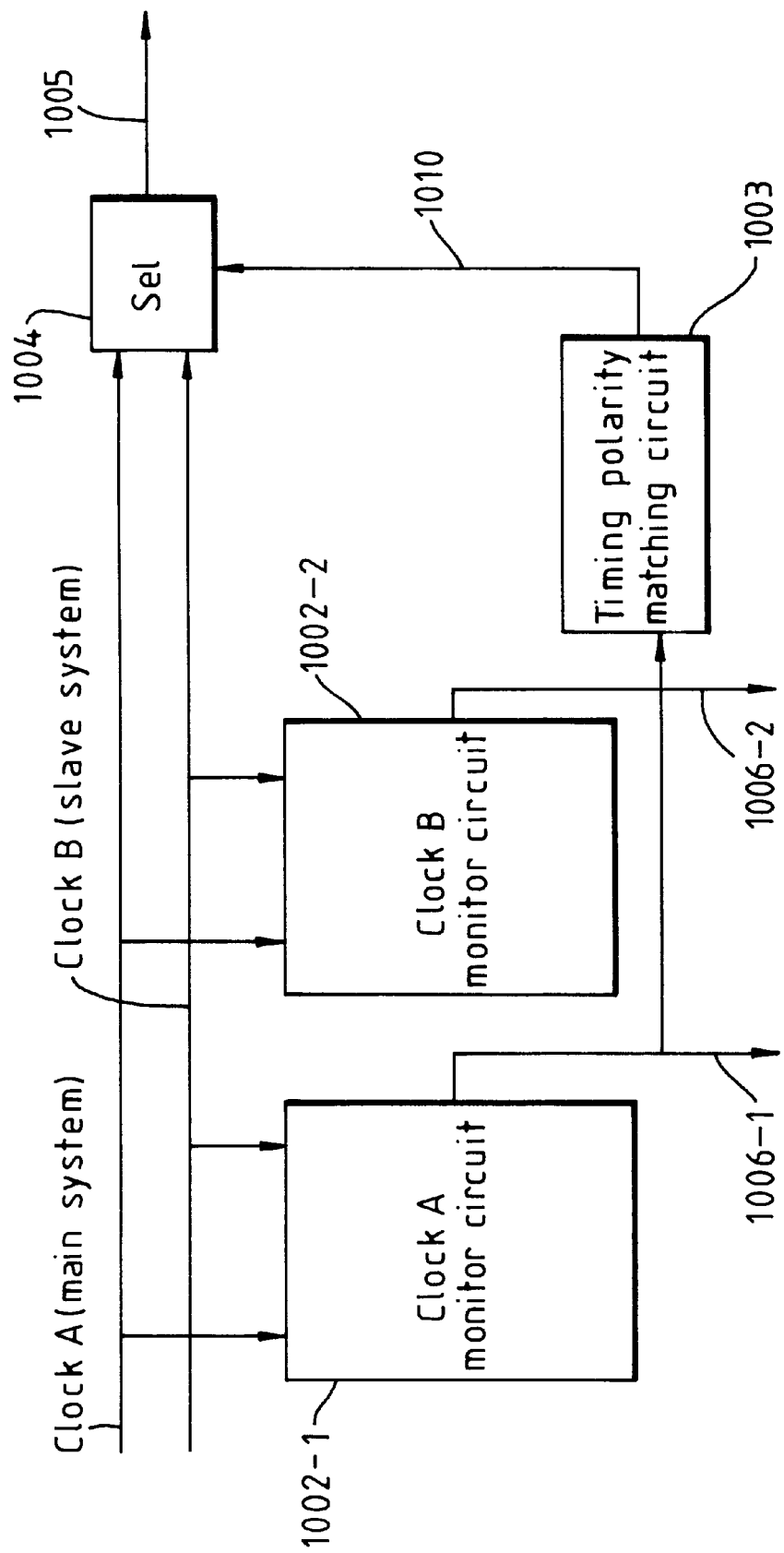
FIG. 30 shows the construction of another clock switching circuit of an embodiment of the present invention.

FIG. 30 shows an embodiment wherein a clock A monitor circuit 1002-2 which is a monitor function for the clock B is added to the embodiment shown in FIG. 29. Since the clocks A and B are always monitored in this embodiment, when either one of the clocks stops, the stopped clock can be repaired in good time before the other clock stops.

An element which operates in exact timing with the clock of a MPU requires fixed conditions for the clock to be supplied the speed of operation of the element is limited by the operation delay time of the element. Therefore, the clock frequency has an upper limit. This is called a maximum clock frequency fa.

In order to reduce the size by decreasing the number of transistors forming the element, a dynamic circuit for storing data using the charge accumulated in the stray capacity is often used in the memory. In this case, the lower limit of the clock frequency is determined by the time required for the accumulated charge to be discharged. This is called a minimum clock frequency fb.

It is usual to set the clock duty cycle at 50%. Because of this, it is desirable, as shown in FIG. 31, for the time that the clock signal level is kept high or low, whichever longer, to be shorter than ½fa and whichever time is shorter to be longer then ½fa. In this case, it is not always required that the duty cycle be 50%. A duty cycle of 50% is required only for achieving the maximum processing performance at the maximum frequency. The moment the clock is switched due to a fault in the oscillation circuit, as in this embodiment of the present invention, the duty cycle is not required always to be 50% always but should be such that the resultant degradation in processing performance can be ignored. The maximum clock frequency fa is generally several tens of times the minimum clock frequency fb.

The clock is switched under the conditions shown in FIG. 31 in this embodiment of the present invention. Accordingly, even if one clock A stops, an MPU making use of the clocks A and B can continue the normal operation.

Figure 32:
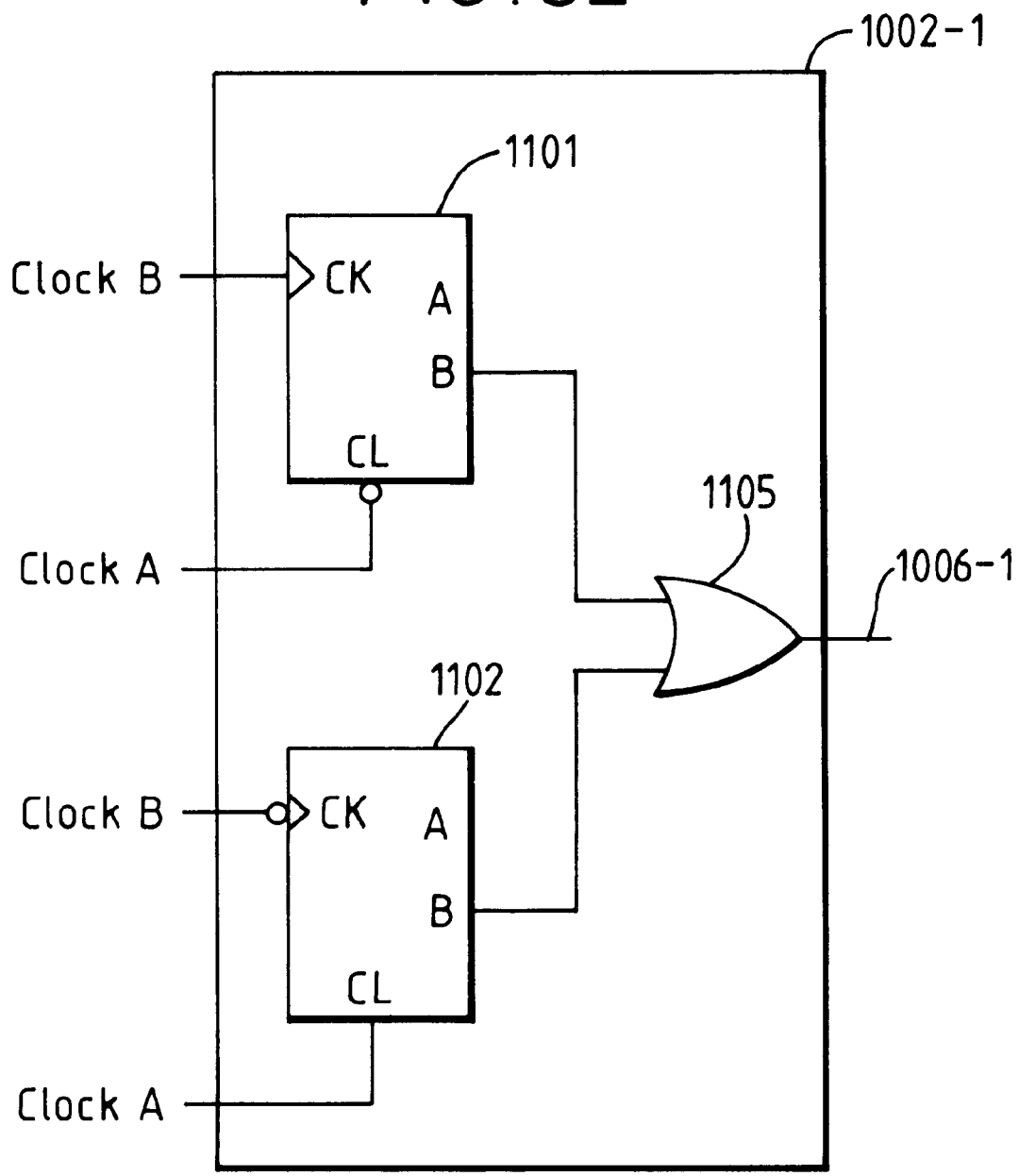
FIG. 32 shows a clock A monitor circuit.
Figure 33:
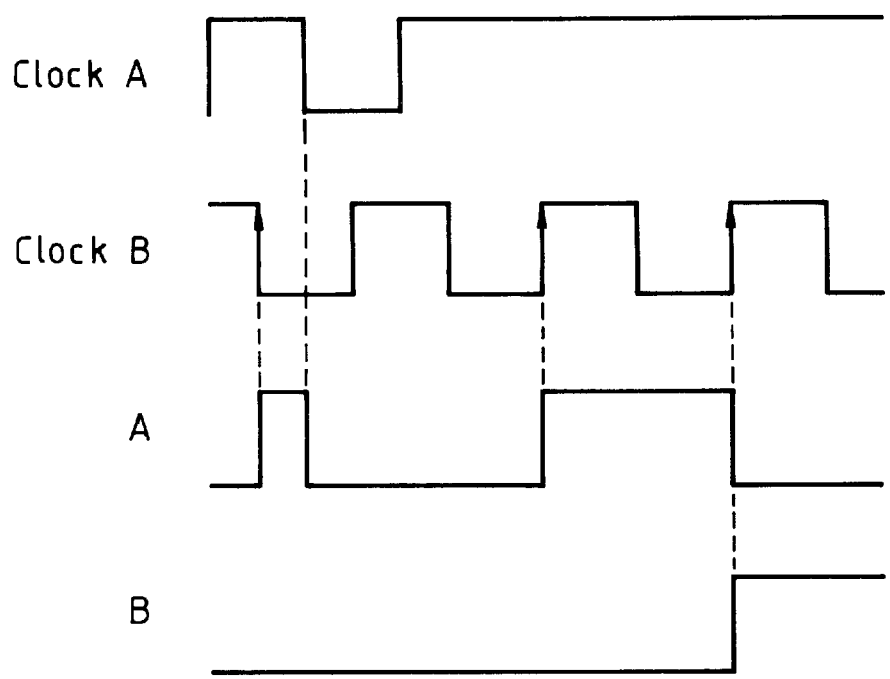
FIG. 33 shows the operation of a binary counter 101.

FIG. 32 shows an embodiment of the clock A monitor circuit 1002-1. As shown in FIG. 32, the pulses from clock B are fed to a clock terminal CK of a binary counter 101 and the pulses from clock A are inverted and fed to a clear terminal CL. When the time that a pulse of the clock A is high is longer than one clock pulse of clock B in this circuit as shown in FIG. 33, the output of a terminal B which is a coefficient output of the twos place goes high immediately the polarity of the pulses of clock B match the polarity of the pulse of clock A. When the pulses of clocks A and B with inverted polarity are fed (the pulses of clock B are inverted and fed to a clock terminal CK of a binary counter (102 and the pulses of clock A are fed to a clear terminal CL) and the time that a pulse of clock A is low is longer than one clock pulse of clock B, the output of terminal B which is a coefficient output of the twos place goes high when the polarity of the pulse of clock B matches the polarity of the pulse of clock A. Therefore, when the two circuits are ORed and the time when a pulse of clock A is high or low is longer than one pulse of clock B, this corresponds to the stoppage of clock A, and the clock A stop detection signal 6-1 can be outputted immediately the polarity of the pulse of clock B matches the polarity of the pulse of clock A. In this embodiment, therefore, the timing polarity matching circuit 1003 shown in FIG. 29 is not necessary, the circuit is simplified, and the delay time from clock stop detection to clock switching can be shortened.

Figure 34:
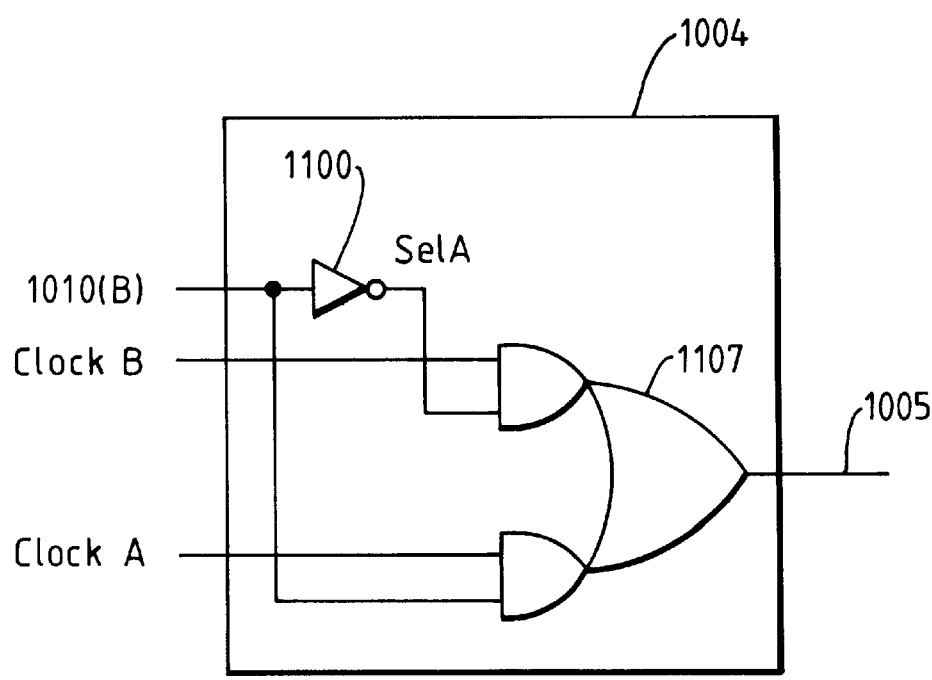
FIG. 34 shows the construction of a selector circuit.

FIG. 34 shows an example of the selector 1004 for switching the clocks. As shown in FIG. 34, the clocks A and B and a signal 1010B for switching to the clock B are supplied to an AND-OR gate 1107 for switching. The output of the AND-OR gate 1107 is the output 1005 of the switching circuit.

If the clock signal request conditions shown in FIG. 31 are not taken into account and an attempt is made to hold the duty cycle at 50% which is a recommended value, a majority method is used instead of the switching method of the above embodiment, causing the problems. In this aspect of the present invention attempts, it is proposed that two clocks which operate independently are switched under the above conditions. The clock pulse interval of one clock A (the main system) is monitored by counting using the clock pulse of the other clock B (the slave system), and when the time that the clock pulse of the main system is high or low is longer than the duration of the clock pulse of the slave system, it is assumed that the clock of the main system has stopped, and the stoppage of the clock of the main system can thus be detected.

One possible reason for the clock pulse width being narrower than ½fa when the clock is switched is a variation in the clock switching timing Assume that the clock A stops at a high level. If clock A is switched to clock B when the clock B is low, the time that the clock B is kept high immediately after switching is not sufficiently long as shown in and may be shorter than ½fa. When the clock A is switched to the clock B when the clock B is low, the pulse width will not be narrower than ½fa.

Another reason for the clock pulse width being narrower than ½fa when the clock is switched is a delay of a select signal of a selector. If the clock A is disabled due to a delay of an invertor and then the clock B is enabled, then the output is bridged by the delay time width of the invertor. Therefore, when a circuit clock B is disabled and then the clock A is enabled is used, the clock can be switched unless the pulse width is narrower than ½fa.

When the clock is switched within several clock pulses, the clock can be switched unless the pulse width is wider than ½fb.

In this aspect of the present invention, as described above, the clock is switched in dependence on the relationship of to the clock phase. Therefore, there is no need to match the phases of both clocks with each other and two clocks which are fully independent can be provided. As a result, a fault tolerant clock can be provided which does not require a complicated circuit and does not have the problem of phase control between a plurality of clock oscillation circuits.

In the embodiment described above, in particular, the signal 1010B is reversed by an invertor, and the clock B is disabled (SelB is asserted) and then the clock A is enabled (SelA is negated). Accordingly, no bridge is generated during switching and the clock can be switched unless the pulse width is narrower than ½fa.

Figure 35:
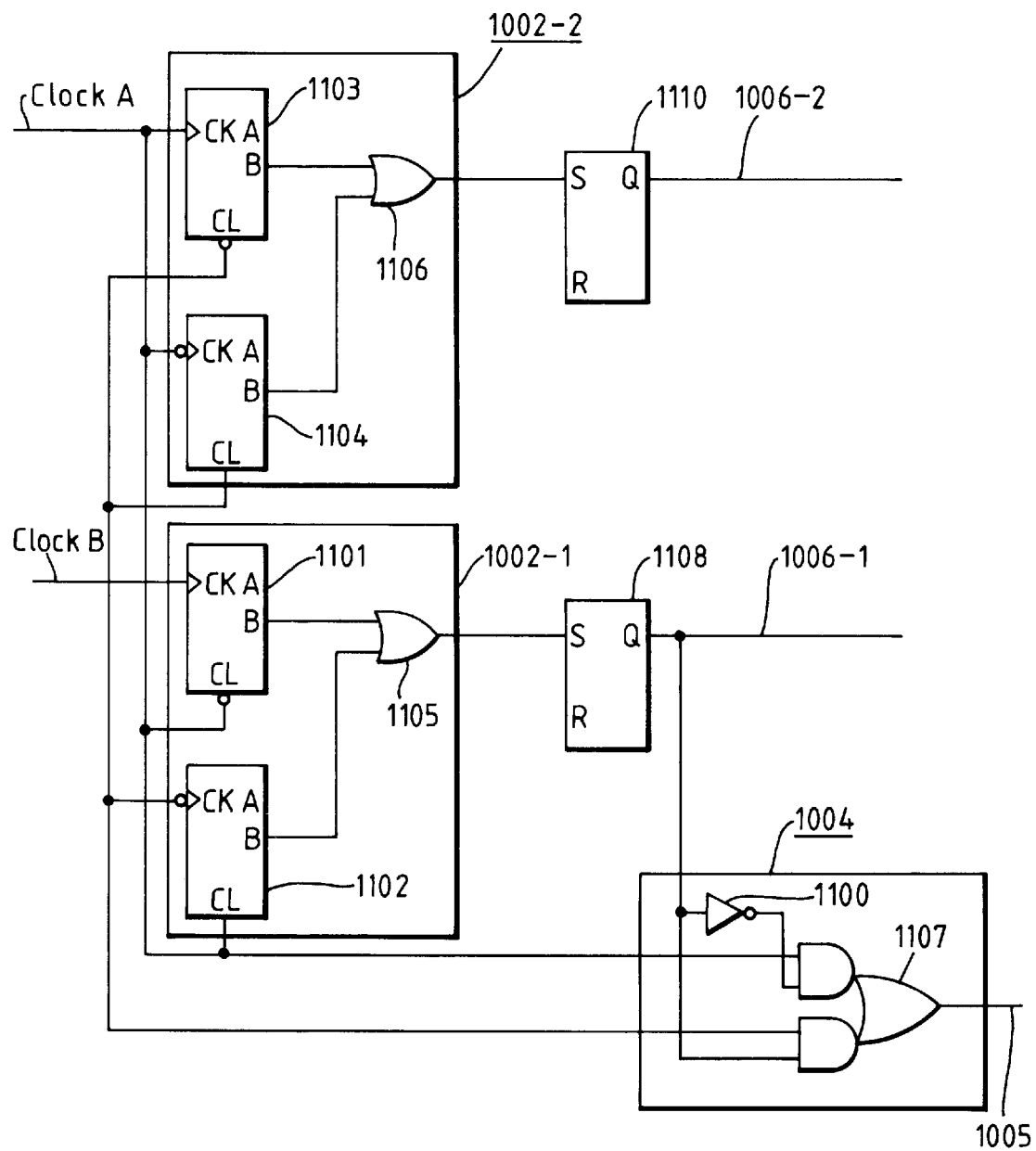
FIG. 35 shows a further example of a clock switching circuit.

FIG. 35 shows another embodiment of this aspect of the present invention. Binary counters 1101 and 1102 and a logical sum unit 105 form a clock A monitor circuit 1002-1 as shown in FIG. 32, and binary counters 1103 and 1104 and a logic sum unit 1106 form a clock B monitor circuit 2-2. When the clock A stops, the output of the logic sum unit 1105 goes high immediately the polarity of a pulse of clock B matches the polarity of a pulse of clock A. This signal is held by a RS flip-flop 1108, and the clock is switched by the selector 1004 as a clock A stop detection signal 1006-1.

When clock B is stops, the information is held by a RS flip-flop 110.

When clock A stops in this system, the clock can be switched under the conditions shown in FIG. 3 and the electronic circuit of MPUs whereto the clock is supplied by the clock switching circuit of the present invention can be operated continuously.

Figure 36:
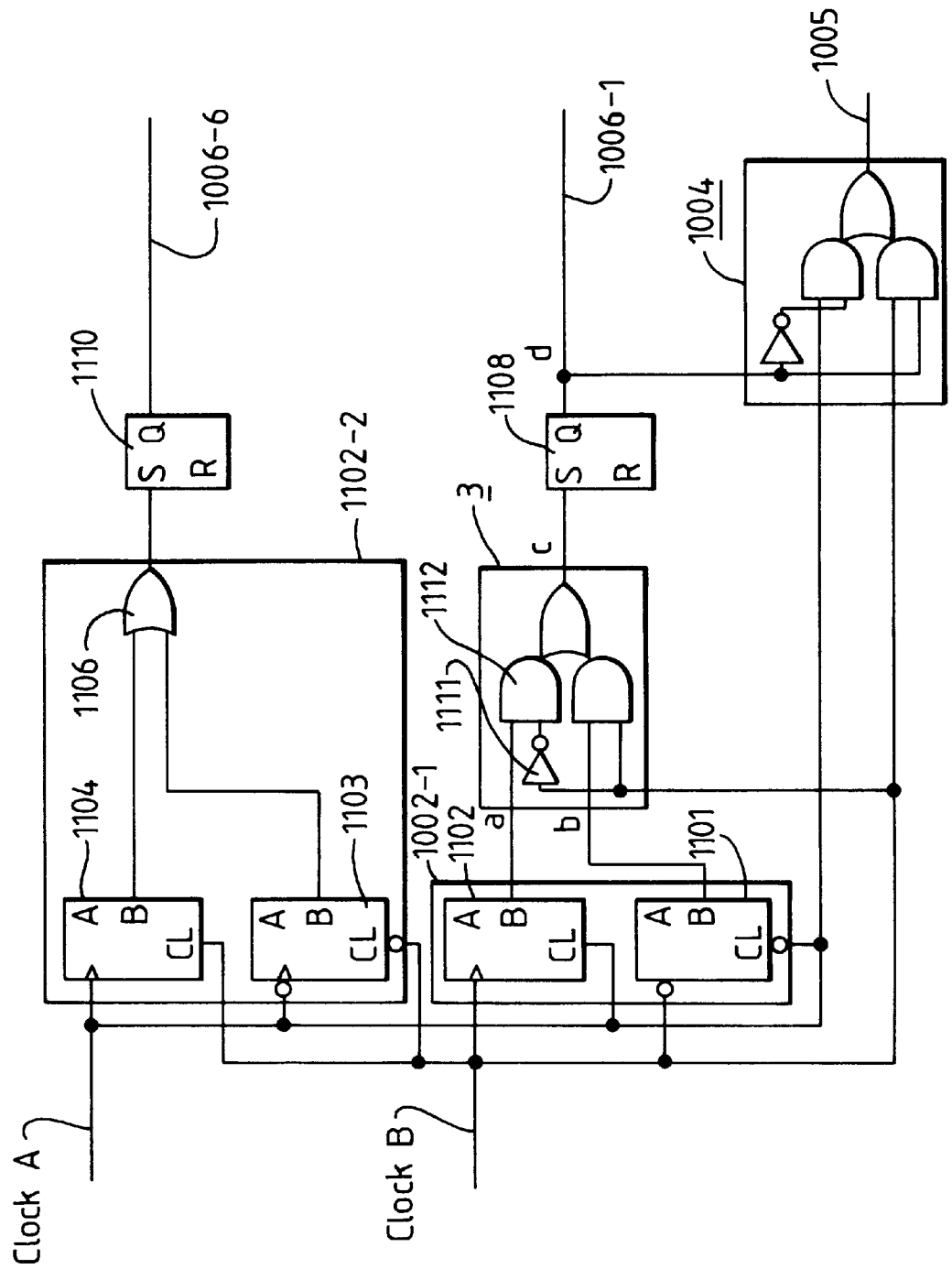
FIG. 36 shows yet another example of a clock switching circuit.

FIG. 36 shows a further embodiment of the clock switching circuit when the clock frequency is high. When the clock frequency is sufficiently low compared with the operation speed of the circuit, the clock can be switched on the basis of the clock A stop detection signal 1006-1 by using a method in which the clock A stop detection signal 1006-1 is outputted immediately the polarity of a pulse of clock B matches the polarity of the clock A as shown in FIG. 35. However, when the clock frequency is high and the clock pulses are switched when the clock A stop detection signal 1006-1 is output, the polarity of the pulses of clock B may not match the polarity of the pulses clock A due to the operation speed of the circuit. This is particularly likely if binary counters 1101, 1102, 1103, and 1104 comprise two-stage D flip-flops and the delay times are longer than that of other elements. In the embodiment shown in FIG. 36, therefore, the output terminals B of the binary counters 1101 and 1102 go high immediately the polarity of the pulses of clock B are opposite to the polarity of the pulse of clock A. Next, a timing polarity matching circuit 1003 comprising an invertor 1111 and an AND-OR gate 1112 outputs a switching signal to a selector 1004 via a RS flip-flop 108 the moment the polarity of the pulse of clock B matches the polarity of the pulse of clock A.

Figure 37:
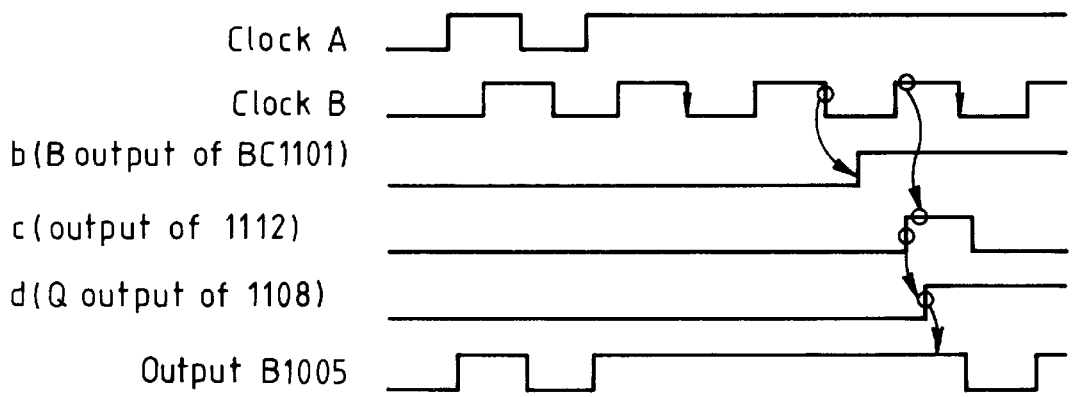
FIG. 37 is a time chart.

FIG. 37 shows a time chart when clock A stops with a pulse at a high level in this embodiment, and FIG. 31 shows a time chart when the clock A stops with the pulse at the low level.

According to this arrangement, a clock signal can be requested at a high clock frequency without stopping, and MPU elements or other electronic equipment using this clock can be operated without stopping. Even if a clock oscillation circuit fails, the entire system reliability can be improved because MPU elements or other electronic equipment can be operated without stopping.

Figure 38:
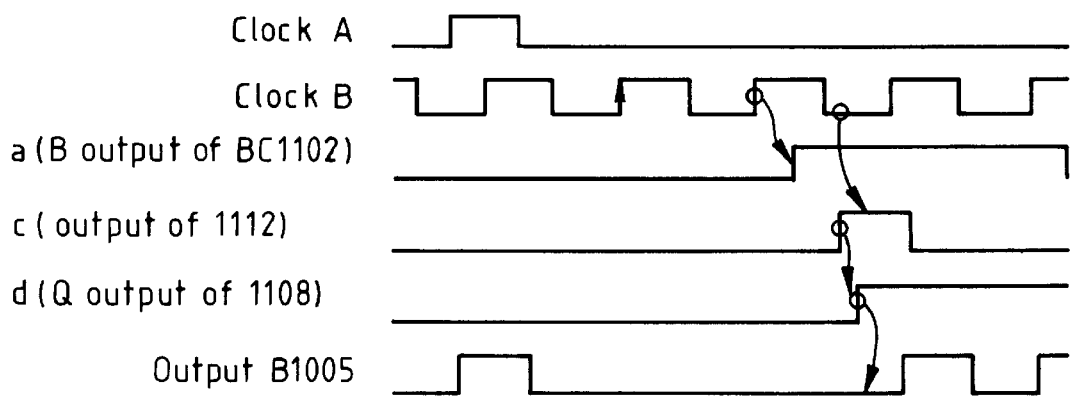
FIG. 38 is a further time chart.
Figure 39:
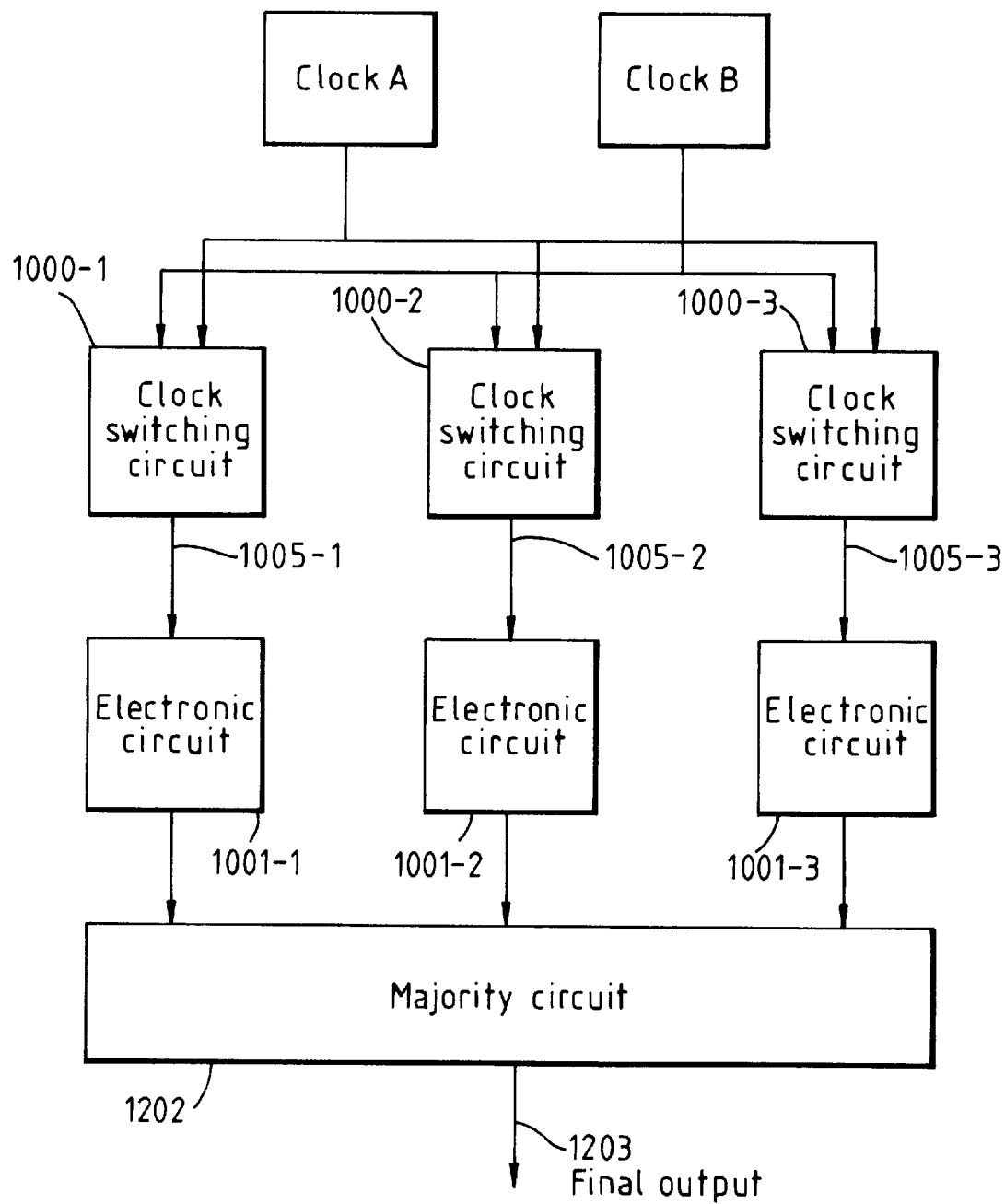
FIG. 39 shows an example to a fault tolerant computer system of the application of embodiments of the present invention.

FIG. 38 shows another embodiment of a fault tolerant computer making use of this aspect of the present invention. Clocks A and B are connected to clock switching circuits 1000-1, 1000-2, and 1000-3. Outputs 1005-1, 1005-2, and 1005-3 of the clock switching circuits are supplied to electronic circuits 1001-1, 1001-2, and 1001-3 as clocks. Outputs of the electronic circuits 1001-1, 1001-2, and 1001-3 are decided by majority by a majority circuit 1202 as a final output 1203. The electronic circuits 1001-1, 1001-2, and 1001-3 have the same function, and when one of them cannot output the normal signal due to a fault, a normal output of the electronic circuits 1001-1, 1001-2, and 1001-3 is sent to the final output 1203 on the basis of a majority decision. Even when one of the electronic circuits 1001-1, 1001-2, and 1001-3 fails, the system as a whole can carry out normal operation. When the clock A stops due to a fault, the clock pulses are switched to the clock of the normal clock B by the clock switching circuits 1000-1, 1000-2, and 1000-3, and the electronic circuits 1001-1, 1001-2, and 1001-3 can continue normal operation. It is assumed that only one of the clock switching circuits 1000-1, 1000-2, and 1000-3 fails. When the clock switching circuit 1000-1 fails, for example, the electronic circuit 1001-1 to which clock pulses are supplied from the clock switching circuit 1000-1 stops operation and cannot output a normal output. However, the electronic circuits 1001-2 and 1001-3 are normal and a normal output can be obtained as a final output 1003. According to this embodiment, when not only one of the electronic circuits 1001-1, 1001-2, and 1001-3 but also the clock A or B, or one of the clock switching circuits 1000-1, 1000-2, and 1000-3 fails, a system which can continue the operation, that is, a so-called fault tolerant system can be constructed.

It can thus be seen that the use of two clocks, as in the embodiments of FIGS. 29 to 39 is readily applicable to a computer search as that of the embodiments of FIGS. 1 to 28. Thus, for example the clock unit 1000 in FIG. 2 may be provided with two (or more) clock units operating as has been described with reference to FIGS. 29 to 39. Further embodiments of the present invention corresponding to the idea of combining redundant processors and processing unit with redundant clocks will now be described. However, it should be appreciated that the use of more than one clock is not restricted to embodiments using multiple processors and/or multiple processing units, but may be applied to other computer systems where protection against clock error is desirable.

Figure 40:
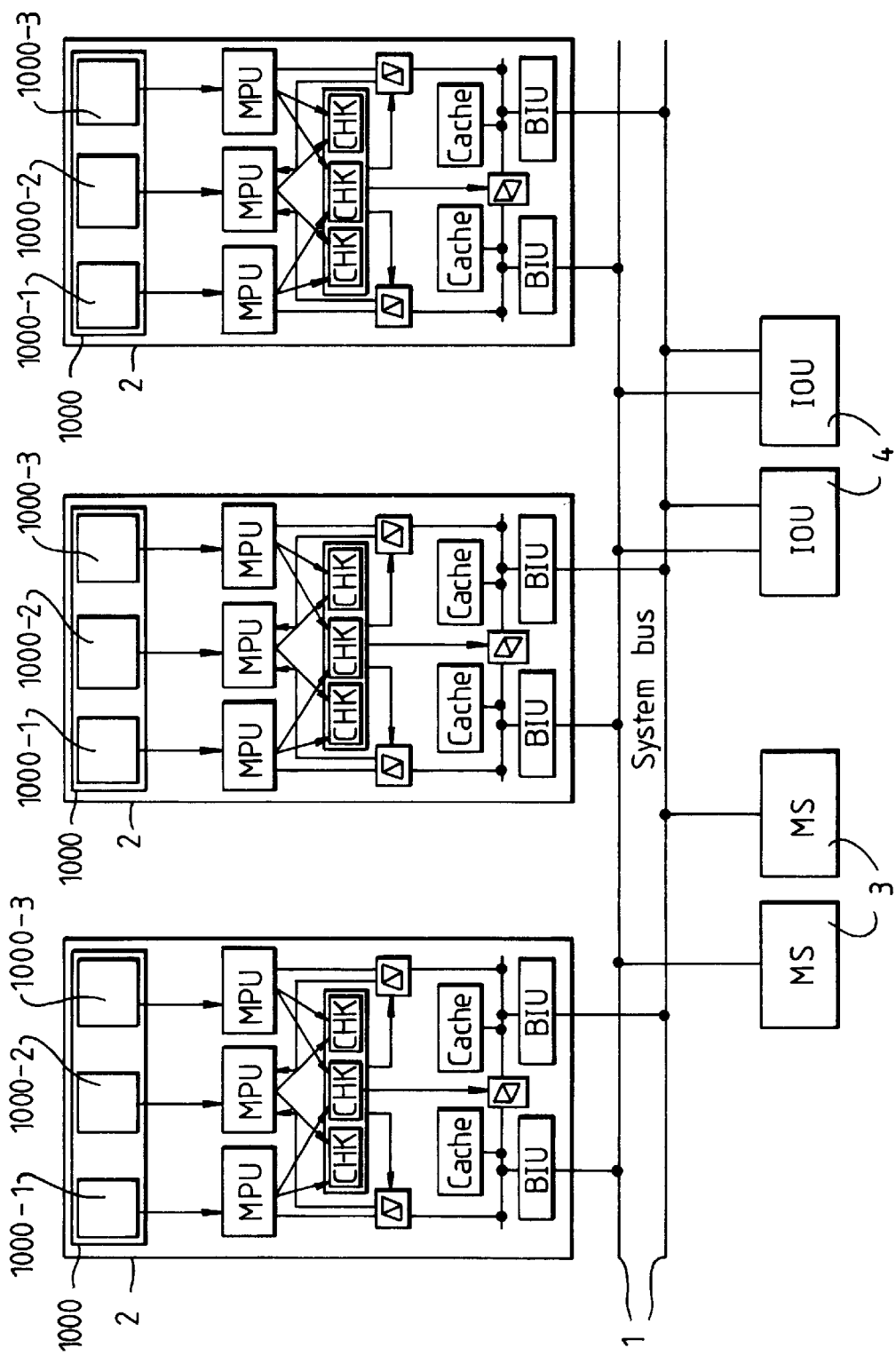
FIG. 40 shows a further example related to the embodiments of FIGS. 1 and 2.

FIG. 40 shows an embodiment when the present invention is applied to a fault tolerant computer system such as that of the embodiments of FIGS. 1 to 28. It can be noted that the embodiment of FIG. 40 is generally similar to that of FIGS. 1 and 2. However some details of the embodiment of FIG. 2 have been omitted for the sake of clarity. The clock unit 1000 of FIG. 2 will be discussed in more detail. Clock pulses are supplied to each of MPUs constituting BPU2 (basic processing unit) from clock switching circuits 1000-1, 1000-2, and 1000-3 of the present invention. The clocks A and B (not shown in the drawing but present on the clock unit 1000) have their pulses fed to each of the clock switching circuits 1000-1, 1000-2, and 1000-3. Each of the MPUs constituting BPU2 has a dual clock and a clock switching circuit for each BPU in the same way as for BPU2 and these are again omitted from the drawing for clarity. In such an arrangement, system components including the clocks, the MPUS, cache memories, bus interface units BIU, a main storage MS, and input/output units IOU are multiplexed, and when one of them fails, normal operation can continue.

Figure 41:
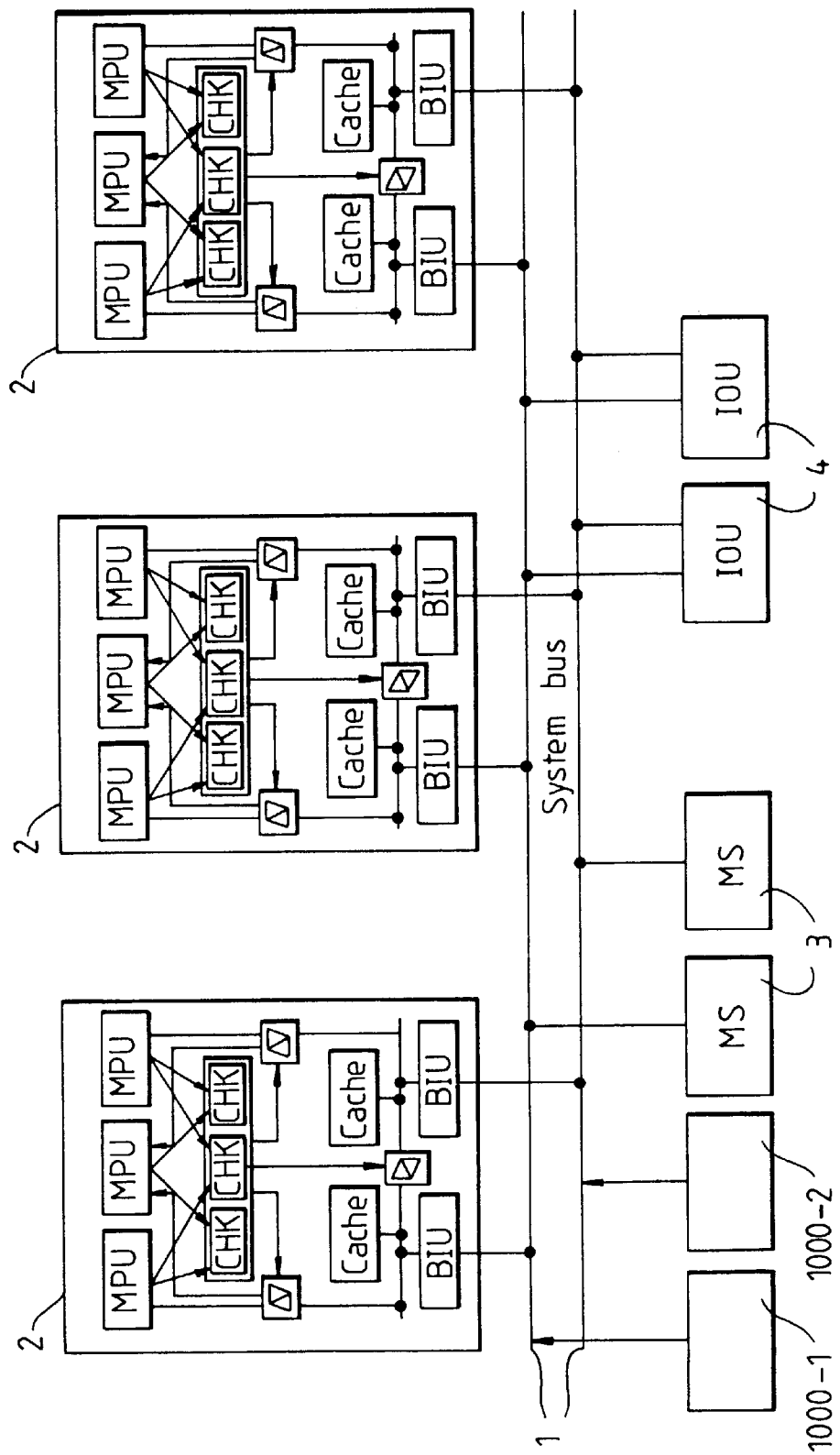
FIG. 41 shows a modification of the example of FIG. 40.

FIG. 41 shows another embodiment in which this aspect the present invention is applied to a fault tolerant computer system. In this embodiment, clocks which are used by 2 systems of buses 1 are supplied from the clock switching circuits 1000-1 and 1000-2. According to this aspect, the system bus clocks can be multiplexed by synchronizing in addition to the arrangement of FIG. 40.

C) Cache Memory Control

The next section of the description considers embodiments concerned with control of the cache memory or memories of the processing units. The cache memory control of the present invention has different aspects, which will become apparent from the following description.

Figure 42B:
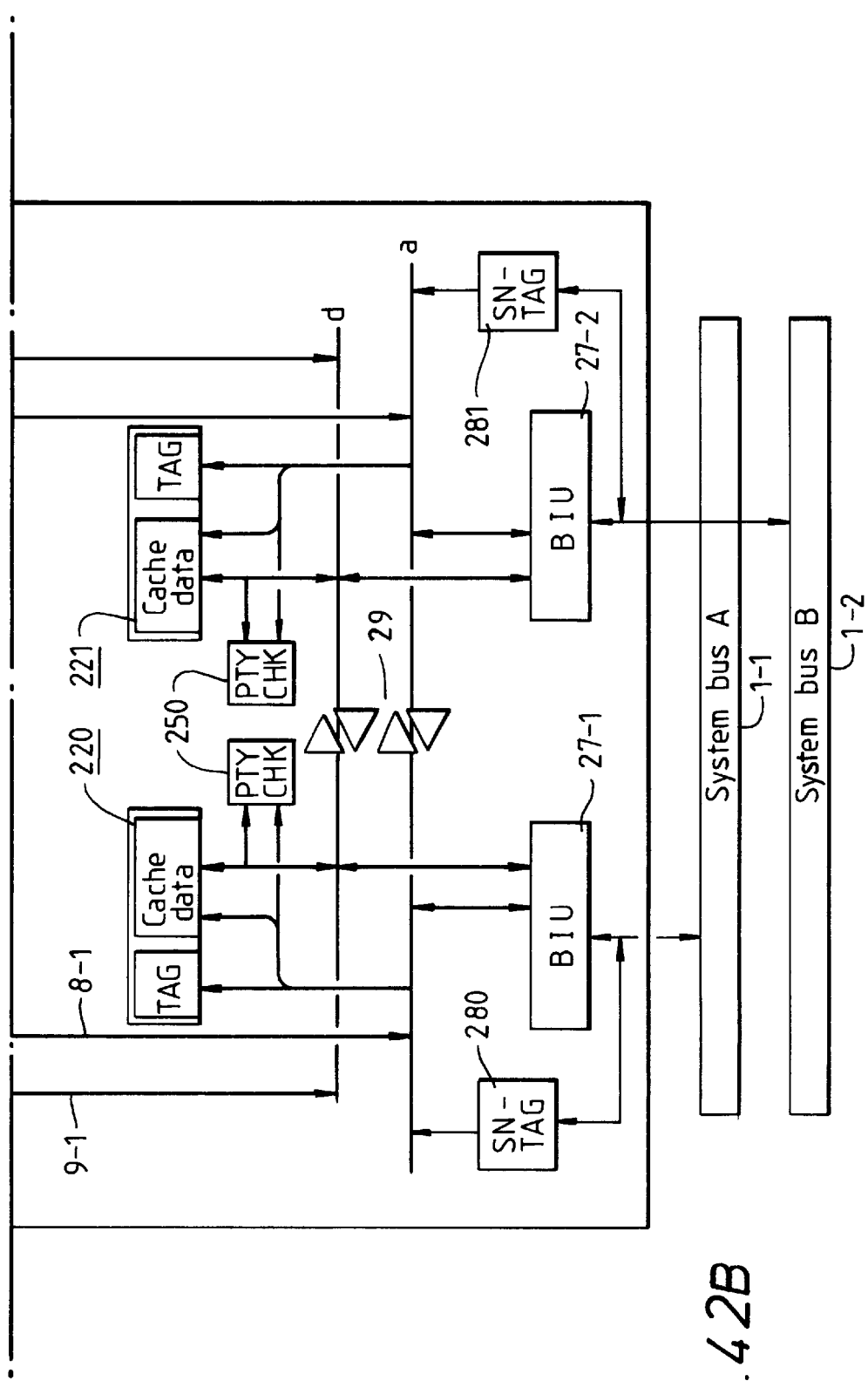
FIGS. 42A, B represents a schematic view of a processor unit BPU.

FIG. 42 is a schematic view of a computer system to which this aspect of the present invention is applied. As will immediately be seen, FIG. 42 is generally similar to FIG. 2. Corresponding parts are indicated by the same reference numerals, and will not be described in further detail. The internal busses 8-1, 8-2, 8-3, and 9-1, 9-2, 9-3 connecting the microprocessors MPU 20-1, 20-2, 20-3 to other parts of the processing unit BPU2 are identified, since they will need to be referred to in the description of the present embodiment. Furthermore, FIG. 42 differs from FIG. 2 in that it shows snooper circuits which monitor memory access of another BPU of the computer system, which has a tag of the same content as the content of the cache memory 220. Again, these snooper circuits 280, 281, will be described in more detail later.

A plurality of processing units BPU such as shown in FIG. 42 may be inter-connected in the same way as shown in FIG. 1.

Each MPU is associated with a cache memory (2020-1, 2020-2, 2020-3) using, for example, a 4-set associative method (these are called a first cache memory). Normally, the first cache memory 2020-1, 2020-2, 2020-3 is integral with the processor of the corresponding MPU. There are further cache memories 220, 221 (these are called second cache memories) installed outside the MPU, and the specification for the second cache memories 220, 221 is as follows:

Capacity : 512k bytes

Line size : 32 bytes

Line replacement method: Copy back

Line multiplexing : 2-set associative

Generally, 220 is connected to MPU201 and MPU202 via the internal buses 8-1, 9-1, 8-2, and 9-2, and cache memory 221 to MPU203 via the internal buses 8-3 and 9-3.

Figure 43:
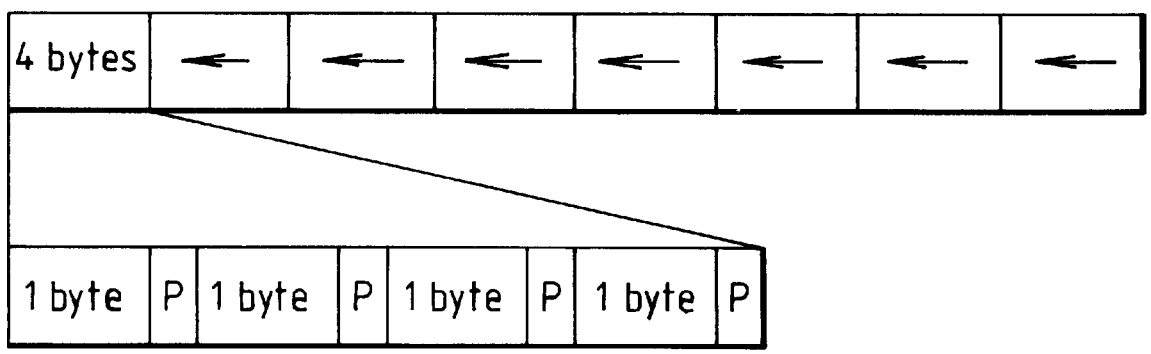
FIG. 43 is a schematic view of a cache memory.
Figures 44, 45:
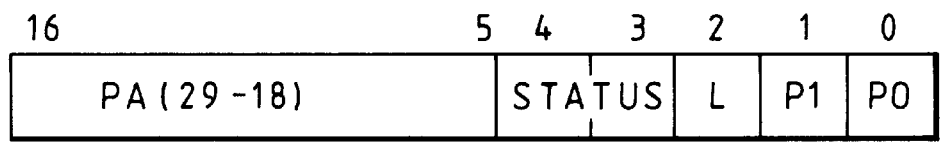
FIG. 44 is a schematic view of a cache memory line.
FIG. 45 is an extract of system bus signal conductors.

Each cache memory 220, 221 has a tag (which may be called a directory or an address array) section and a data section. FIGS. 43 and 44 show the construction of each line of the cache memory 200, 221. The data section of the cache memory is 32 bytes per line in size, and each byte has odd parity P. The parity checker 250 (see FIG. 2 and FIG. 42) detects an error using this parity. "PA" of the tag section shown in FIG. 44 is upper 12 bits of the address of the main memory on the above line. The term "STATUS" represent bits for indicating the status of the line.

The possible statuses include:

00 indicates the holding status INV corresponding to invalid data.

01 indicating a status EXU corresponding to the case where the same data is not found in the cache memory of another BPU and the data matches data in the main storage (MS).

10 indicating a status SHU corresponding to the case where the same data is found in the cache memory of another BPU and the data matches data in the main storage MS (see FIG. 1).

11 indicating a status MOP corresponding to the case when the same data is not found in the cache memory of another BPU and the data does not match data in the main storage (MS).

Status MOD i.e status 11 corresponds to a status in which data is written into the cache memory by the MPU itself. P0 and P1 are odd parity of PA and STATUS, and the parity checker 250 detects an error using this parity.

The system buses 1-1 and 1-2 shown in FIGS. 2 and 42 contain addresses, data, and control signals, which are not described in this embodiment because they are well known. CST indicates a signal conductor for outputting the monitor (snoop) result for memory access by the bus master by the snoopers 280 and 281 of a BPU other than the bus master. The snoopers 280 and 281 generate a CST signal by performing the following operations:

00: The data at the address is not found.

01: The address is found and the status of the line is EXU01 or SHU10.

10: The address is found and the status of the line is MOD11.

11: Error

Figure 46A:
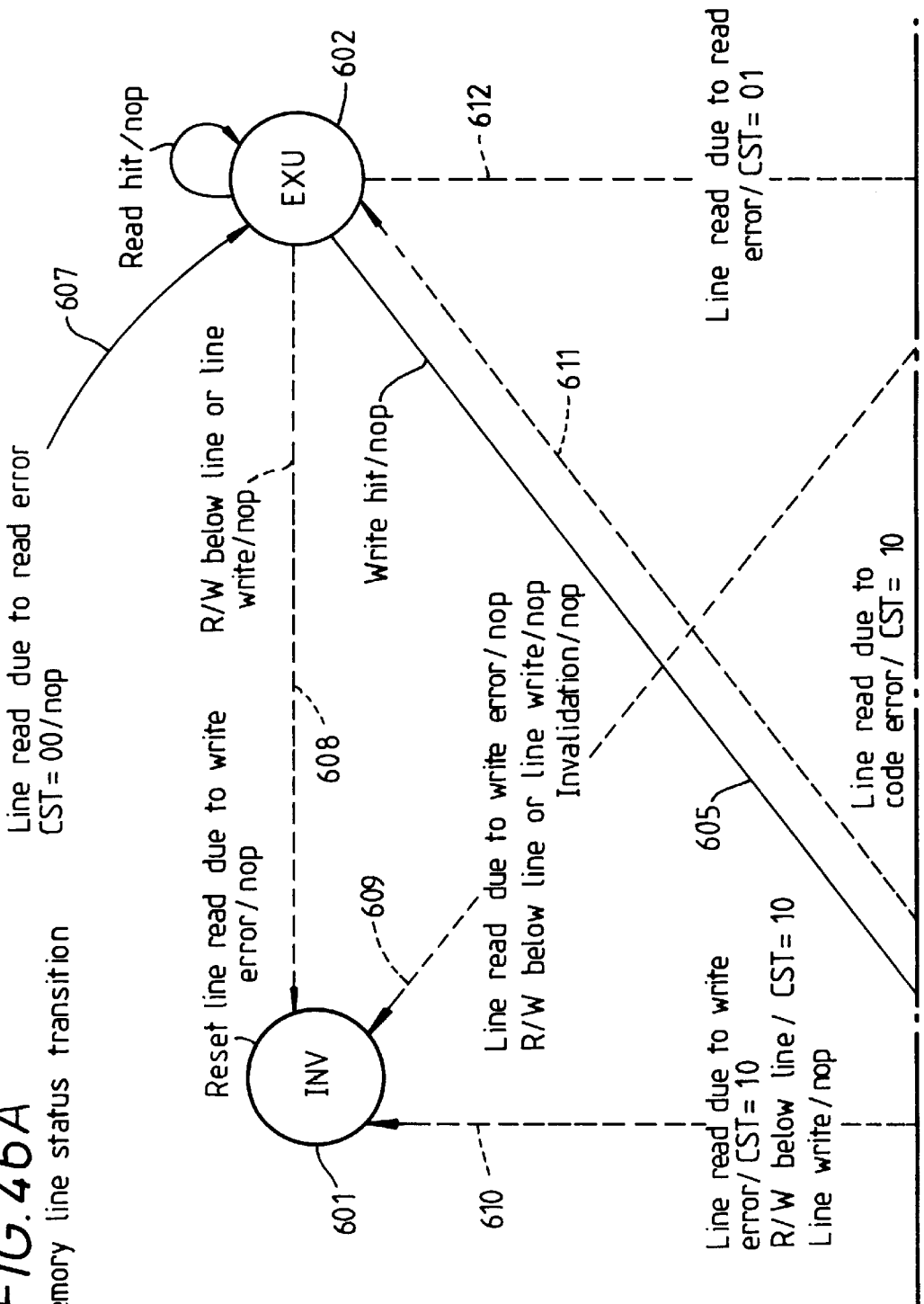
FIGS. 46A, B represents a transition diagram of the cache memory line status.
Figure 46B:
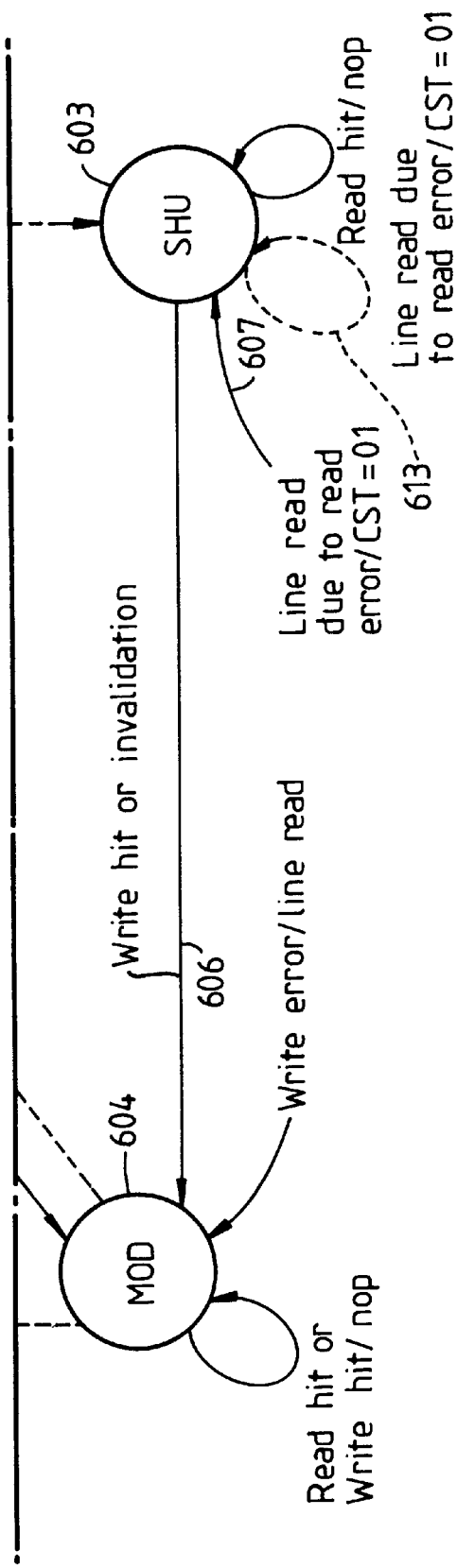

FIG. 46 is a transition diagram of the line status of the cache memory. Numerals 601, 602, 603, and 604 indicate cache memory line statuses. Each solid line with an arrow indicates a transition by access by the MPU of the BPU. Each broken line indicates a transition by system bus access by another BPU transmitted by the snooper 280, 281. The left side of the slash (/) on each line indicates the transition conditions and the right side indicates the operation performed for the system bus for transition. Some major transitions will now be described.

Figure 47:
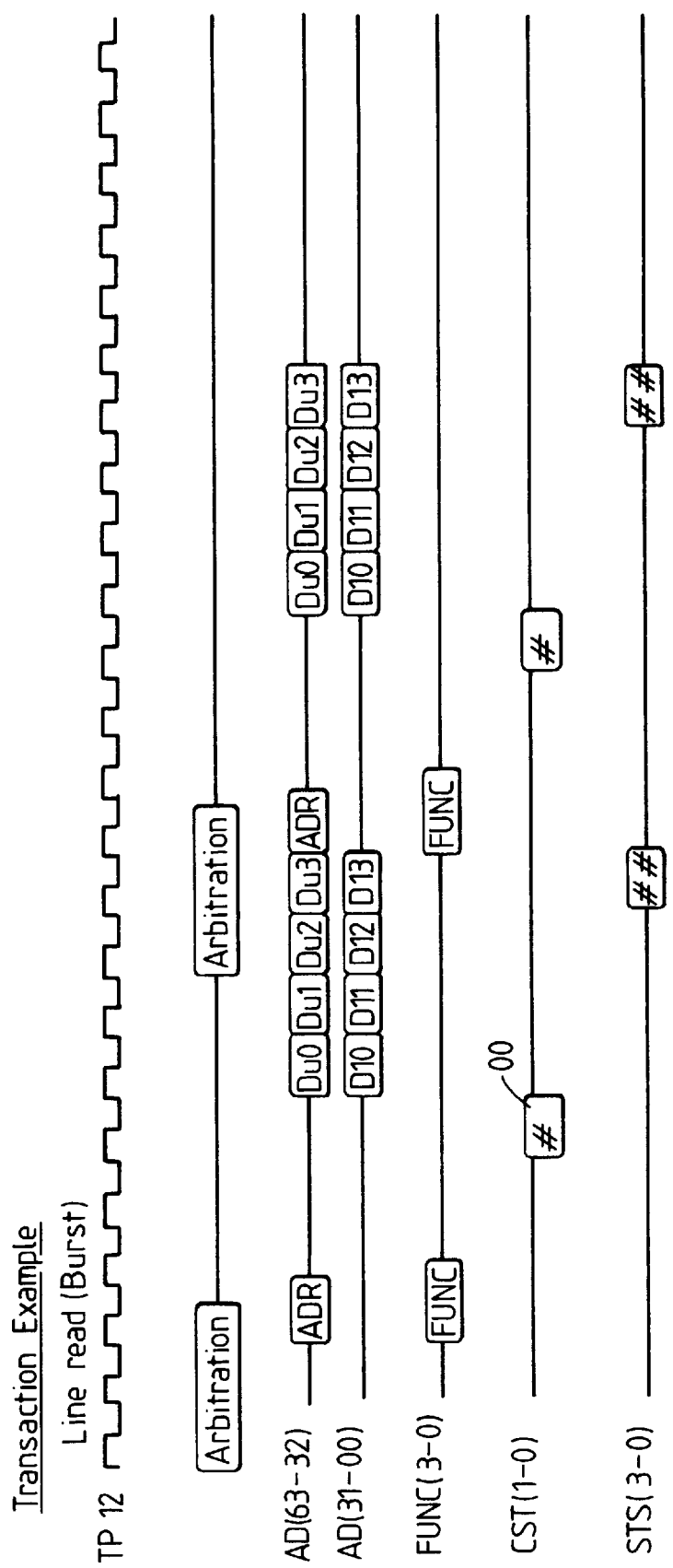
FIG. 47 is a bus cycle example in the memory access mode.

When write access is generated in the EXU status (602), the cache memory is updated and the status changes to the MOD status (604) (605). When write access is generated in the SHU status (603), the cache memory is updated, a line invalidation request is made for another cache memory, and the status changes to the MOD status (604) (606). When read access by the MPU fails in either status, the memory is read in units of a line. When CST=01 is outputted to the system bus from another BPU, the status is transited to the SHU status (603). When CST=00 is outputted, the status changes to the EXU status (602). FIG. 47 shows a time chart of the system bus at this time.

When another cache memory reads in units of a line (32-byte read access in this embodiment) due to cache write misaccess in the EXU status (602), the status changes transited to the INV status (601) beforehand (608) because it is known that the line is updated. When another cache memory performs access in units of less than a line (1, 2, or 4 byte access in this embodiment), the access is used by the TAS or CAS instruction, often accompanied by memory write, and used by the peripheral equipment for memory access. Since the probability of use of the data by the MPU is very small thereafter, the status is changes to the INV status (601) beforehand (608). By doing this, the cache memory use efficiency can be improved.

Thus, where the processor MPU of one processing unit BPU access directly data in the main storage MS, the snooper circuits 280, 281 for other BPUs detect this, and determine which data has been accessed. Then, the data in the cache memory 220, 221 of the or each BPU which is snooping on the access to the main storage MS is indicated as invalid. It can be noted, that in normal operation, each processor MPU of a processing unit BPU will be performing the same operation, assuming that there is no fault. When there is a fault, the procedures have already been described in section A of this description.

When another cache memory reads in units of a line due to cache misread in the MOD status (604), CST=10 is output to the system bus because this cache memory stores the latest data on the line, the bus master is specified to re-perform the access operation, and the latest line data is written back into the memory (Push). The status changes to the EXU status (602) (611).

Figure 48:
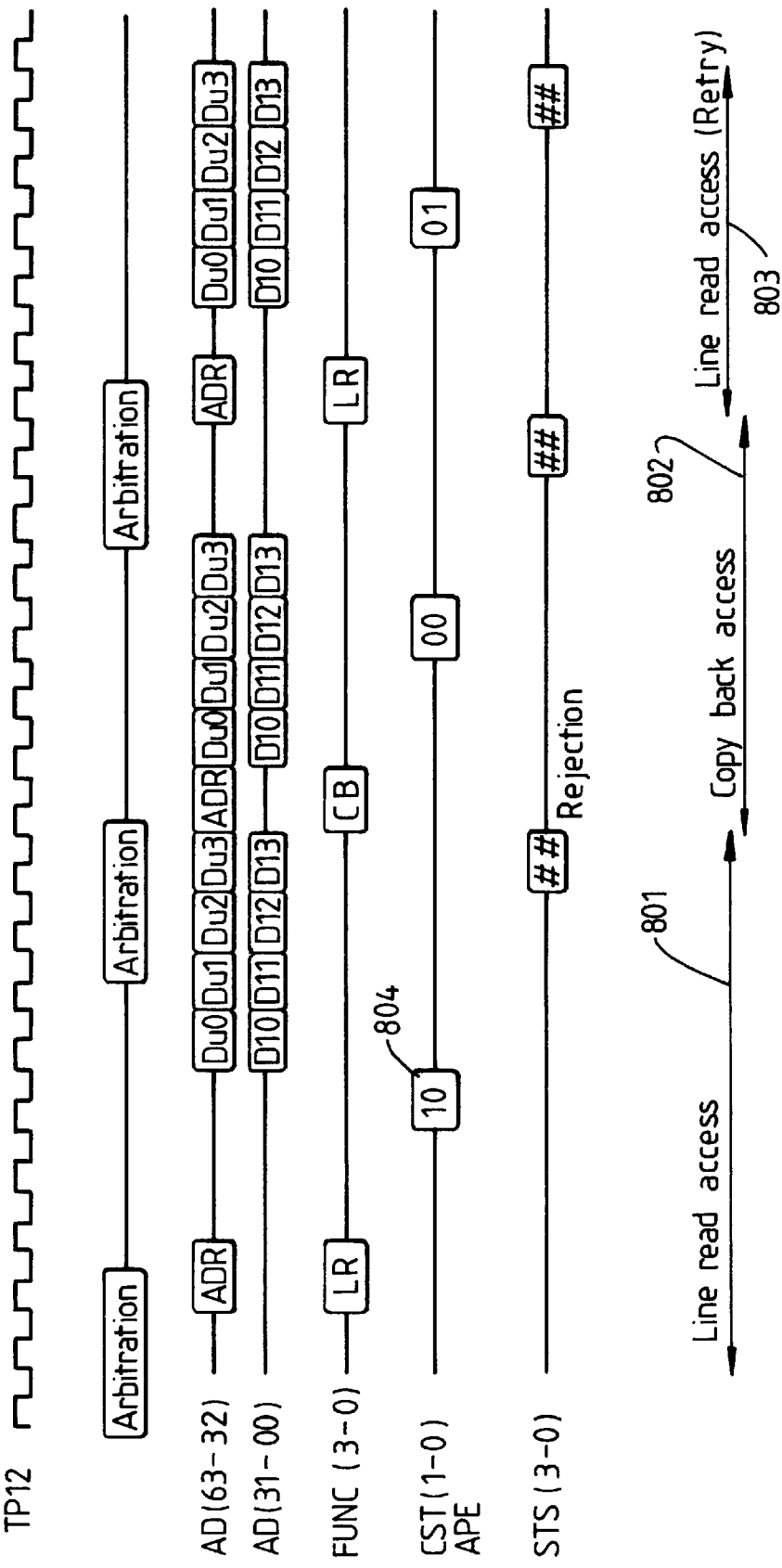
FIG. 48 is a bus cycle example in the memory access mode.

FIG. 48 shows a time chart of the system bus at this time. When another cache memory reads (801) data in units of a line, the cache memory in the MOD status (604) outputs CST=10 as a snooping result (804). Next, the cache memory, which outputs CST=10, writes the latest data into the memory (802). Thereafter, the previous cache memory reads data once again in units of a line. When another cache memory reads data in units of a line due to cache misread in the EXU (602) or SHU (603) status, CST=01 is outputted to the system bus because this cache memory stores the data on the line, and the status changes to the SHU status (603)(612, 613).

Figure 49A:
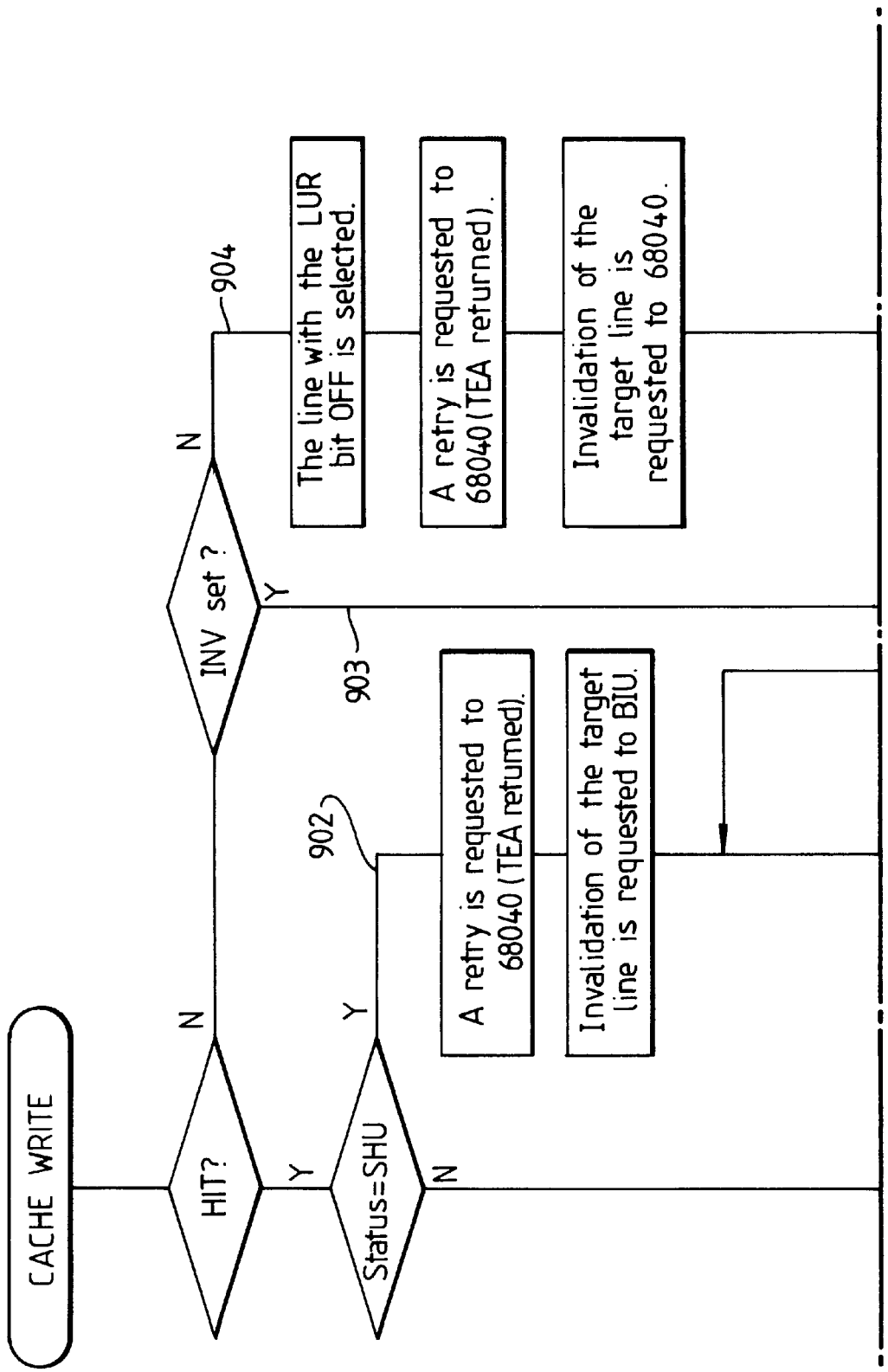
FIGS. 49A, B illustrate a cache memory data read access procedure.

The functions of the cache memories 220 and 221 will now be described in more detail with reference to FIGS. 49 and 50. FIG. 49 shows a processing flow chart for write access by the processor. When a cache memory is hit and no data is found in the other cache memories (901), the MPU writes the data into the cache memory immediately. When a cache memory is hit and the data is found in the other cache memories (902), the cache memory responds to the microprocessor MPU to re-perform the access operation, invalidates the same line of the other cache memories via BIU27-1 and 27-2, and changes to the EXU status. When a cache memory is not hit and a line in the INV status is found in the two sets (903), the MPU requests the memory to read data in units of a line. When a cache memory is not hit and a line in the INV status is not found in the two sets (904), the cache memory responds to the microprocessor MPU to re-perform the access operation, outputs the address of the line with L bits off, and specifies the same line of the MPU that cache memory of the MPU is rendered invalid. The cache memory puts the line into the INV status. In the case of operation 902 or 904, the processing is terminated once and the processing 901 or 903 is performed by reaccess by the 68040.

Thus, this illustrates another aspect of the present invention, which relates to the relationship between the data in an internal cache memory in the MPU and the separate cache memory (external cache memory) of the BPU. At its simplest, this aspect proposes that any difference in the internal and external cache memory results in the different data in the internal cache memory being rendered invalid. In practice, each cache memory will preferably operate on the and MPUC20-3 by parity generation and check units 10, 11, 12, 13, 14, and 15. Output signals (address, data, control signal) from the MPUA20-1, MPUB20-2, and MPUC20-3 are compared and checked by check circuits (CHKAB23-1, CHKBC23-3, CHKCA23-2). Only address and data signal conductors are shown and control signal conductors are omitted.

By doing this, an error in the MPU20-1, 20-2, or 20-3 or the parity generation and check unit 10, 11, 12, 13, 14, or 15 can be detected by the check circuits (CHKAB231, CHKBC232, CHKCA233).

When a single error occurs in one of the MPU201, 202, and 203 and the parity generation and check units 10, 11, 12, 13, 14, and 15, there is a rule that an unmatch occurs in two of the three check circuits (CHKAB231, CHKBC232, CHKCA233) as shown in Table 5. When an unmatch occurs in one or three check circuits, an error in one of the check circuits can be detected. Therefore, it can be decided whether each MPU is normal or abnormal as shown in Table 1 referred to above.

| | | | Error location | | | | Check results | |
|---|---|---|---|---|---|---|---|---|
| | MPU | | | Check circuit | | | | |
| A | B | C | 23-1 | 23-2 | 23-3 | CHKAB | CHKBC | CHKCA |
| Normal | Normal | Normal | Normal | Normal | Normal | Matching | Matching | Matching |
| Normal | Normal | Normal | Incorrect information | Normal | Normal | Unmatching | Matching | Matching |
| Normal | Normal | Normal | Normal | Incorrect | Normal | Matching | Unmatching | Matching |
| Normal | Normal | Normal | Normal | Normal | Incorrect information | Matching | Matching | Unmatching |
| Faulty | Normal | Normal | Normal | Normal | Normal | Unmatching | Matchinq | Unmatching |
| Faulty | Normal | Normal | Incorrect information | Normal | Normal | Unmatching | Matching | Unmatching |
| Faulty | Normal | Normal | Normal | Incorrect information | Normal | Unmatching | Unmatching | Unmatching |
| Faulty | Normal | Normal | Normal | Normal | Incorrect information | Unmatching | Matching | Unmatching |
| Faulty | Normal | Normal | No Information | Normal | Normal | Matching | Matching | Unmatching |
| Faulty | Normal | Normal | Normal | No information | Normal | Unmatching | Matching | Unmatching |
| Faulty | Normal | Normal | Normal | Normal | No information | Unmatching | Matching | Matching | basis of integer-set association, with the integer of the set of association for the internal cache memory being greater than that of the external cache memory.

Figure 50A:
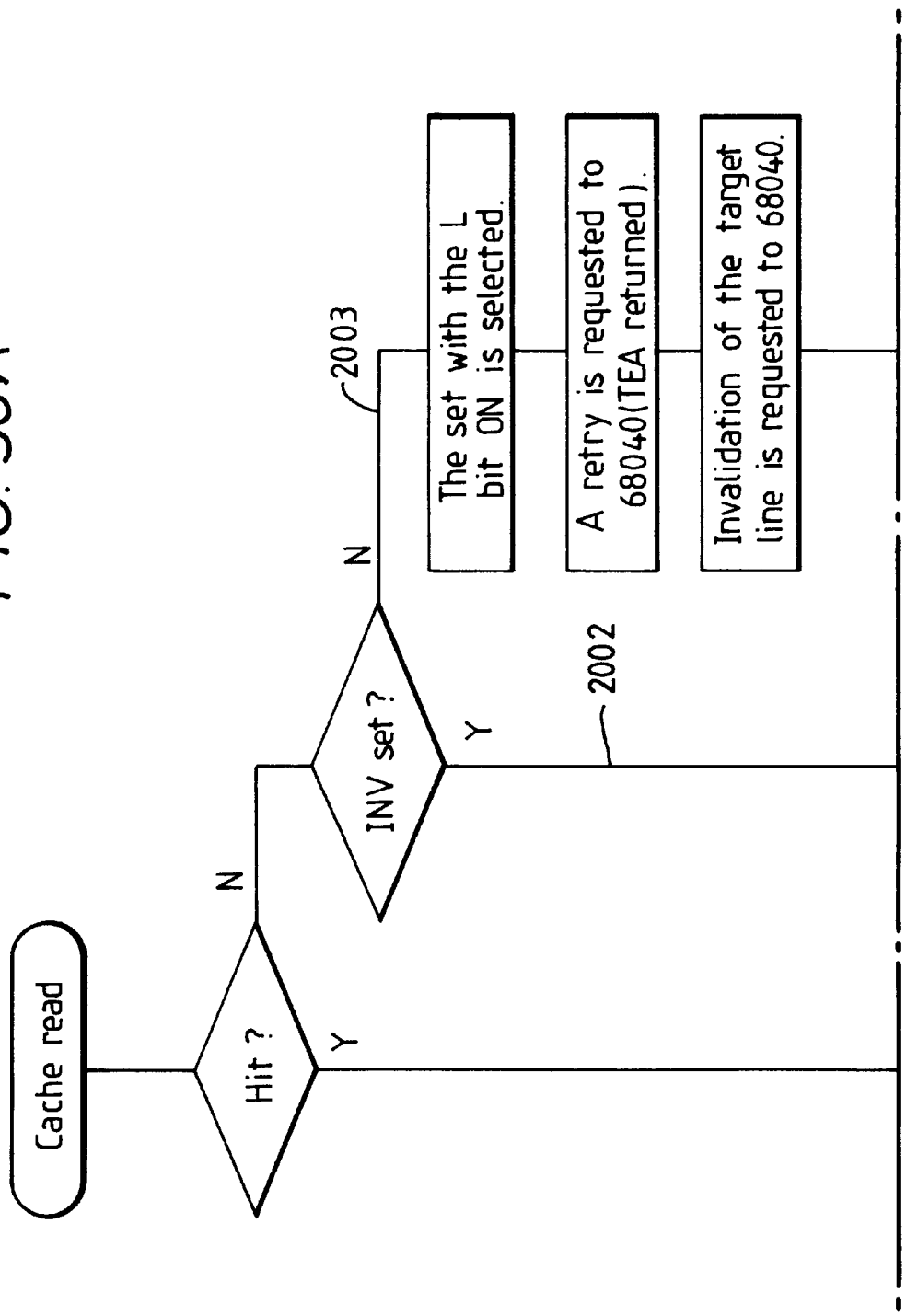
FIGS. 50A, B illustrate a further cache memory data write access procedure.
Figure 50B:
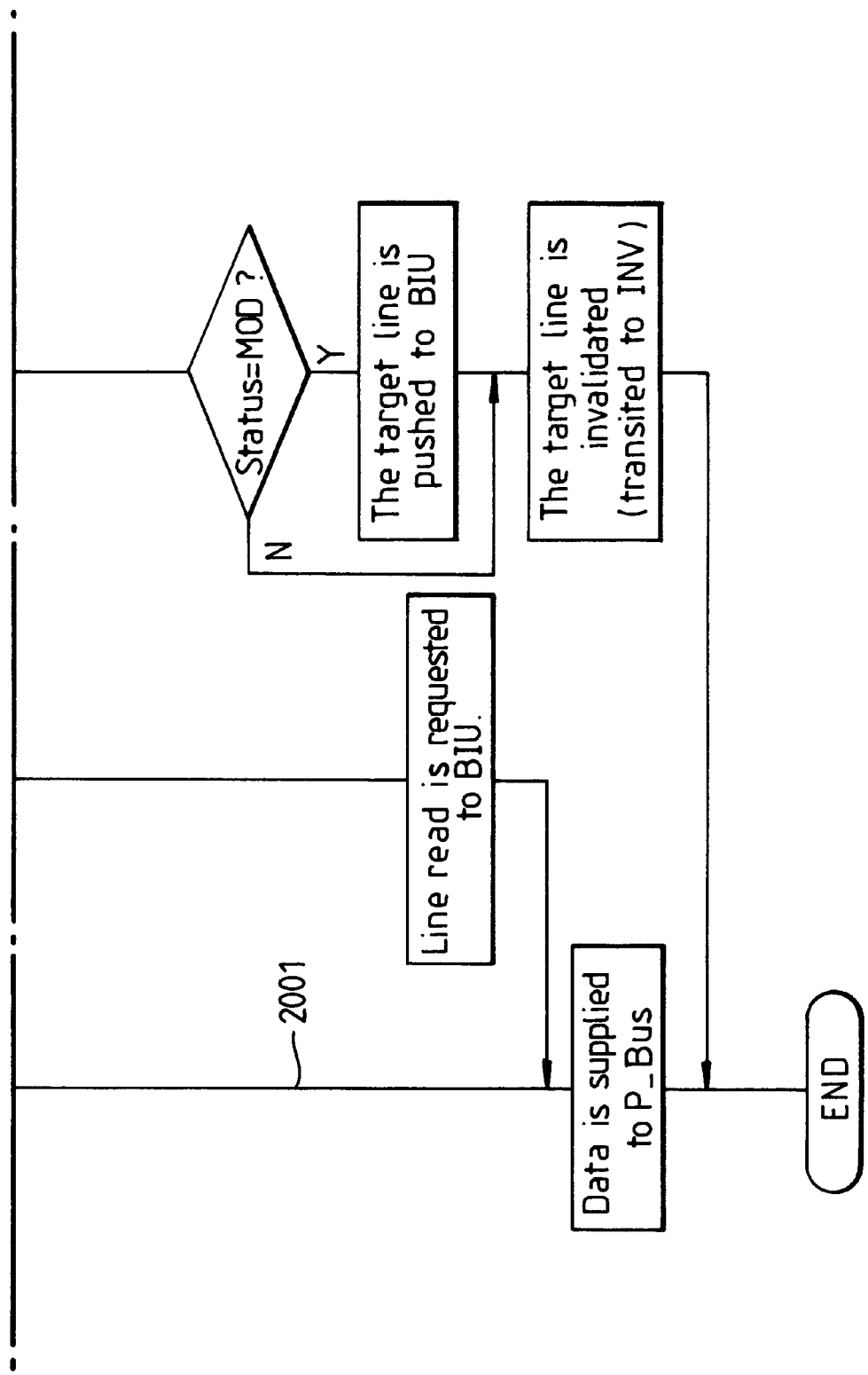

FIG. 50 shows a processing flow chart for read access by the processor. When a cache memory is hit, the MPU reads data from the cache memory immediately. When a cache memory is not hit and a line in the INV status is found in the two sets (2002), the MPU requests the memory to read data in units of a line and reads data from the cache memory. When a cache memory is not hit and a line in the INV status is not found in the two sets (2003), the cache memory responds to the microprocessor MPU to perform access once again, outputs the address of the line with L bits off, and specifies to invalidate the same line of the 68040. The cache memory puts the line into the INV status. In the case of 2003, the processing is terminated once and the processing 2002 is performed by reaccess by the MPU.

Next, operation within in the BPU board will be described with reference to FIGS. 2 and 42. In the case of write access from the MPUs, for example, parity is assigned to output signals (address, data) from the MPUA20-1, MPUB20-2, When an error (parity error) is found in the data from the cache memory 220, it is detected by parity check by the parity checker 250 and the parity generation and check units 10 and 12, retry signals are returned to the MPUA20-1, MPUB20-2, and MPUC20-3, and a retry operation is performed (see FIG. 11). In the retry operation mode, the output of the cache memory 2201 is in a high impedance state, and the output of the cache memory 221 is fed to the MPUA20-1 and MPUB20-2 via the 3-state buffer 29. With the 3-state buffers 26 in the high impedance state and the output of the cache memory 221 fed to the MPUB202 via the 3-state buffer 27, the supply of incorrect data to the MPUB20-2 can be prevented because the data signal path from the cache memory 220 to the MPUB20-2 is faulty. In this embodiment, each MPU has access to two external cache memories having only two parity check functions so as to improve the data reliability. Three or more cache memories can be provided so as further to improve the reliability.

Thus, this illustrates a further aspect of the present invention, in which a plurality of cache memories are connected in common to each MPU. Of course, as illustrated in FIGS. 2 and 42, the two cache memories 220, 221 are connected in common to the three MPU's 20-1, 20-2 and 20-3, but should normally carry out the same operation. However, if either of the cache memories 220, 221 fails, processing need not be halted since the two cache memories 220, 221 store the same information.

Thus, cache memory control within the present invention involves one or more of:

the use of a plurality of cache memories in common to one or more process, so that the or each processor can continue to operate despite a failure in one of the common cache memories. If desired, and in a similar way to that described earlier with reference to failure of a MPU, the failure of a cache memory may be used to trigger a suitable warning, to enable the BPU to be replaced.

2.

Normally, the processor on a given BPU will access data in its own cache memories. However, there are operations in which the processor access is directly information in the main store, in which case the present invention proposes that this access operation be detected by other BPU's (snooping) with the data in the cache memories of those other BPU's corresponding to the data of the main store access by a processor being considered invalid.

3.

The above two points have been considered control of cache memories which are external to the processors. However, normally each processor will have an internal cache memory, and the present invention proposes that any difference in the data between the internal cache memory and the external cache memory be resolved in favour of the external memory. This point may be expanded further and applied to any pair of cache memories which operate on the basis of integer set associated, with any difference in data being resolved in favour of the cache memory for which the integer of the integer set is smaller.

In these embodiments, an example wherein a snooping tag and a tag used for access from a processor are shared is shown. As well known, dedicated tags can be used so as to decrease the tag load. It is needless to say that various types of processors can be used in addition to 68000 from Motorola.

What is claimed is:

1. A computer system, comprising:
    a plurality of processing units, each formed as a single unit which is replaceable as a module, each processing unit comprises:
    at least three processors,
    at least one detector which compares operations of each of said at least three processors with each of the others of said at least three processors, and detects a fault when any one of said at least three processors does not execute the same operation as at least two processors,
    a plurality of busses for communicating data among said at least three processors and said at least one detector, and
    at least one gate switch which alters an information path on said plurality of busses when a fault in any one of said at least three processors is detected by said at least one detector;
    a main storage; and
    a system bus connected to said plurality of processing units and said main storage for communicating said data among said plurality of processing units, and said main storage;
    wherein said at least three processors are arranged to operate with redundancy among respective processors; and
    wherein said processing unit remains operable despite a fault in any one of said at least three processors.

2. A computer system according to claim 1, wherein said at least three processors are arranged to execute the same operation when operating without a fault.

3. A computer system according to claim 2, wherein said detector compares operations of each of said at least three processors with each of the others of said at least three processors, and detects said fault when any one of said at least three processors does not execute the same operation as at least two processors of said at least three processors.

4. A computer system according to claim 1, wherein each processing unit further comprises:
    a plurality of clocks for generating clock pulses for controlling said at least three processors,
    wherein said plurality of clocks being arranged to operate with redundancy therebetween, and
    wherein said processing unit remains operable despite a fault in any one of said clocks.

5. A computer system according to claim 4, wherein said plurality of clocks includes at least first and second clocks, and said processing unit further comprises:
    a comparator which compares the duration of the clock pulses of said first and second clocks; and
    a clock output switch which outputs said clock pulses of said first clock when the duration of said clock pulses of said first and second clocks have a first relationship and outputs the clock pulses of said second clock when the duration of said clock pulses of said first and second clocks have a second relationship different from said first relationship.

6. A computer system according to claim 1, further comprising:
    a plurality of cache memories are connected in common to said at least three processors.

7. A computer system according to claim 6 wherein each of said plurality of cache memories is arranged to store data in common, and said processing unit further comprises:
    a cache fault detector which detects a fault in any one of said plurality of cache memories after detection of said fault by one of said at least one detector;
    wherein said plurality of processors are arranged to access said data only in said plurality of cache memories other than said cache memory in which a fault has been detected.

8. A computer system according to claim 1, further comprising:
    a plurality of cache memories respectively connected to different ones of said at least three processors.

9. A computer system according to claim 1, wherein said at least one detector compares operations of each of said at least three processors by comparing input and output data, input and output to and from said at least three processors.

10. A processing unit formed as a single unit which is replaceable as a module for a computer, comprising:
    at least three processors being arranged to execute the same operation when operating without a fault;
    at least one detector which detects a fault in any one of said at least three processors by comparing operations of each of said at least three processors with each of the others of said at least three processors;
    a plurality of busses for communicating the data among said at least three processors, and said detector; and at least one gate switch which alters an information path on said plurality of busses when a fault in any one of said at least three processors is detected by said detector.

11. A processing unit according to claim 10, wherein each of said at least one detector is arranged to prevent output from one of said at least three processors on detection of said fault.

12. A processing unit according to claim 10, having an indicator which generates an indication on detection of said fault by one of said at least one detector.

13. A processing unit according to claim 10, wherein said each of said at least one detector is arranged to compare each of said at least three processors with every other of said at least three processors, and to detect said fault when any one of said at least three processors does not execute the same operation as at least two others of said at least three processors.

14. A processing unit according to claim 10, further comprising:
   a clock for controlling said at least three processors,
   wherein said clock includes a plurality of clocks for generating clock pulses for controlling said at least three processors, and
   wherein said clocks includes at least first and second clocks;
   a comparator which compares the duration of the clock pulses of said first and second clocks; and
   a clock output switch which outputs said clock pulses of said first clock when the duration of said clock pulses of said first and second clocks have a first relationship and outputs the clock pulses of said second clock when the duration of said clock pulses of said first and second clocks have a second relationship different from said first relationship.

15. A processing unit according to claim 10, further comprising:
   a plurality of cache memories respectively connected to at least one of said at least three processors.

16. A processing unit according to claim 15, wherein said plurality of cache memories are connected in common to said at least three processors.

17. A processing unit according to claim 16, wherein each of said plurality of cache memories is arranged to store data in common and said processing unit further comprises:
   a cache fault detector which detects a fault in any one of said cache memories after the detection of said fault by said at least one detector; and
   wherein said at least three processors are arranged to access said data in said cache memories other than said cache memory in which a fault has been detected.

18. A processing unit according to claim 10, wherein said at least three processors includes first, second, third and fourth processors, and each of said at least one detector compares operations of said first and said second processors and compares operations of said third and said fourth processors, and detects said fault when said first, second, third and fourth processors are such that at least one of:
   (i) said first and second processors are not executing the same operation, and (ii) said third and fourth processors are not operating the same operation, occurs.

19. A computer system according to claim 10, wherein each processing unit further comprises:
   a plurality of clocks for generating clock pulses for controlling said at least three processors,
   wherein said plurality of clocks being arranged to operate with redundancy therebetween, and
   wherein said processing unit remains operable despite a fault in any one of said clocks.

20. A computer system according to claim 10, wherein said at least one detector compares operations of each of said at least three processors by comparing input and output data, input and output to and from said at least three processors.

21. A method of operating a processing unit for a computer, said processing unit being formed as a single unit which is replaceable as a module, said processing unit comprises:
   at least three processors arranged to execute the same operation when operating without a fault,
   at least one detector which detects a fault in any one of said at least three processors by comparing operations of each of said at least three processors with each of the others of said at least three processors,
   a plurality of busses for communicating the data among said at least three processors, and said detector, and
   at least one gate switch which alters an information path on said plurality of busses when a fault in any one of said at least three processors is detected by said detector,
   said method comprising the steps of:
      detecting a fault in one of said at least three processors by said detecting means;
      causing said one of said at least three processors to cease execution of said operation; and
      continuing execution of said operation in said at least three processors other than said one of said at least three processors.

22. A method according to claim 21, further comprising a step of:
   generating an indication when said fault is detected.

23. A method of operating a computer having a plurality of processing units, each processing unit being formed as a single unit which is replaceable as a module, said processing unit comprises:
   at least three processors being arranged to execute the same operation;
   at least one detector which detects a fault in any one of said at least three processors by comparing operations of each of said at least three processors with each of the others of said at least three processors;
   a plurality of busses for communicating the data among said at least three processors, and said at least one detector; and
   at least one gate switch which alters an information path on said plurality of busses when a fault in any one of said at least three processors is detected by said at least one detector;
   said computer comprises:
      a main storage; and
      a system bus connected to said plurality of processing units, said main storage for communicating the data among said plurality of processing units and said main storage,
      said method comprising the steps of:
         causing a first one of said processing units to execute said operations in each of the at least three processors thereof;
         detecting a fault in one of said at least three processors of said first one of said processing units;
         causing said execution of said operation to be transferred to a second one of said processing units for execution in each of said at least three processors thereof; and ceasing execution of said operation in each of said at least three processors of said first one of said processing units.

24. A method according to claim 23, wherein, after detection of said fault but prior to transfer of said operation;

said one of said at least three processors is caused to cease execution of said operation; and said execution of said operation is continued in said at least three processors of said first one of said processing units other than said one of said at least three processors.

25. A computer system according to claim 23, wherein said at least one detector compares operations of each of said at least three processors by comparing input and output data, input and output to and from said at least three processors.

26. A processing unit being formed as a separate plug-in board for a computer, comprising:

at least four processors being arranged to execute the same operation when operating without a fault;

clock means for controlling said at least four processors; and detecting means having first comparison means for comparing input and output data and designating addresses output for first and second ones of said at least four processors to detect a fault therein, and second comparison means for comparing input and output data and designating addresses of third and fourth ones of said at least four processors;

a plurality of busses for communicating said input and output data and said designating addresses among said processors, and said detecting means, and a plurality of gate switching means for altering an information path on said plurality of busses when a fault in any one of said processors is detected by said detecting means.

27. A processing unit according to claim 26, wherein said first comparison means is arranged to prevent output from said first and second ones of said at least four processors on detection of a fault therein, and said second comparison means is arranged to prevent output from said third and fourth ones of said at least four processors on detection of a fault therein.

28. A computer system comprising:

a plurality of processing units, each formed as a separate plug-in board, each processing unit comprises:

at least four processors being arranged to execute the same operation when operating without a fault, clock means for controlling said at least four processors, and detecting means having first comparison means for comparing input and output data and designating addresses output for first and second ones of said at least four processors to detect a fault therein, and second comparison means for comparing input and output data and designating addresses output for third and fourth ones of said at least four processors, a plurality of busses for communicating said input and output data and said designating addresses among said processors, and said detecting means, and a plurality of gate switching means for altering an information path on said plurality of busses when a fault in any one of said processors is detected by said detecting means;

a plurality of main storage memories;

a plurality of I/O units; and a plurality of system busses connected to said plurality of processing units, said plurality of main storage memories and said plurality of I/O units for communicating said input and output data and said designating addresses among said plurality of processing units, said plurality of main storage memories and said plurality of I/O units.

29. A method of operating a processing unit for a computer said processing unit being formed as a separate plug-in board, said processing unit comprises:

at least four processors being arranged to execute the same operation when operating without a fault;

clock means for controlling said at least four processors; and detecting means having first comparison means for comparing input and output data and designating addresses output for first and second ones of said at least four therein and second processors to detect a fault therein, and second comparison means for comparing input and output data and designating addresses output for third and fourth ones of said at least four processors, a plurality of busses for communicating said input and output data and said designating addresses among said processors, and said detecting means, and a plurality of gate switching means for altering an information path on said plurality of busses when a fault in any one of said processors is detected by said plurality of detecting means, said method comprising the steps of:

detecting a fault in said first and second ones of said at least four processors by said first comparison means;

causing said first and second ones of said at least four processors to cease execution of said operation; and continuing execution of said operation in said third and fourth ones of said at least four processors.

30. A computer system, comprising:

a plurality of processing units interconnected to each other by a system bus, each processing unit is formed as a single unit which is replaceable as a module, each processing unit comprises:

at least three processors, at least one detector which compares operations of each of said at least three processors with each of the others of said at least three processors, and detects a fault when any one of said at least three processors does not execute the same operation as at least two processors, a plurality of busses for communicating data among said at least three processors, said system bus, and said at least one detector, and at least one gate switch, responsive to detection of a fault by said at least one detector in one of said at least three processors, which alters an information path on said plurality of busses to connect said information path to at least two processors of said at least three processors other than the one processor in which the fault has been detected;

wherein said at least three processors are arranged to operate with redundancy among respective processors; and wherein said processing unit remains operable with said at least two processors other than the one processor in which the fault has been detected despite a fault in the one processor.

31. A computer system according to claim 30, wherein said at least one detector compares operations of each of said at least three processors by comparing input and output data, input and output to and from said at least three processors.

32. A computer system according to claim 30, wherein each processing unit further comprises:
   a plurality of clocks for generating clock pulses for controlling said at least three processors,
   wherein said plurality of clocks being arranged to operate with redundancy therebetween, and
   wherein said processing unit remains operable despite a fault in any one of said clocks.

33. A processing unit formed as a single unit which is replaceable as a module for a computer, comprising:
   at least three processors being arranged to execute the same operation when operating without a fault;
   at least one detector which detects a fault in any one of said at least three processors by comparing operations of each of said at least three processors with each of the others of said at least three processors;
   a plurality of busses for communicating the data among said at least three processors, and said detecting means; and
   at least one gate switch, responsive to detection of a fault by said at least one detector in one of said at least three processors, which alters an information path on said plurality of busses to connect said information path to at least two processors of said at least three processors other than the one processor in which the fault has been detected.

34. A computer system according to claim 33, wherein said at least one detector compares operations of each of said at least three processors by comparing input and output data, input and output to and from said at least three processors.

35. A method of operating a computer having a plurality of processing units, each processing unit being formed as a single unit which is replaceable as a module, said processing unit comprises:
   at least three processors being arranged to execute the same operation, and
   at least one detector which detects a fault in any one of said processors by comparing operations of each of said at least three processors with each of the others of said at least three processors,
   a plurality of busses for communicating the data among said at least three processors and said at least one detector, and
   at least one gate switch, responsive to detection of a fault by said at least one detector in one of said at least three processors which alters an information path on said plurality of busses to connect said information path to at least two processors of said at least three processors other than the one processor in which the fault has been detected;
   said computer comprises:
      a main storage, and
      a bus for communication the data among said plurality of processing units and said main storage,
      said method comprising the steps of:
         causing a first one of said processing units to execute said operations in each of said at least three processors thereof;
         detecting a fault in one of said at least three processors of said first one of said processing units;
         causing said execution of said operations to be transferred to a second one of said processing units for execution in each of said at least three processors thereof when a fault has been detected; and
         ceasing execution of said operations in each of said at least three processors of said first one of said processing units.

36. A computer system according to claim 35, wherein said at least one detector compares operations of each of said at least three processors by comparing input and output data, input and output to and from said at least three processors.

37. A computer system according to claim 35, wherein each processing unit further comprises:
   a plurality of clocks for generating clock pulses for controlling said at least three processors,
   wherein said plurality of clocks being arranged to operate with redundancy therebetween, and
   wherein said processing unit remains operable despite a fault in any one of said clocks.

38. A method of performing fault tolerant operations in a computer system having a plurality of processing units, each formed as a single unit which is replaceable as a module and includes at least three processors which are arranged to operate with redundancy among each other, said method comprising the steps, performed in each processing unit, of:
   comparing operations of each of said at least three processors of said processing unit with each of the others of said at least three processors;
   detecting, based on a result of said comparing step, a fault when any one of said at least three processors does not execute the same operation as at least two processors;
   altering an information path on a plurality of busses interconnecting said at least three processors when a fault in any one of said at least three processors is detected by said detecting step; and
   continuing operation of said processing unit despite a fault in any one of said at least three processors.

39. A method of performing fault tolerant operations in a processing unit formed as a separate unit which is replaceable as a module in a computer, said processing unit having at least three processors being arranged to execute the same operation when operating without a fault, said method comprising the steps of:
   detecting a fault in any one of said at least three processors by comparing operations of each of said at least three processors with each of the others of said at least three processors; and
   altering an information path on a plurality of busses interconnecting said at least three processors when a fault in any one of said processors is detected by said detecting step.

40. A method of performing fault tolerant operations in a computer having a plurality of processing units, each processing unit being formed as a single unit which is replaceable as a module and includes at least three processors being arranged to execute the same operation, said method comprising the steps of:
   detecting a fault in any one of said at least three processors of each processing unit by comparing operations of each of said at least three processors of said processing unit with each of the others of said at least three processors;
   altering an information path on a plurality of busses interconnecting said at least three processors of said processing unit when a fault in any one of said at least three processors is detected by said detecting step;
   continuing operation of said processing unit despite the fault detected in one of said at least three processors;
   causing execution of operations being performed by said processing unit to be transferred to another processing unit for execution in said at least three processors thereof, when a replacement of said processing unit is to be conducted; and ceasing execution of said operations in each of said at least three processors of said processing unit after execution of said operations has begun in each of said at least three processors of said another processing unit.

41. A method of performing fault tolerant operations in a computer system having a plurality of processing units interconnected to each other by a plurality of system busses, each processing unit being formed as a single unit which is replaceable as a module and includes at least three processors which are arranged to operate with redundancy among each other, said method comprising the steps, performed in each processing unit, of:

comparing operations of each of said at least three processors of said processing unit with each of the others of said at least three processors;

detecting, based on a result of said comparing step, a fault when any one of said at least three processors does not execute the same operation as at least two processors;

altering, in response to detection of a fault by said detecting step in one of said at least three processors, an information path on a plurality of busses interconnecting said at least three processors to connect said information path to at least two processors of said at least three processors other than the one processor in which the fault has been detected; and continuing operation in said processing unit with said at least two processors other than the one processor in which the fault has been detected despite a fault in the one processor.

42. A method of performing fault tolerant operations in a processing unit formed as a single unit replaceable as a module for a computer, said processing unit having at least three processors being arranged to execute the same operation when operating without a fault, said method comprising the steps of:

detecting a fault in any one of said at least three processors by comparing operations of each of said at least three processors with each of the others of said at least three processors; and altering, in response to detection of a fault by said detecting step in one of said at least three processors, an information path on a plurality of busses interconnecting said at least three processors to connect said information path to at least two processors of said at least three processors other than the one processor in which the fault has been detected.

43. A method of performing fault tolerant operations in a computer having a plurality of processing units, each processing unit being formed as a single unit which is replaceable as a module and includes at least three processors being arranged to execute the same operation, said method comprising the steps of:

detecting a fault in any one of said at least three processors of each processing unit by comparing operations of each of said at least three processors with each of the others of said at least three processors;

altering, in response to detection of a fault by said detecting step in one of said at least three processors, an information path on a plurality of busses interconnecting said at least three processors to connect said information path to at least two processors of said at least three processors other than the one processor in which the fault has been detected;

continuing operation of said processing unit using said at least two processors of said processing unit despite the fault detected in one of said at least three processors;

causing execution of operations being performed by said at least two processors of said processing unit to be transferred to another processing unit for execution in each of said at least three processors thereof, when replacement of said processing unit is to be conducted; and ceasing execution of operations in each of said at least two processors of said processing unit after execution of said operations has begun in each of said at least three processors of said another processing unit.

44. A computer system according to claim 33, wherein each processing unit further comprises:

a plurality of clocks for generating clock pulses for controlling said at least three processors, wherein said plurality of clocks being arranged to operate with redundancy therebetween, and wherein said processing unit remains operable despite a fault in any one of said clocks.

* * * * *